(12) United States Patent
Wang et al.

(10) Patent No.: US 11,996,293 B2
(45) Date of Patent: May 28, 2024

(54) METHOD FOR METAL GATE CUT AND STRUCTURE THEREOF

(71) Applicant: Taiwan Semiconductor Manufacturing Co., Ltd., Hsin-Chu (TW)

(72) Inventors: Pei-Yu Wang, Hsinchu (TW); Zhi-Chang Lin, Hsinchu County (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 207 days.

(21) Appl. No.: 17/391,834

(22) Filed: Aug. 2, 2021

(65) Prior Publication Data

US 2021/0366716 A1 Nov. 25, 2021

Related U.S. Application Data

(62) Division of application No. 16/366,511, filed on Mar. 27, 2019, now Pat. No. 11,081,356.

(60) Provisional application No. 62/691,740, filed on Jun. 29, 2018.

(51) Int. Cl.
| | |
|---|---|
| *H01L 29/66* | (2006.01) |
| *H01L 21/28* | (2006.01) |
| *H01L 21/3105* | (2006.01) |
| *H01L 21/3213* | (2006.01) |
| *H01L 21/8234* | (2006.01) |
| *H01L 27/088* | (2006.01) |
| *H01L 29/06* | (2006.01) |

(Continued)

(52) U.S. Cl.
CPC .. *H01L 21/28123* (2013.01); *H01L 21/31055* (2013.01); *H01L 21/32136* (2013.01); *H01L 21/823431* (2013.01); *H01L 21/823437* (2013.01); *H01L 21/823468* (2013.01); *H01L 21/823481* (2013.01); *H01L 27/0886* (2013.01); *H01L 29/0649* (2013.01); *H01L 29/66545* (2013.01)

(58) Field of Classification Search
CPC ........... H01L 29/0649; H01L 29/66545; H01L 29/401; H01L 29/1033; H01L 29/66795; H01L 27/0886

See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Omar F Mojaddedi
(74) *Attorney, Agent, or Firm* — Haynes and Boone, LLP

(57) ABSTRACT

A semiconductor device includes a substrate, a first semiconductor fin and a second semiconductor fin protruding from the substrate, an isolation feature disposed on the substrate and on sidewalls of the first and second semiconductor fins, a gate structure disposed on the isolation feature. The semiconductor device also includes a dielectric fin disposed on the isolation feature and sandwiched between the first and second semiconductor fins. A middle portion of the dielectric fin separates the gate structure into a first gate structure segment engaging the first semiconductor fin and a second gate structure segment engaging the second semiconductor fin.

20 Claims, 42 Drawing Sheets

(51) Int. Cl.
*H01L 29/10* (2006.01)
*H01L 29/40* (2006.01)

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,773,708 B1* | 9/2017 | Zhang ............... H01L 29/66666 |
| 2012/0064686 A1* | 3/2012 | Farber ............... H01L 29/66636 |
| | | 438/711 |
| 2014/0151761 A1* | 6/2014 | Hsieh .................. H01L 29/7853 |
| | | 257/288 |
| 2019/0051733 A1* | 2/2019 | Zang ................. H01L 29/66545 |
| 2019/0172830 A1* | 6/2019 | Ok ....................... H01L 27/0924 |

\* cited by examiner

METHOD FOR METAL GATE CUT AND STRUCTURE THEREOF

PRIORITY DATA

This is a divisional application of U.S. patent application Ser. No. 16/366,511, filed on Mar. 27, 2019, which claims priority to U.S. Provisional Patent Application Ser. No. 62/691,740 filed on Jun. 29, 2018, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of a polysilicon gate with a metal gate to improve device performance with the decreased feature sizes. One process of forming a metal gate is termed a replacement gate or "gate-last" process in which the metal gate is fabricated "last" which allows for reduced number of subsequent processes. However, there are challenges to implementing such IC fabrication processes, especially with scaled down IC features in advanced process nodes. One challenge is how to effectively isolate the metal gates (i.e., a cut metal gate process) after the replacement. For example, misalignment and overlay problems during a cut metal gate process may degrade integrated chip performance. Thus the existing techniques have not proved entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
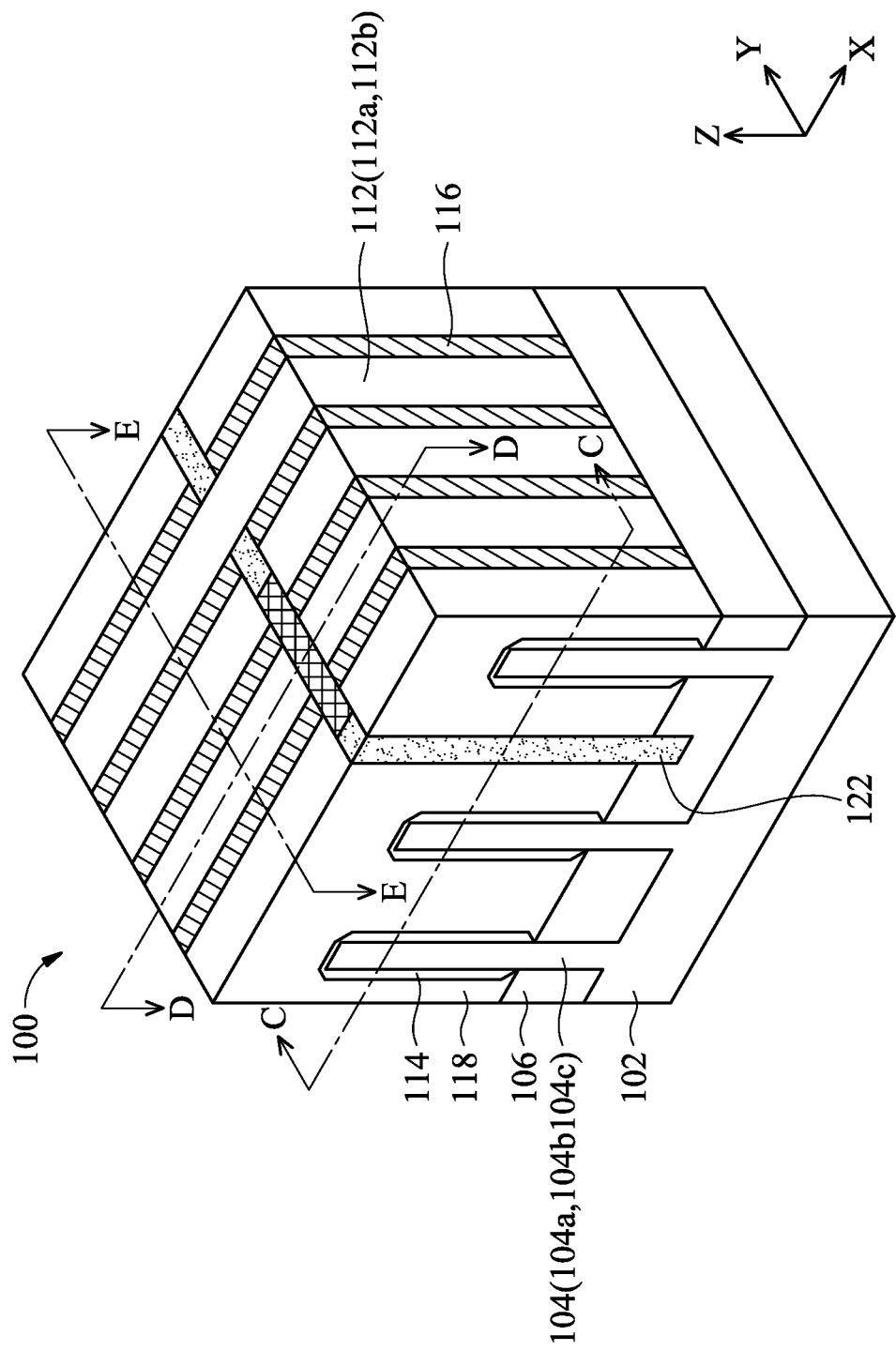
FIGS. 1A and 2A are perspective views of semiconductor structures implemented with a cut metal gate process, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating semiconductor devices using a cut metal gate process. A cut metal gate process refers to a fabrication process where after a metal gate (e.g., a high-k metal gate or HK MG) replaces a dummy gate structure (e.g., a polysilicon gate), the metal gate is cut (e.g., by an etching process) to separate the metal gate into two or more portions. Each portion functions as a metal gate for an individual transistor. An isolation material is subsequently filled into trenches between adjacent portions of the metal gate. These trenches are referred to as cut metal gate trenches, or CMG trenches, in the present disclosure. As the device scaling down continues, it becomes more difficult to precisely control positions of CMG trenches. For example, lithography and etching steps may introduce misalignment and overlay problems to a cut metal gate process. If a CMG trench's location shifts, it might cause circuit defects, such as short circuits and/or defective transistors. An object of the present disclosure is to devise a self-aligned cut metal gate method so as to accurately control positions of both CMG trenches and the isolation material filled into thereafter.

Figure 1B:
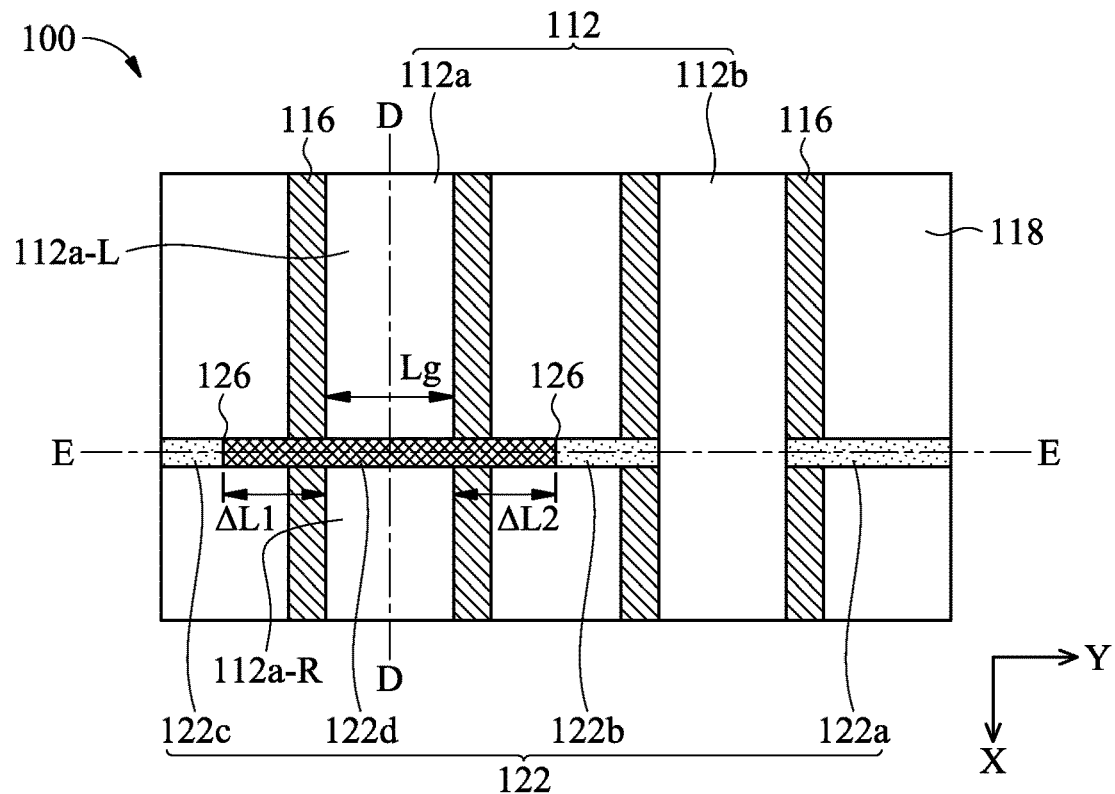
FIGS. 1B and 2B are top views of the respective semiconductor structures in FIGS. 1A and 2A, according to various aspects of the present disclosure.
Figure 1C:
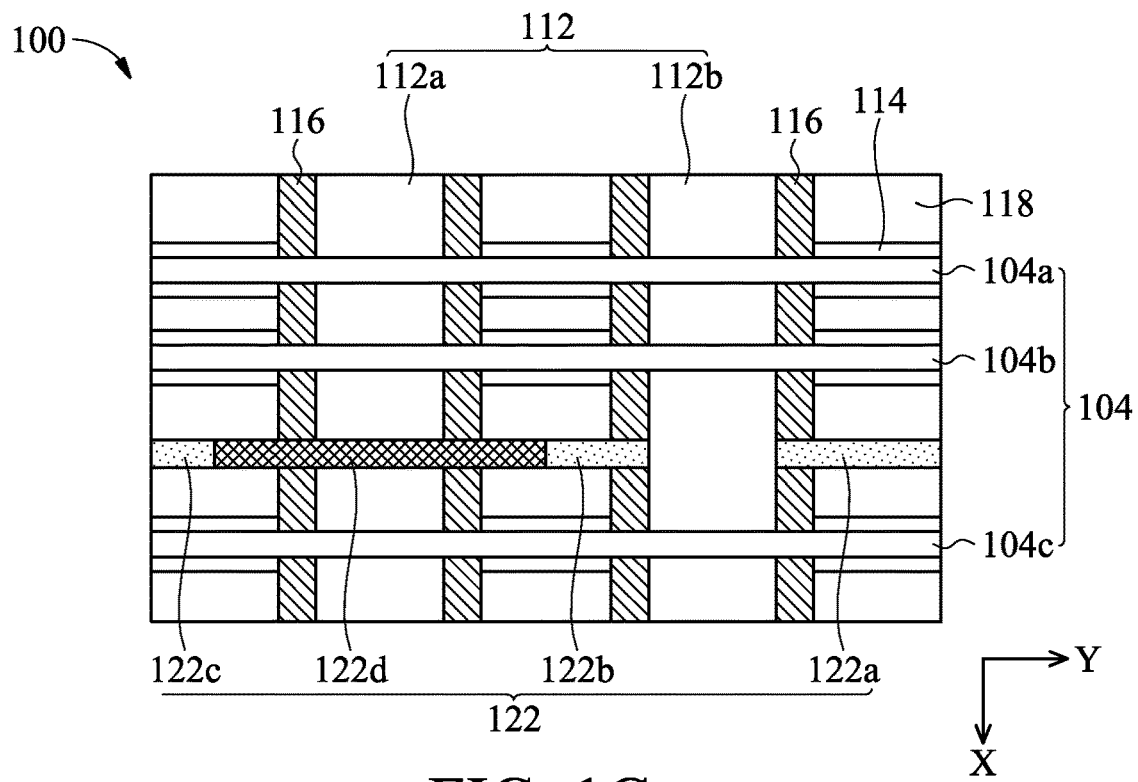
FIGS. 1C, 1D, 1E, 2C, 2D, 2E are cross-sectional views of the respective semiconductor structures in FIGS. 1A and 2A, according to various aspects of the present disclosure.
Figure 1D:
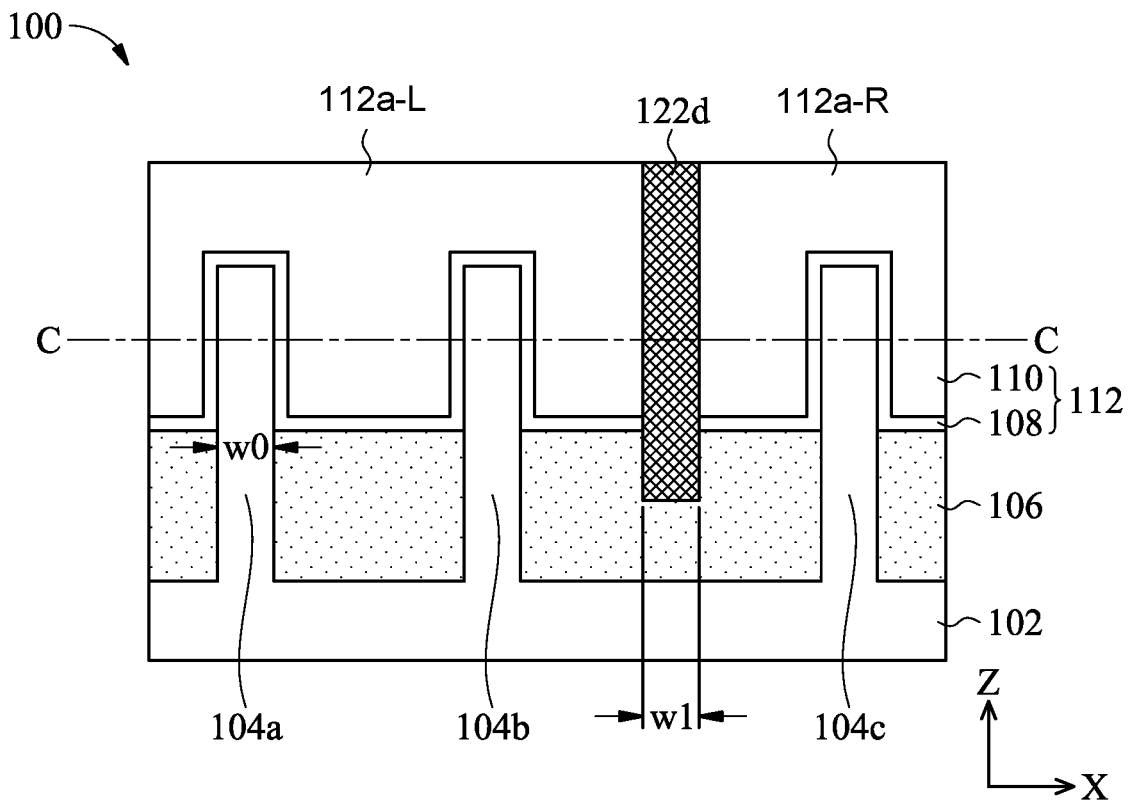
Figure 1E:
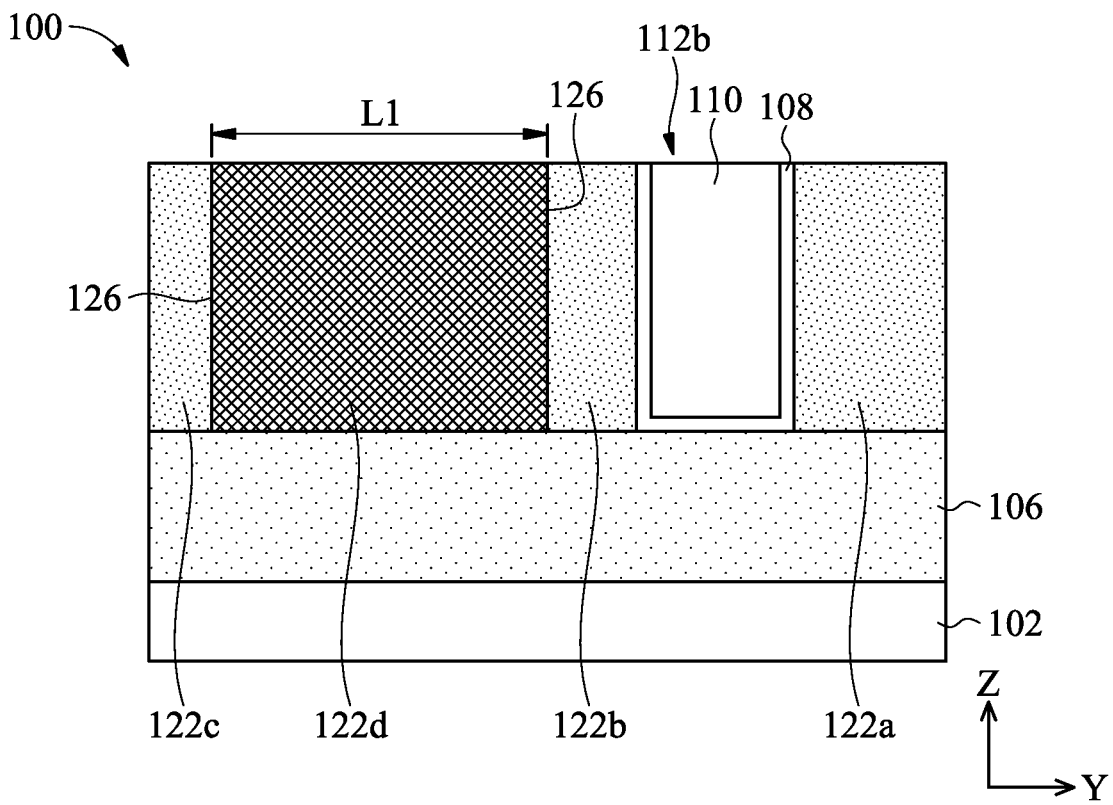

FIG. 1A shows a perspective view of a semiconductor device 100 in an embodiment, according to aspects of the present disclosure. FIG. 1B shows a top view of the device (or structure) 100. FIG. 1C illustrates a cross-sectional view of the device 100 along the C-C line of FIG. 1A. FIG. 1D illustrates a cross-sectional view of the device 100 along the D-D line of FIG. 1A. FIG. 1E illustrates a cross-sectional view of the device 100 along the E-E line of FIG. 1A. The device 100 is provided for illustration purposes and does not necessarily limit the embodiments of the present disclosure to any number of transistors, any number of regions, or any configuration of structures or regions. Furthermore, the device 100 may be an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FINFETs and gate all-around (GAA) FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Referring to FIGS. 1A-1E collectively, the device 100 includes a substrate 102 and various structures (or features) built therein or thereon. Particularly, the device 100 includes a plurality of semiconductor fins 104 (e.g., fins 104a, 104b, and 104c) protruding out of the substrate 102, an isolation structure 106 over the substrate 102 and between the semiconductor fins 104, a dielectric fin 108 partially embedded in the isolation structure 106 and projecting upwardly above the isolation structure 106, and a plurality of gate stacks 112 (e.g., gate stacks 112a and 112b) disposed over the semiconductor fins 104 and the isolation structure 106. Each gate stack 112 includes a high-k dielectric layer 108 and a conductive layer 110 over the high-k dielectric layer 108. The conductive layer 110 includes one or more layers of metallic materials. Therefore, each gate stack 112 is also referred to as a high-k metal gate (or HK MG) 112. The gate stacks 112 may further include an interfacial layer (not shown) under the high-k dielectric layer 108. One of the gate stacks 112 is divided by the dielectric fin 108 into two separated portions. The device 100 further includes epitaxial source/drain (S/D) features 114 over the semiconductor fins 104, interlayer dielectric (ILD) layer 118 covering the epitaxial S/D features 114 and over the isolation structure 106, and gate spacers 116 covering sidewalls of the gate stacks 112.

The substrate 102 is a silicon substrate in the illustrated embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include semiconductor-on-insulator (SOI) substrates 102 having a buried dielectric layer. In some such examples, a layer of the substrate 102 may include an insulator such as a silicon oxide, a silicon nitride, a silicon oxynitride, a silicon carbide, and/or other suitable insulator materials.

In the illustrated embodiment, the device 100 includes three semiconductor fins 104, namely 104a, 104b, and 104c, spaced from each other along the x direction. Each of the semiconductor fins 104 is arranged lengthwise along the y direction. The spacing between the fins 104a and 104b is smaller than that between the fins 104b and 104c. The semiconductor fins 104 may include one or more semiconductor materials such as silicon, germanium, or silicon germanium. In an embodiment, each of the semiconductor fins 104 may include multiple different semiconductor layers stacked one over the other. The semiconductor fins 104 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 104 by etching initial epitaxial semiconductor layers of the substrate 102. The etching process can include dry etching, wet etching, reactive ion etching (RIE), and/or other suitable processes. In some embodiments, the semiconductor fins 104 have a width $W_0$ (measured along the x direction) that ranges from about 9 nanometers (nm) to about 14 nm.

The isolation structure 106 may include silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the semiconductor fins 104 formation process. The trenches may then be filled with isolating material, followed by a chemical mechanical planarization (CMP) process and/or an etch-back process. Other isolation structure such as field oxide, LOCal Oxidation of Silicon (LOCOS), and/or other suitable structures are possible. The isolation structure 106 may include a multi-layer structure, for example, having one or more thermal oxide liner layers adjacent to the semiconductor fins 104.

In the present embodiment, the device 100 includes two gate stacks 112, namely 112a and 112b, spaced from each other along the y direction. Each of the gate stacks 112 is arranged lengthwise along the x direction. Each gate stack 112 includes a high-k dielectric layer 108 and a conductive layer 110. The high-k dielectric layer 108 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The conductive layer 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials.

Gate spacers 116 cover sidewalls of each gate stack 112. The gate spacers 116 may be used to offset the subsequently formed epitaxial S/D features 114 and may be used for designing or modifying the S/D feature (junction) profile. The gate spacers 116 may comprise a dielectric material, such as silicon oxide, silicon nitride, silicon oxynitride, silicon carbide, other dielectric material, or combinations thereof, and may comprise one or multiple layers of material. The gate spacers 116 may be formed by one or more methods including chemical oxidation, thermal oxidation, atomic layer deposition (ALD), chemical vapor deposition (CVD), and/or other suitable methods.

Each of the epitaxial S/D features 114 is confined between and in physical contact with adjacent gate spacers 116, atop one of the semiconductor fins 104a-c. The epitaxial S/D features 114 may include epitaxially grown semiconductor material(s) such as epitaxially grown silicon for NFETs or epitaxially grown silicon germanium for PFETs, and may additionally include one or more p-type dopants, such as boron or indium, or one or more n-type dopants, such as phosphorus or arsenic. The epitaxial S/D features 114 may be formed by a low-pressure CVD (LPCVD) process with a silicon-based precursor, a selective epitaxial growth (SEG) process, a cyclic deposition and etching (CDE) process, or other epitaxial growth processes. In an embodiment, the device 100 may further include a silicide feature (not shown) atop the epitaxial S/D features 114.

The ILD layer 118 covers the isolation structure 106 and fills the space between adjacent epitaxial S/D features 114, as well as the space between adjacent gate spacers 116. The ILD layer 118 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 118 may be formed by plasma enhanced CVD (PECVD), flowable CVD (FCVD), or other suitable methods.

The device 100 includes a dielectric fin 122, which is arranged lengthwise along the y direction. The dielectric fin 122 locates between the semiconductor fins 104b and 104c. In the illustrated embodiment, the dielectric fin 122 is partially embedded in the isolation structure 106 and projecting upwardly above the isolation structure 106. In various embodiments, top surfaces of the dielectric fin 122, the gate stacks 112, and the gate spacers 116 are substantially coplanar. Therefore, the top surface of the dielectric fin 122 is above those of the semiconductor fins 104a-c. The dielectric fin 122 has a width $W_1$ (measured along the x direction) that may be smaller than, equal to, or greater than the width $W_0$ of the semiconductor fins 104 in various embodiments. In one example, the dielectric fin 122 has the width $W_1$ ranging from about 3 nm to about 5 nm, such as about 4 nm. In another example, the width $W_1$ is smaller than the width $W_0$ with a ratio between $W_0$ and $W_1$ ranging from about 1.5 to about 3.

In the illustrated embodiment, the dielectric fin 122 is regarded as comprising four segments, namely 122a, 122b, 122c, and 122d. The segments 122a and 122b are in physical contact with the gate stack 112b. The segment 122d is in physical contact with the gate stack 112a. Particularly, the gate stack 112b extends continuously from the semiconductor fin 104a to the semiconductor fin 104c and divides the dielectric fin 122 into two portions, where one portion is the segment 122a on one side of the gate stack 112b and the other portion comprises the segments 122b, 122c, 122d on the other side of the gate stack 112b. The gate stack 112b engages all three semiconductor fins 104a-c to form a transistor. As a comparison, the segment 122d divides the gate stack 112a into two separated segments (or parts), 112a-L and 112a-R. The gate stack segments 112a-L and 112a-R are electrically isolated. As the dielectric material of the segment 122d of the dielectric fin 122 provides electrical isolation between gate stack segments, the dielectric fin 122 can also be referred to as an isolation fin. The first gate stack segment 112a-L engages two semiconductor fins 104a and 104b to form a transistor, and the second segment 112a-R engages one semiconductor fin 104c to form a transistor. In various embodiments either of the gate stack segments 112a-L and 112a-R may engage any number of the semiconductor fins 104 to form a transistor.

The dielectric fin 122 may include uniform dielectric materials extending throughout segments 122a-122d, such as silicon nitride, silicon oxide, silicon oxynitride, fluoride-doped silicate glass (FSG), a low-k dielectric material, and/or other suitable insulating material. Alternatively or additionally, the dielectric fin 122 may include a metal oxide such as aluminum oxide ($Al_2O_3$), hafnium oxide ($HfO_2$) or zirconium oxide ($ZrO_2$). Particularly, since the dielectric fin 122 is in physical contact with the gate stacks 112, the dielectric materials do not react with the metal materials of the gate stacks 112. For example, the dielectric fin 122 includes silicon nitride in an embodiment.

Furthermore, in the illustrated embodiment, the segments 122a-122c comprise the same dielectric materials, but the segment 122d comprises different dielectric materials. In one example, the segments 122a-122c comprise aluminum oxide ($Al_2O_3$) and the segment 122d comprise silicon nitride. In some embodiments, the segment 122d and the isolation structure 106 may have the same material compositions. In some embodiments, the segment 122d and the gate spacers 116 may have the same material compositions. The segment 122d is in physical contact with both gate stack segments 112a-L/112a-R and also with respective gate spacers 116 on sidewalls thereof. The segment 122d interfaces with other segments 122b and 122d on two side edges 126. As illustrated in FIG. 1B, the segment 122d extends lengthwise along the y direction in distances $\Delta L_1$ and $\Delta L_2$ away from two sidewalls of the gate stack 112a, respectively. Distances $\Delta L_1$ and $\Delta L_2$ may be equal or different from each other. Each of the distances $\Delta L_1$ and $\Delta L_2$ may individually range from about 1 nm to about 8 nm. In some embodiments, the side edges 126 may align with the outer sidewall of gate spacers 116 ($\Delta L_1$ and $\Delta L_2$ equal to the thickness of the gate spacers 116). In some embodiments, the side edges 126 are not extruded out of sidewalls of the gate spacers 116 ($\Delta L_1$ and $\Delta L_2$ less than the thickness of the gate spacers 116). In some embodiment, each of the two side edges 126 may be spaced away from gate spacers 116 ($\Delta L_1$ and $\Delta L_2$ larger than the thickness of the gate spacers 116). In yet another embodiment, one side edge 126 may extrude into the ILD layer 118, while another side edge 126 may be sandwiched by the gate spacers 116. The length of the segment 122d (measured along the y direction) is calculated as $L_1 = \Delta L_1 + \Delta L_2 + Lg$, where Lg is the metal gate length. In some embodiments, the width of the gate stack 112a is less than about 10 nm, and the length $L_1$ is from about 10 nm to about 15 nm.

Figure 2A:
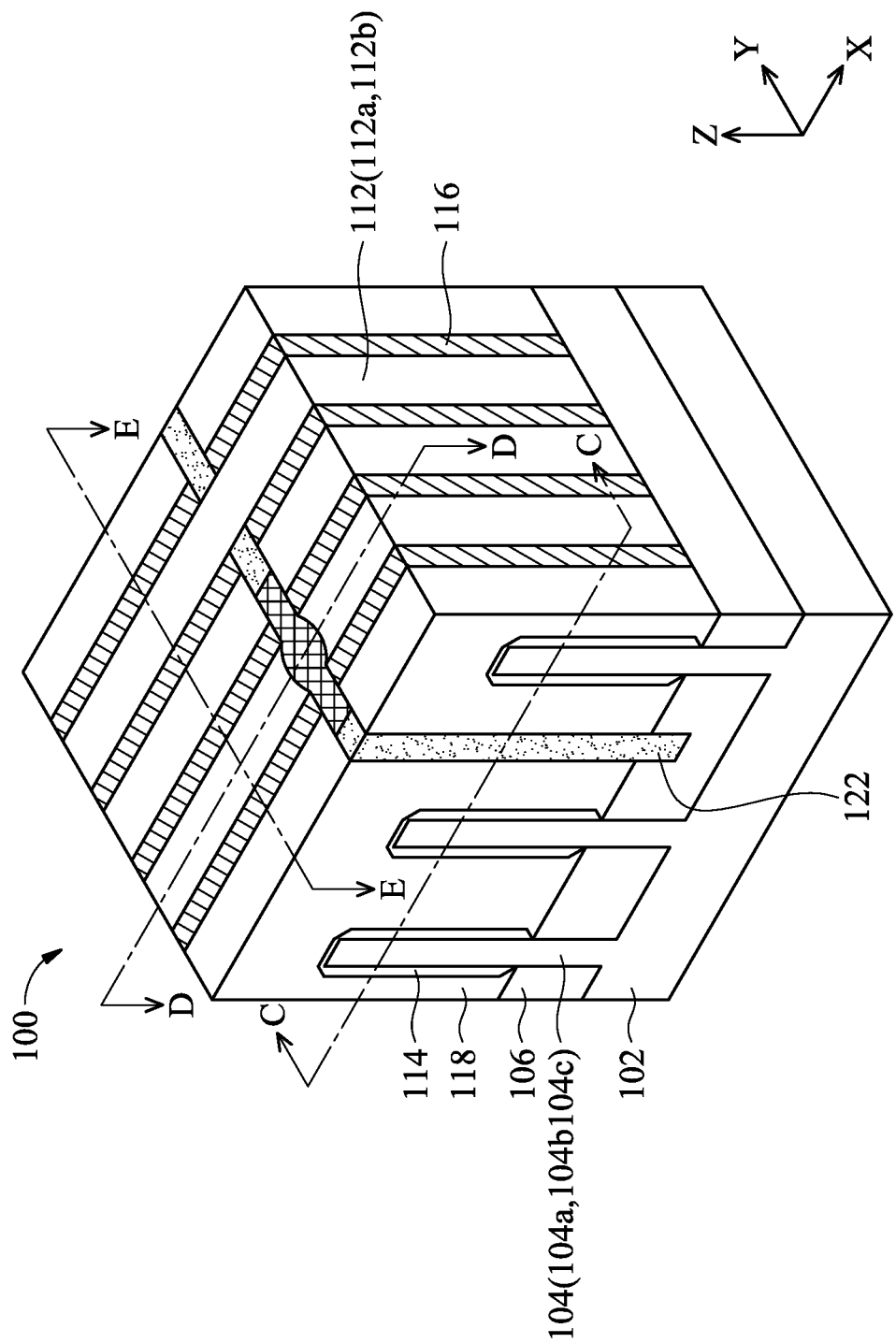
Figure 2B:
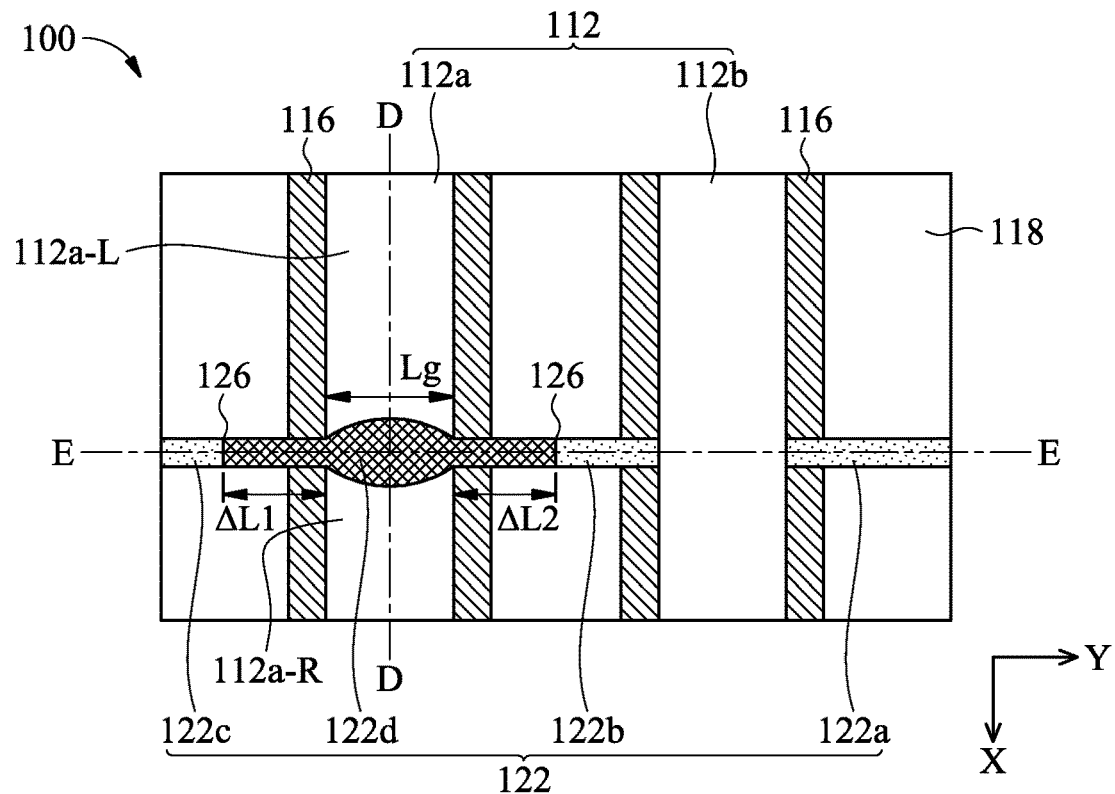
Figure 2C:
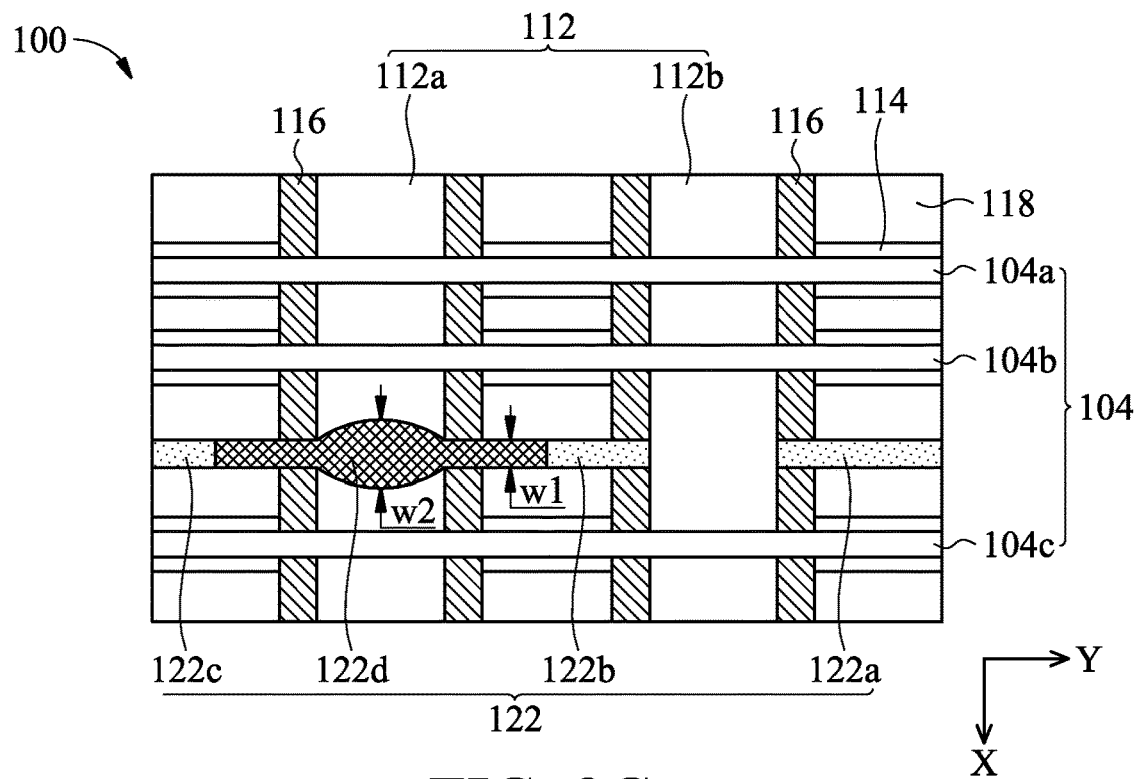
Figure 2D:
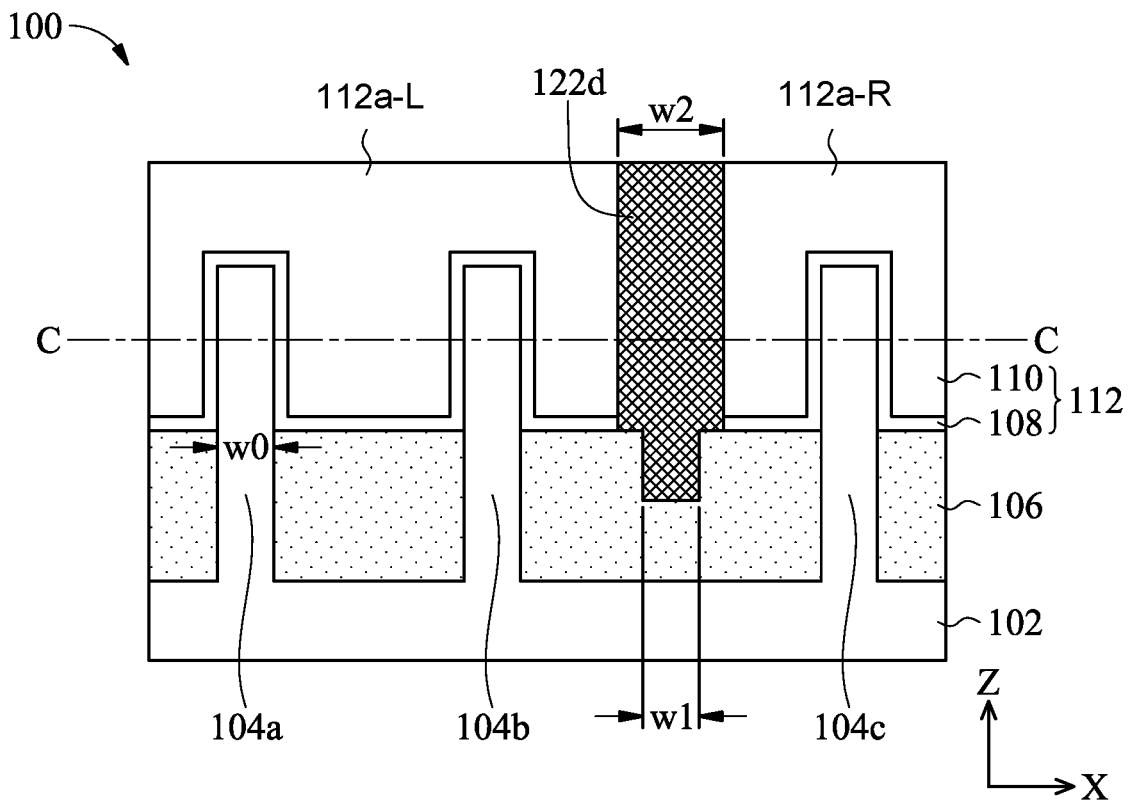
Figure 2E:
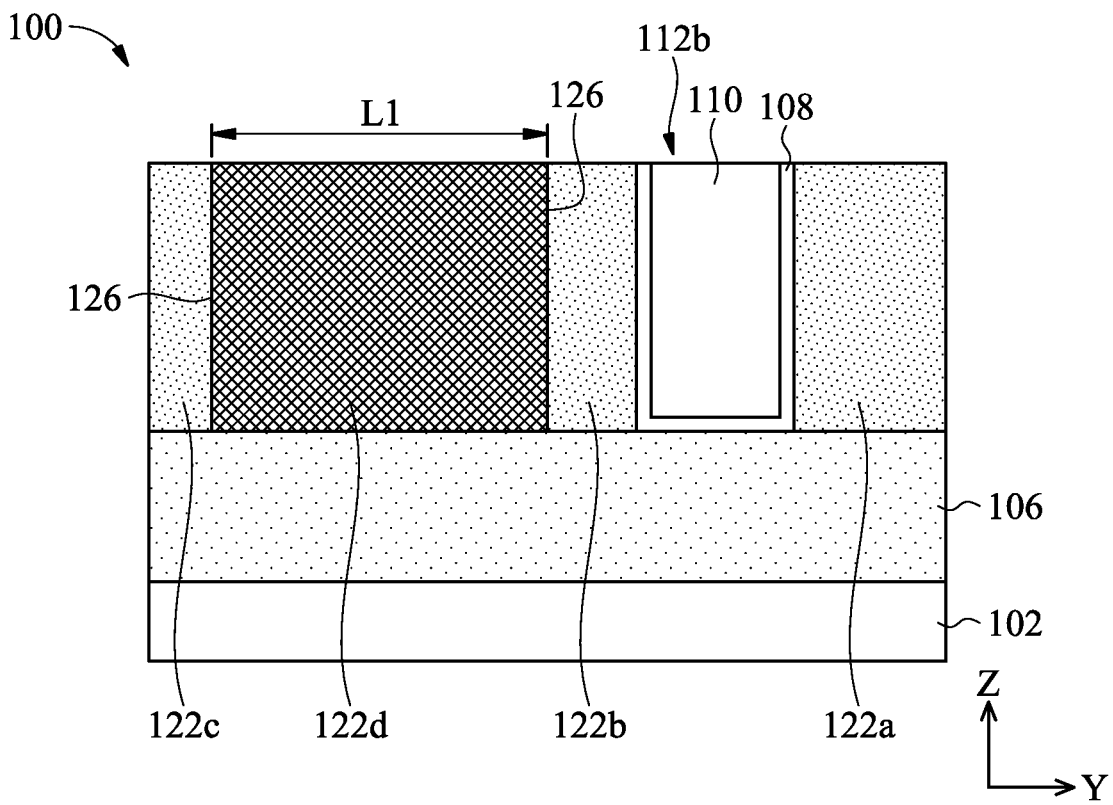

Referring to FIG. 2A, shown therein is a perspective view of the device 100, in accordance with another embodiment. FIG. 2B shows a top view of the device 100. FIG. 2C illustrates a cross-sectional view of the device 100 along the C-C line of FIG. 2A. FIG. 2D illustrates a cross-sectional view of the device 100 along the D-D line of FIG. 2A. FIG. 2E illustrates a cross-sectional view of the device 100 along the E-E line of FIG. 2A. Except where noted, the elements of FIGS. 2A-2E are substantially similar to those of FIGS. 1A-1E. Reference numerals are repeated for ease of understanding. In this embodiment, the segment 122d has a curvature middle portion that directly interfaces with the separated gate stack segments 112a-L and 112a-R. The curvature middle portion has a larger width (denoted as $W_2$) than other portions of the segment 122d ($W_2 > W_1$). In some embodiments, the width $W_2$ is about 2 nm to about 6 nm larger than the width $W_1$ (e.g., about 1 nm to about 3 nm wider on each side of the segment 122d along x direction). To be noticed, a bottom portion of the dielectric fin 122 embedded in the isolation structure 106 substantially remains the same width $W_1$ at different locations along the y direction, even at locations directly under the curvature middle portion (FIG. 2D).

Figure 3A:
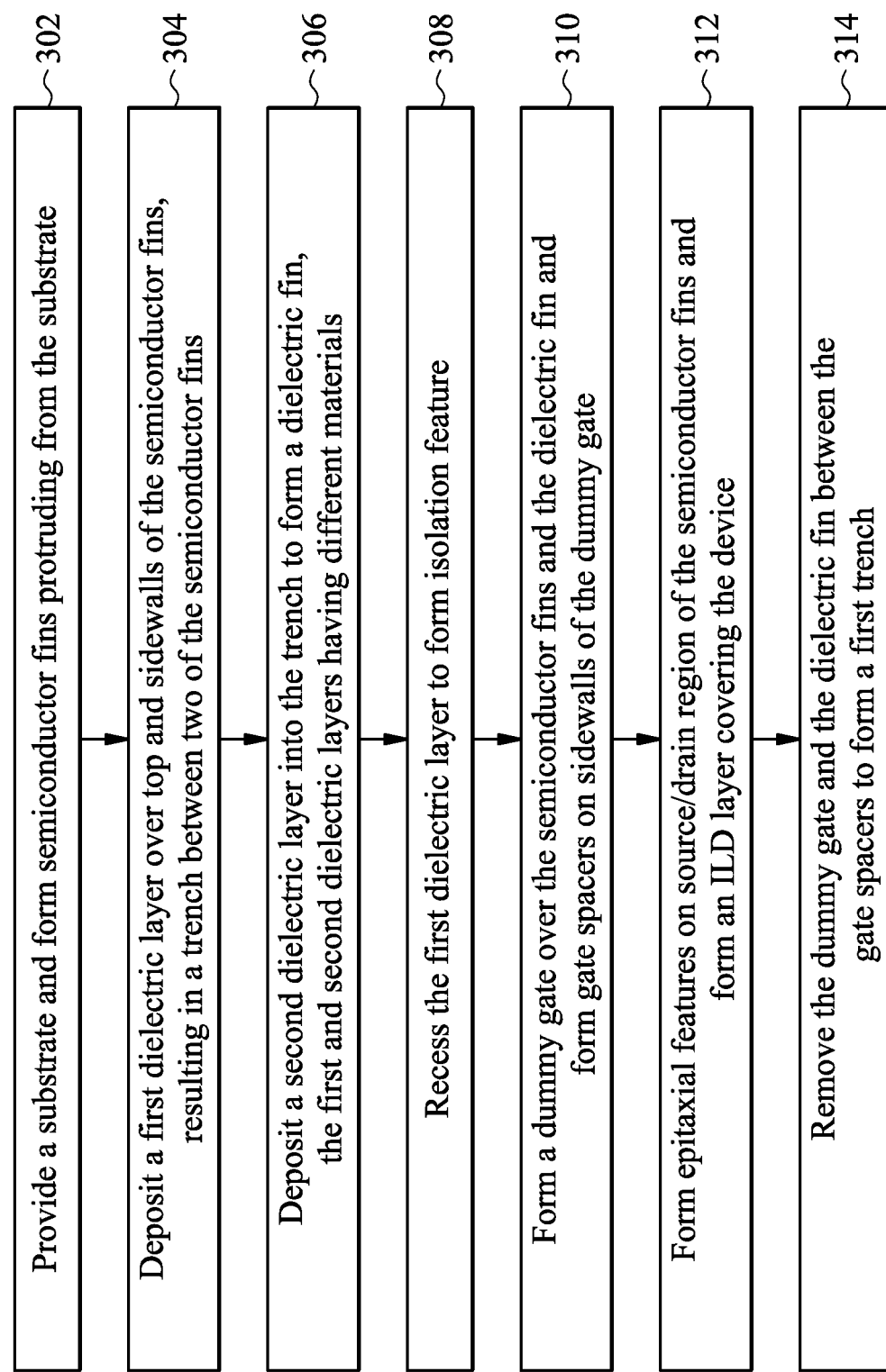
FIGS. 3A and 3B show a flow chart of a method for forming the semiconductor structures shown in FIGS. 1A and 2A, according to aspects of the present disclosure.
Figure 3B:
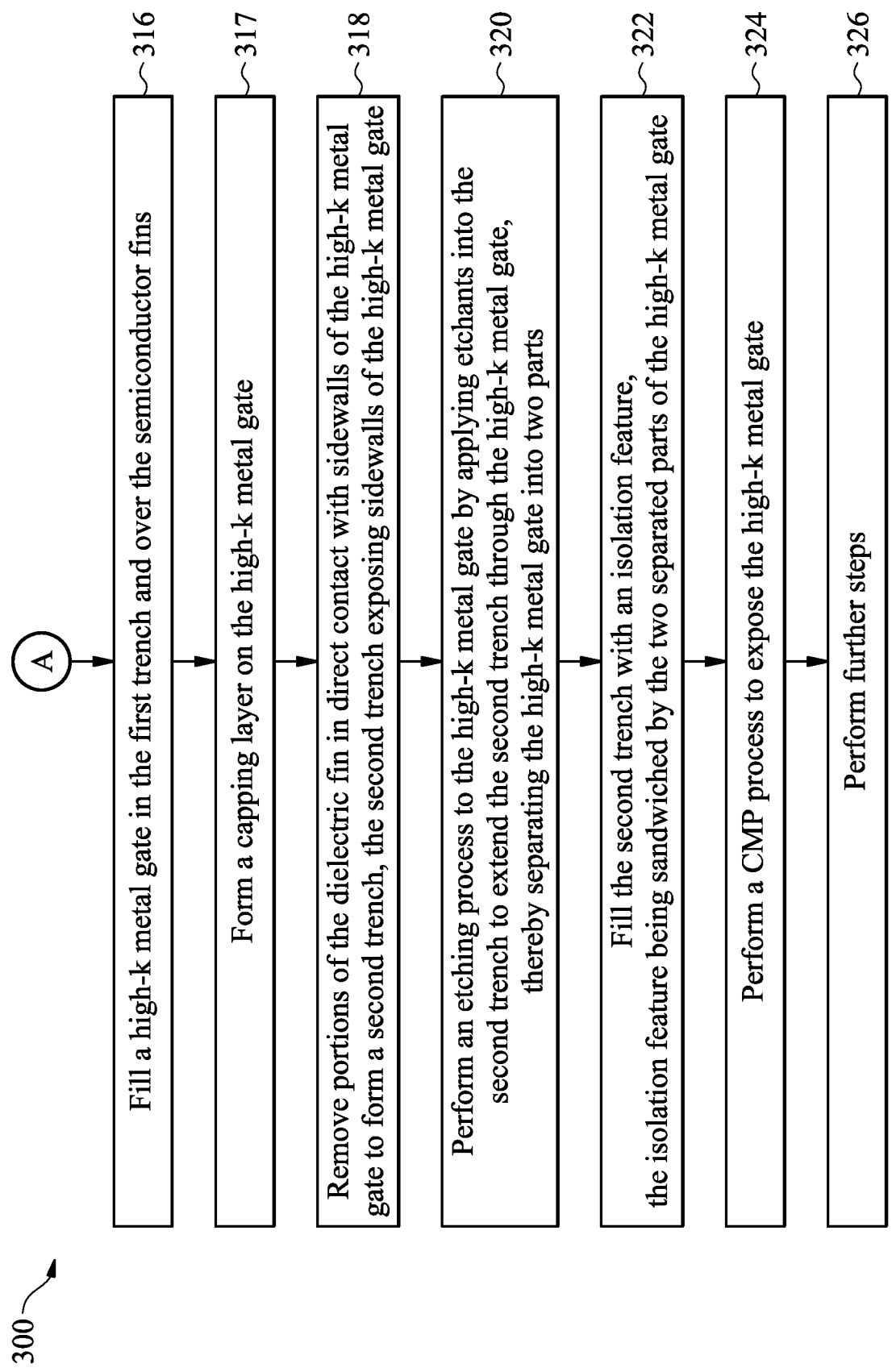

FIGS. 3A and 3B show a flow chart of a method 300 for forming the semiconductor device 100 in one or more embodiments, according to various aspects of the present disclosure. The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 4A-18E. FIGS. 4A, 8A, 9A, 10A, 11A, 12A, 13A, 14A, 16A, 17A, and 18A are perspective views; FIGS. 10B, 11B, 12B, 13B, 14B, 16B, 17B, and 18B are top views; and FIGS. 4B, 5, 6, 7, 8B, 9B, 10C, 10D, 10E, 11C, 11D, 11E, 12C, 12D, 12E, 13C, 13D, 13E, 14C, 14D, 14E, 15A, 15B, 16C, 16D, 16E, 17C, 17D, 17E, 18C, 18D, 18E are cross-sectional views of the semiconductor device 100 in intermediate stages of fabrication.

Figure 4A:
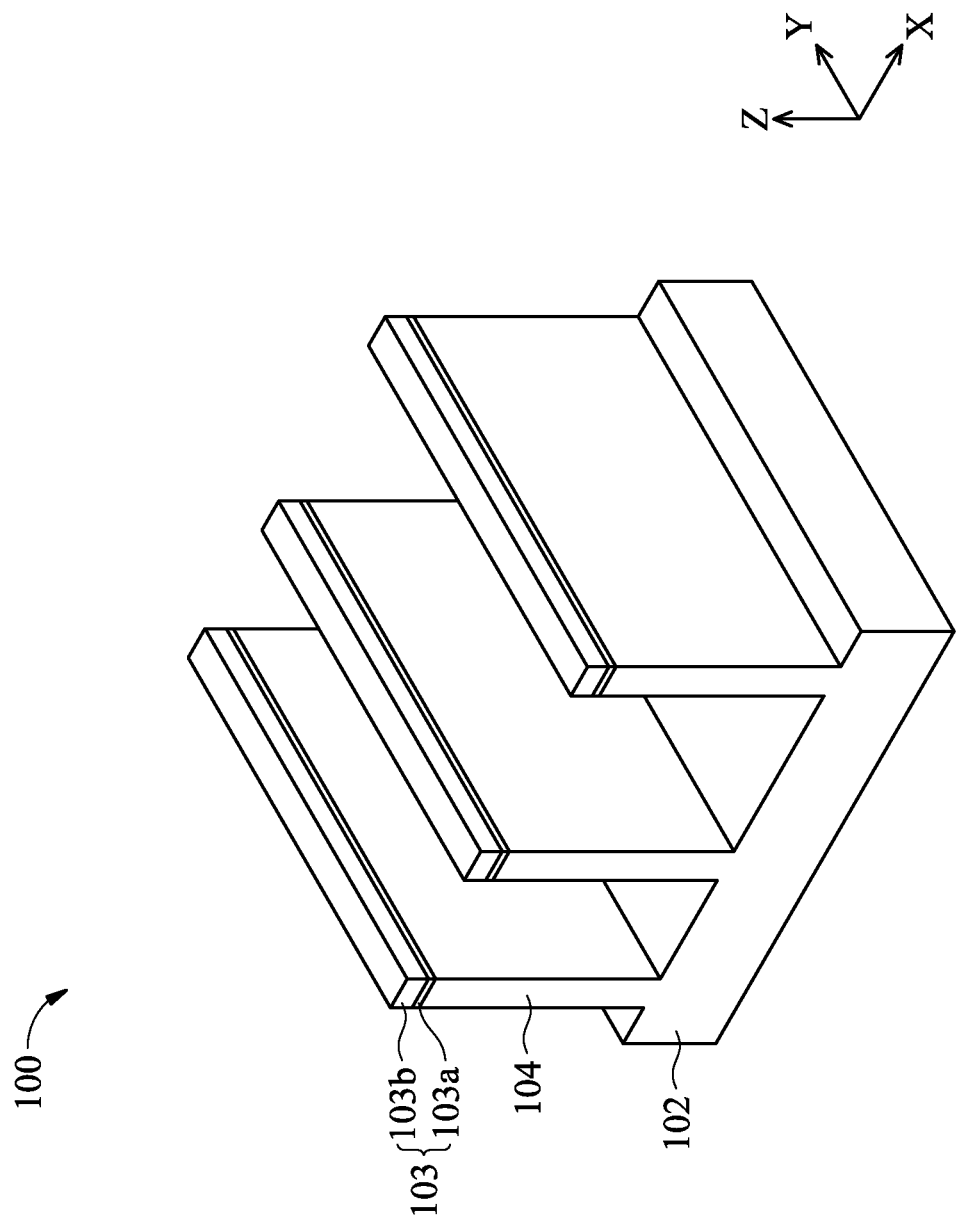
FIGS. 4A, 8A, 9A, 10A, 11A, 12A, 13A, 14A, 16A, 17A, and 18A illustrate perspective views of a semiconductor structure during a fabrication process according to the method of FIGS. 3A and 3B, in accordance with some embodiments.
Figure 4B:
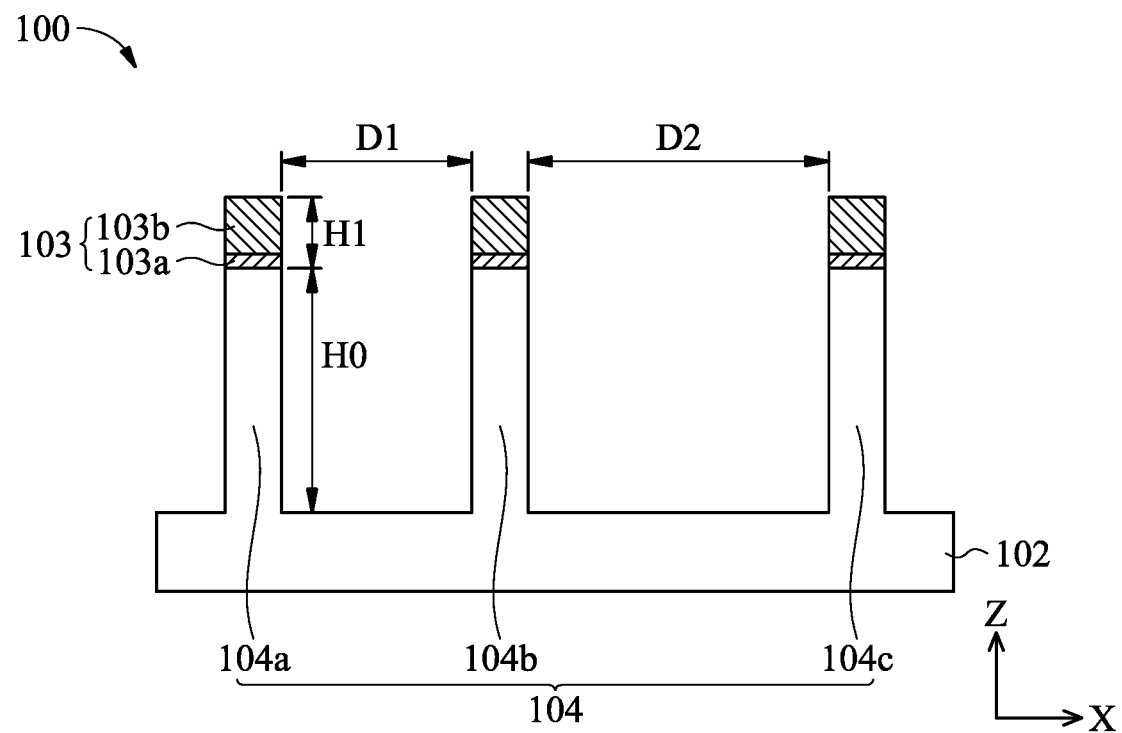
FIGS. 4B, 5, 6, 7, 8B, 9B, 10C, 10D, 10E, 11C, 11D, 11E, 12C, 12D, 12E, 13C, 13D, 13E, 14C, 14D, 14E, 15A, 15B, 16C, 16D, 16E, 17C, 17D, 17E, 18C, 18D, 18E illustrate cross-sectional views of a semiconductor structure during a fabrication process according to the method of FIGS. 3A and 3B, in accordance with some embodiments.

Referring to FIG. 3A, at operation 302, the method 300 provides (or is provided with) a structure (or device) 100 as shown in FIGS. 4A and 4B. The structure 100 includes the substrate 102 and semiconductor fins 104 extending from the substrate 102. The semiconductor fins 104 are arranged lengthwise along the y direction and may be spaced evenly or unevenly along the fin width direction (the x direction). FIGS. 4A and 4B also illustrate a hard mask 103 that is used to pattern the semiconductor fins 104.

In an embodiment, operation 302 may epitaxially grow semiconductor materials over the entire surface of the substrate 102, and then etch the semiconductor materials using the hard mask 103 as an etch mask to produce the semiconductor fins 104. The hard mask 103 may include any suitable dielectric material such as silicon nitride. The hard mask 103 may further include multiple layers, such as a bi-layer stack, which includes a lower layer 103a and an upper layer 103b. Suitable materials for these layers may be selected, in part, based on etchant selectivity. In an embodiment, the lower layer 103a is a pad oxide layer and the upper layer 103b is an overlying pad nitride layer. The pad oxide layer may be a thin film comprising silicon oxide formed, for example, using a thermal oxidation process. The pad oxide layer 103a may act as an adhesion layer between the substrate 102 and the pad nitride layer 103b and may act as an etch stop layer for etching the pad nitride layer 103b. In an embodiment, the pad nitride layer 103b is formed of silicon nitride, for example, using low-pressure chemical vapor deposition (LPCVD) or plasma enhanced chemical vapor deposition (PECVD). In some embodiments, the hard mask 103 has a height $H_1$ that ranges from about 5 nanometers (nm) to about 60 nm, such as about 22 nm. As will be shown in further detail below, the height $H_1$ defines a height difference between the semiconductor fins 104 and the dielectric fin 122 to form therebetween.

The hard mask 103 may be patterned using suitable processes including double-patterning processes, multi-patterning processes, photolithography, self-aligned processes, and mandrel-spacer processes. The hard mask 103 is subsequently used to pattern exposed portions of the substrate 102, thereby forming semiconductor fins 104 as illustrated in FIGS. 4A and 4B. As will be explained in further detail below, the space between adjacent semiconductor fins 104 will be subsequently filled with a dielectric material, forming isolation structures such as shallow trench isolation (STI) features.

The semiconductor fins 104 are arranged lengthwise along the y direction and may be spaced evenly or unevenly along the fin width direction (the x direction). In the illustrated embodiment, the device 100 includes three semiconductor fins 104, namely 104a, 104b, and 104c from left to right along the x direction. While FIGS. 4A and 4B illustrate three semiconductor fins, the device 100 may include any number of semiconductor fins. In some embodiments, each of the semiconductor fins 104a, 104b, and 104c has a fin height $H_0$. The fin height $H_0$ is measured from a top surface of a semiconductor fin to a top surface of the substrate. In an embodiment, the fin height $H_0$ ranges from about 50 nm to about 200 nm, such as about 100 nm. In some embodiments, each of the semiconductor fins 104a, 104b, and 104c has a width $W_0$. In an embodiment, the width $W_0$ ranges from about 5 nm to about 15 nm, such as about 12 nm. The semiconductor fins 104a, 104b, and 104c may have fin widths substantially the same or different from each other.

Each of semiconductor fins 104 has two sidewalls. For adjacent semiconductor fins, sidewalls of the adjacent semiconductor fins are facing each other. The exemplary semiconductor fins 104a and 104b are separated from each other by a spacing $D_1$. The exemplary semiconductor fins 104b and 104c are separated from each other by a spacing $D_2$. In an embodiment, each of the spacing $D_1$ and $D_2$ is between about 10 nm and about 80 nm. In some examples, the spacing between the semiconductor fins 104b and 104c is larger than that between the semiconductor fins 104a and 104b (e.g., by more than about 20%). In yet another embodiment, the spacing between the semiconductor fins 104b and 104c is equal to or larger than twice of that between the fins 104a and 104b (i.e., $D_2 \geq 2D_1$).

Figure 5:
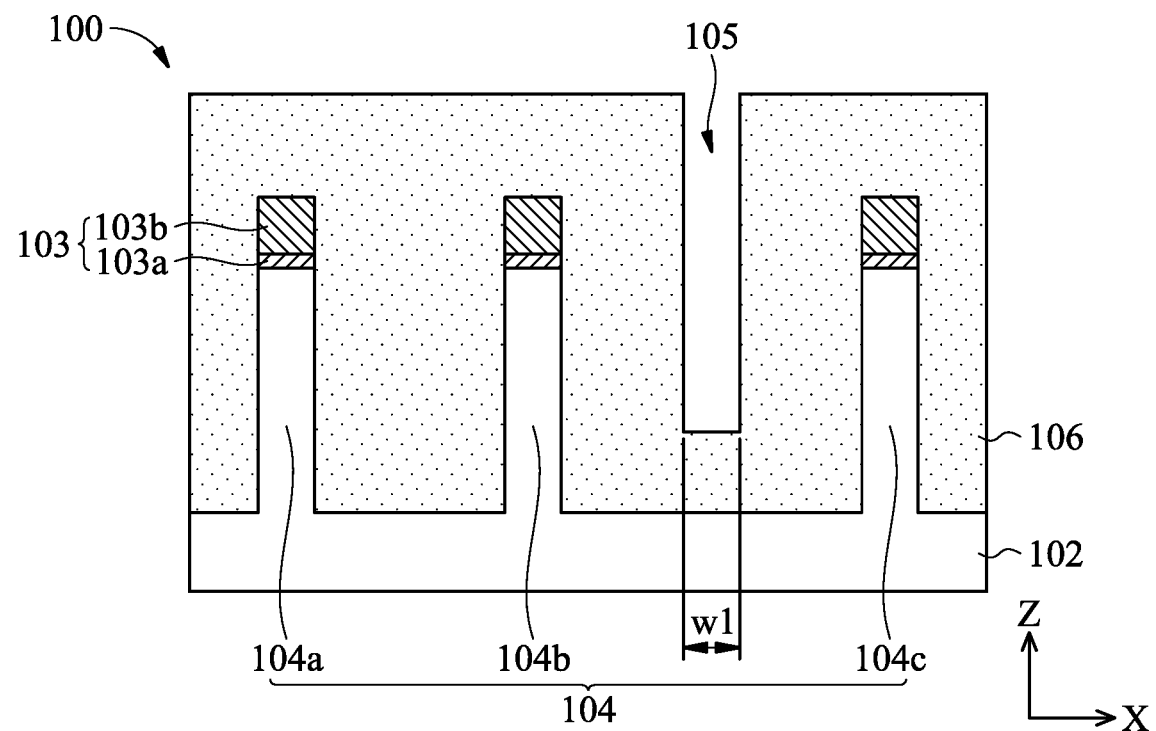

At operation 304, the method 300 (FIG. 3A) forms an isolation structure 106 on surfaces of the structure 100. Referring to FIG. 5, the isolation structure 106 is deposited over the top surface of the substrate 102 and over the exposed surfaces of the semiconductor fins 104 and hard mask 103. In some embodiments, the isolation structure 106 is a shallow trench isolation (STI) feature. Suitable dielectric materials for the isolation structure 106 include silicon oxides, silicon nitrides, silicon carbides, Fluorosilicate Glass (FSG), low-K dielectric materials, combinations thereof, and/or other suitable dielectric materials. In the illustrated embodiment, the isolation structure 106 includes silicon oxide. In some embodiments, the isolation structure 106 may include a multi-layer structure, for example, having one or more liner layers. In various examples, the dielectric material may be deposited by any suitable technique including thermal growth, CVD process, subatmospheric CVD (SACVD) process, FCVD process, ALD process, PVD process, a spin-on process, and/or other suitable process.

In the illustrated embodiment, the isolation structure 106 is deposited by an ALD method and its thickness (along the x direction) is controlled so as to provide a dielectric trench 105 between the adjacent semiconductor fins 104b and 104c. The dielectric trench 105 has a width $W_1$, which ranges from about 3 nm to about 5 nm in some embodiments. Further, the width $W_1$ may be smaller than, equal to, or greater than the width of the semiconductor fins 104 in various embodiments. The dielectric trench 105 will be filled with the dielectric fin 122 (e.g., FIG. 1A) in a later fabrication step. As will be explained in further detail below, the dielectric fin 122 defines the position of a CMG trench in a subsequent cut metal gate process. Another design consideration is that, once filled in, the dielectric fin 122 will help improve the uniformity of the fins including the semiconductor fins 104 and the dielectric fin 122. This design consideration in conjunction with the width and pitch of the semiconductor fins 104 may be used for controlling the thickness of the isolation structure 106 during the deposition process.

Figure 6:
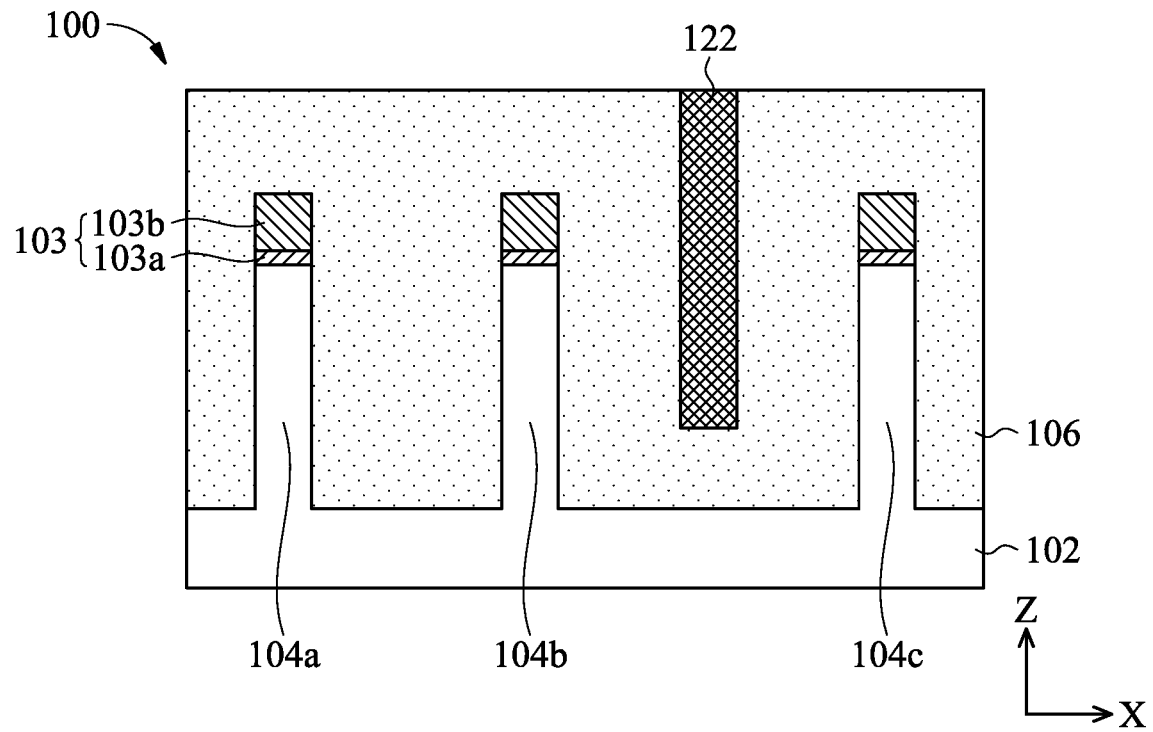

At operation 306, the method 300 (FIG. 3A) deposits one or more dielectric materials over the substrate 102 and the isolation structure 106, and filling the trenches 105. Subsequently, the operation 306 performs a chemical mechanical planarization (CMP) process to planarize the top surface of the device 100 and to expose the hard mask 103. The resulting structure is shown in FIG. 6. In some embodiments, the hard mask 103 may function as a CMP stop layer. The one or more dielectric materials may include silicon carbide nitride (SiCN), silicon oxycarbide nitride (SiOCN), silicon oxycarbide (SiOC), a metal oxide such as aluminum oxide ($Al_2O_3$), hafnium oxide ($HfO_2$) or zirconium oxide ($ZrO_2$), or a combination thereof; and may be deposited using ALD, CVD, PVD, or other suitable methods. The one or more dielectric materials in the trench 105 (FIG. 5) become the dielectric fin 122. In various embodiments, the dielectric fin 122 and the isolation structure 106 have different material compositions. In one example, the isolation structure 106 includes silicon oxide and the dielectric fin 122 includes silicon, oxide, carbon, and nitride.

Figure 7:
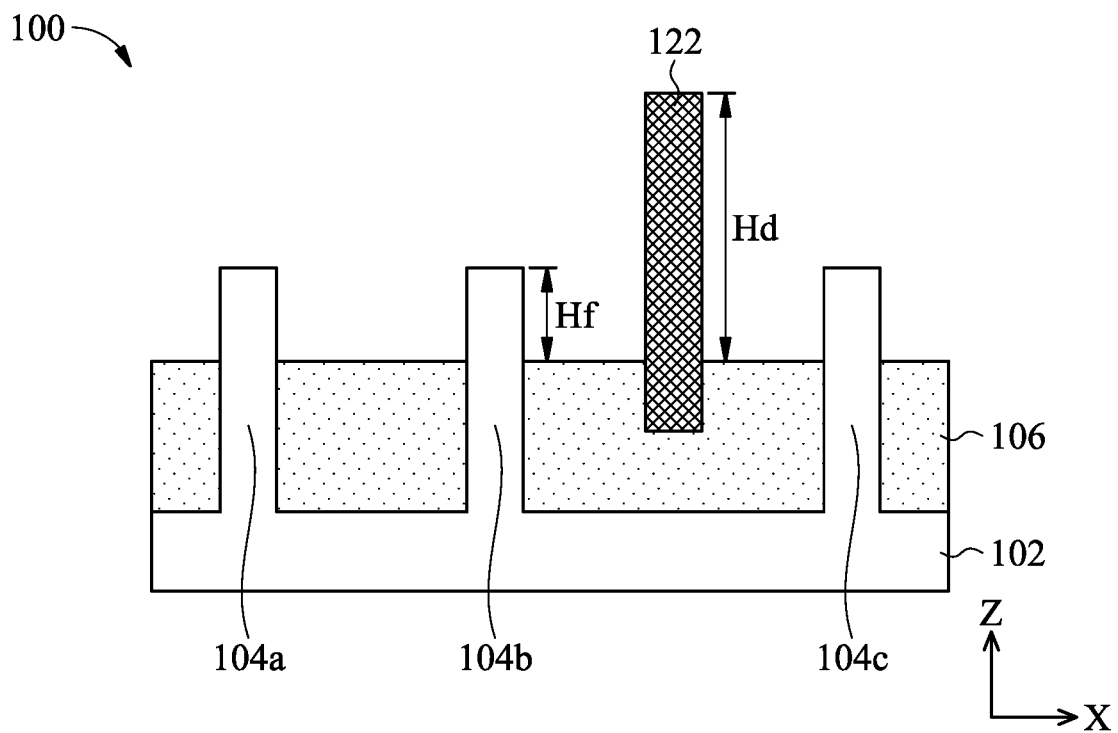

At operation 308, the method 300 (FIG. 3A) recesses the isolation structure 106, such as shown in FIG. 7. Any suitable etching technique may be used to recess the isolation structure 106 including dry etching, wet etching, RIE, and/or other etching methods, and in an exemplary embodiment, an anisotropic dry etching is used to selectively remove the dielectric material of the isolation structure 106 without etching the semiconductor fins 104 and the dielectric fin 122. In an embodiment, the operation 308 applies a Certas dry chemical etching process at about 100° C. to recess the isolation structure 106. The hard mask 103 may also be removed before, during, and/or after the recessing of the isolation structure 106. The hard mask 103 may be removed, for example, by a wet etching process using $H_3PO_4$ or other suitable etchants. In some embodiments, the hard mask 103 is removed by the same etchant used to recess the isolation structure 106. After operation 308, the semiconductor fins 104 and the dielectric fin 122 extend upwardly from the recessed isolation structure 106.

The height of the dielectric fin 122 above the isolation structure 106 is denoted as $H_d$. The height of the semiconductor fins 104 is denoted as $H_f$. $H_d$ is higher than $H_f$. For example, the ratio $H_d/H_f$ may range from about 1.1 to about 1.5. In some embodiments, the dielectric fin 122 has substantially no etching loss during operation 308. Therefore, the height difference ($H_d-H_f$) between the dielectric fin 122 and the semiconductor fins 104 is about the height $H_1$ of the hard mask 103 (FIG. 4B). In some alternative embodiments, the dielectric fin 122 is partially consumed during operation 308. Accordingly, the height difference ($H_d-H_f$) between the dielectric fin 122 and the semiconductor fins 104 is less than the height $H_1$ of the hard mask 103 (FIG. 4B).

Figure 8A:
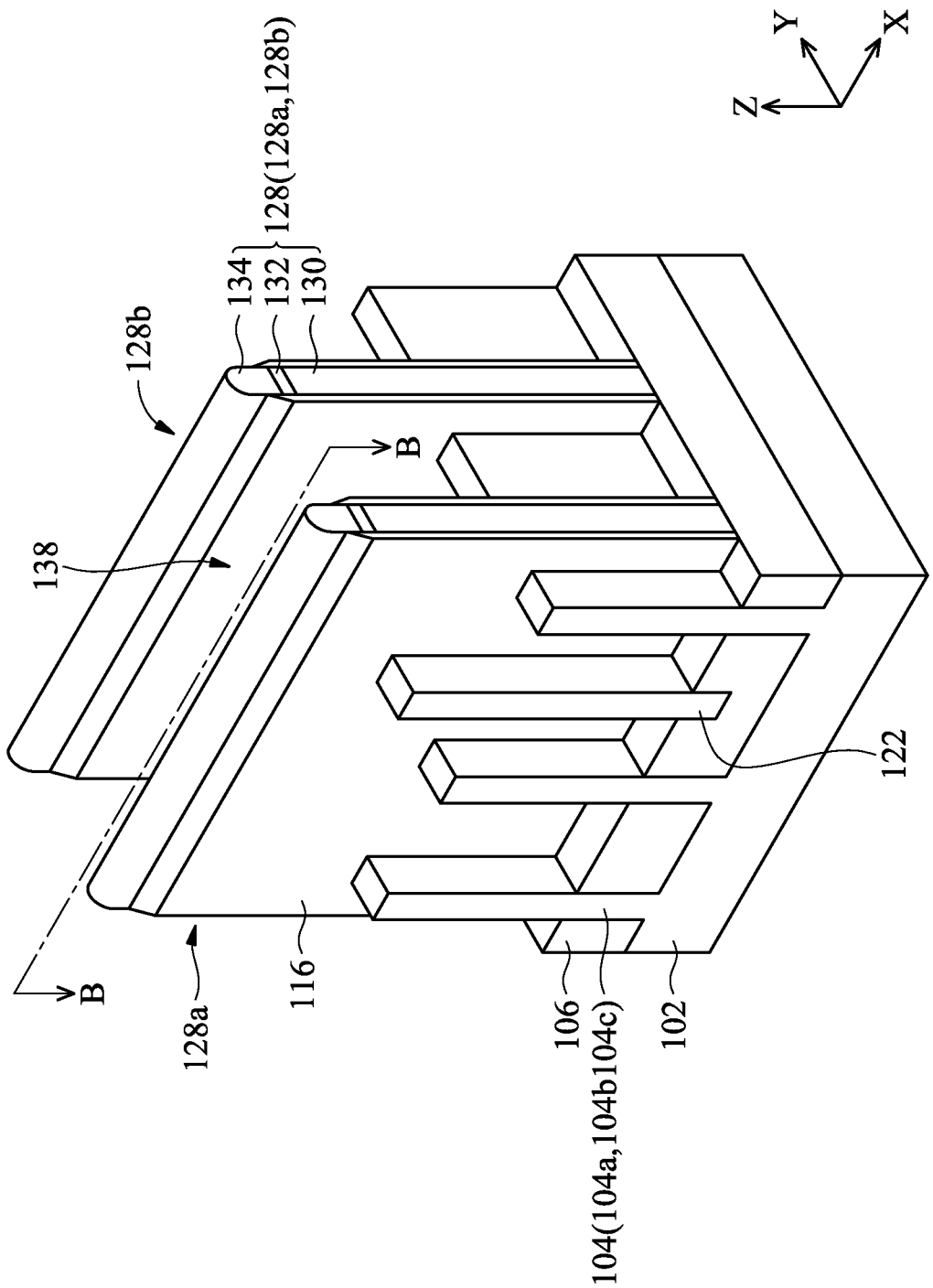
Figure 8B:
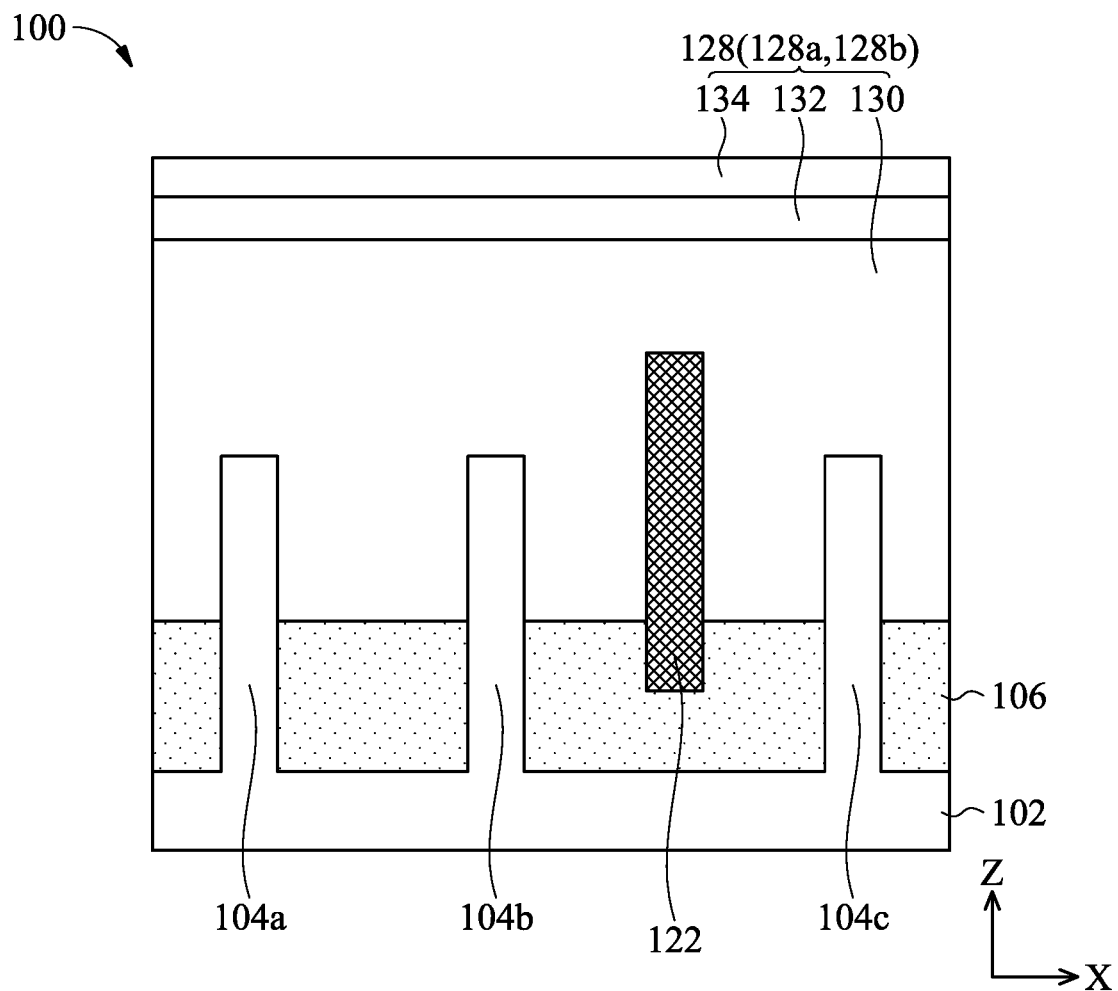

At operation 310, the method 300 (FIG. 3A) forms temporary gate structures 128 over the isolation structure 106 and engaging the semiconductor fins 104 and the dielectric fin 122 over top and sidewall surfaces thereof, such as shown in FIGS. 8A and 8B. FIG. 8A is a perspective view of the device 100. FIG. 8B refers to a cross-sectional view taken through a channel region of the semiconductor fins 104 (e.g., along the B-B line) to better illustrate the underlying features. The temporary gate structures 128 include an electrode layer 130 and two hard mask layers 132 and 134 in the illustrated embodiment. The temporary gate structures 128 will be replaced by the gate stacks 112 (e.g., FIG. 1A) in later fabrication steps. Therefore, they may also be referred to as dummy gates 128. The gate electrode 130 may include poly-crystalline silicon (poly-Si) and may be formed by suitable deposition processes such as LPCVD and PECVD. Each of the hard mask layers 132 and 134 may include one or more layers of dielectric material such as silicon oxide and/or silicon nitride, and may be formed by CVD or other suitable methods. The various layers 130, 132, and 134 may be patterned by photolithography and etching processes.

Still referring to FIGS. 8A and 8B, operation 310 further includes depositing gate spacers 116 over the structure 100, on top and sidewalls of the dummy gates 128, and filling spaces between adjacent semiconductor fins 104 and the dielectric fin 122. The operation 310 may subsequently perform an anisotropic etching process to remove the portion of the gate spacers 116 directly above the semiconductor fins 104 and the dielectric fins 108. As a result, adjacent gate spacers 116 provide trenches 138 that expose the semiconductor fins 104 and the dielectric fin 122 in the S/D regions of the device 100. The portion of the gate spacers 116 directly above the dummy gates 128 may or may not be completely removed by this anisotropic etching process. The gate spacers 116 may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The gate spacers 116 may be deposited by one or more methods including ALD, CVD, and/or other suitable methods.

Figure 9A:
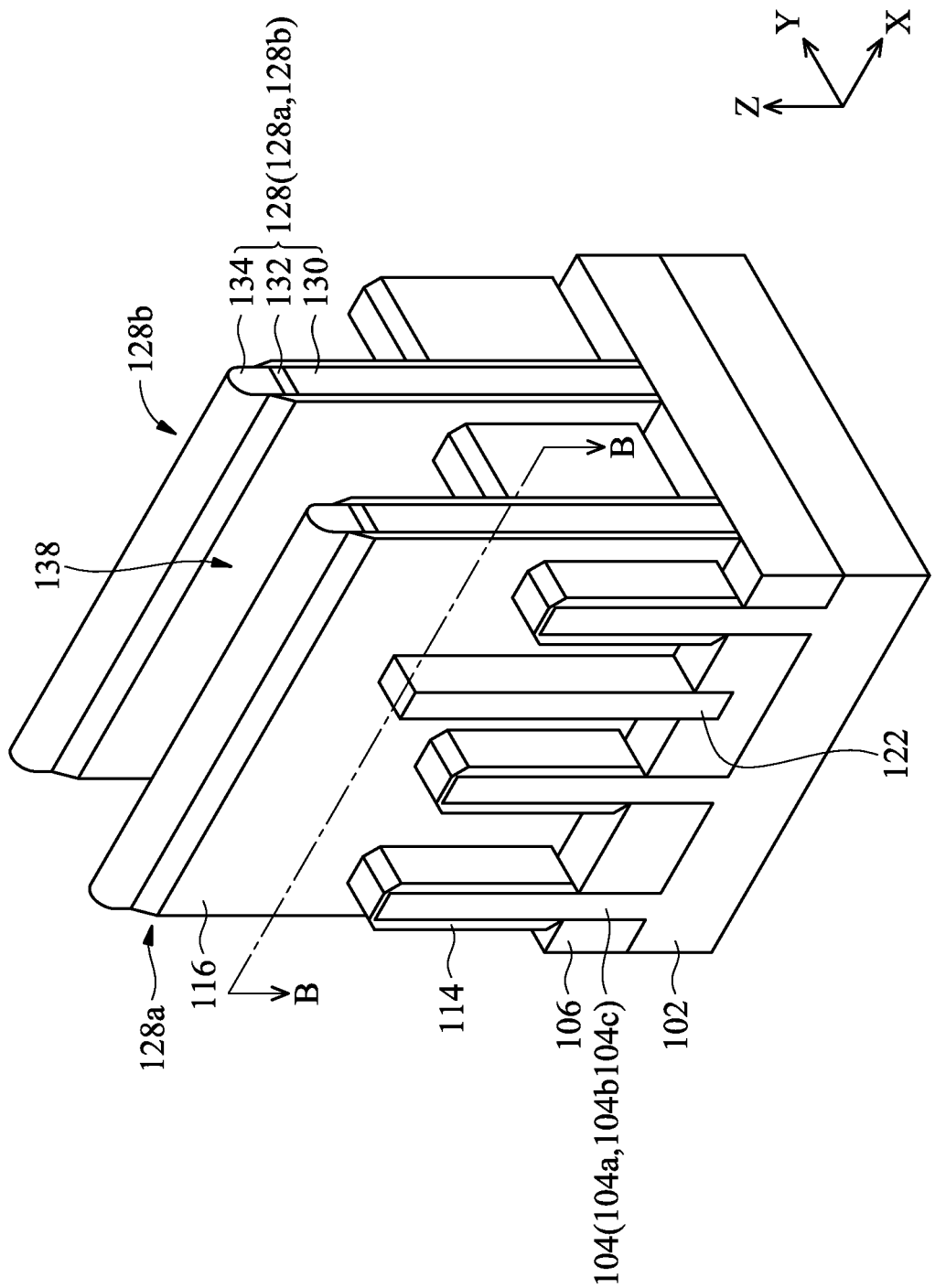
Figure 9B:
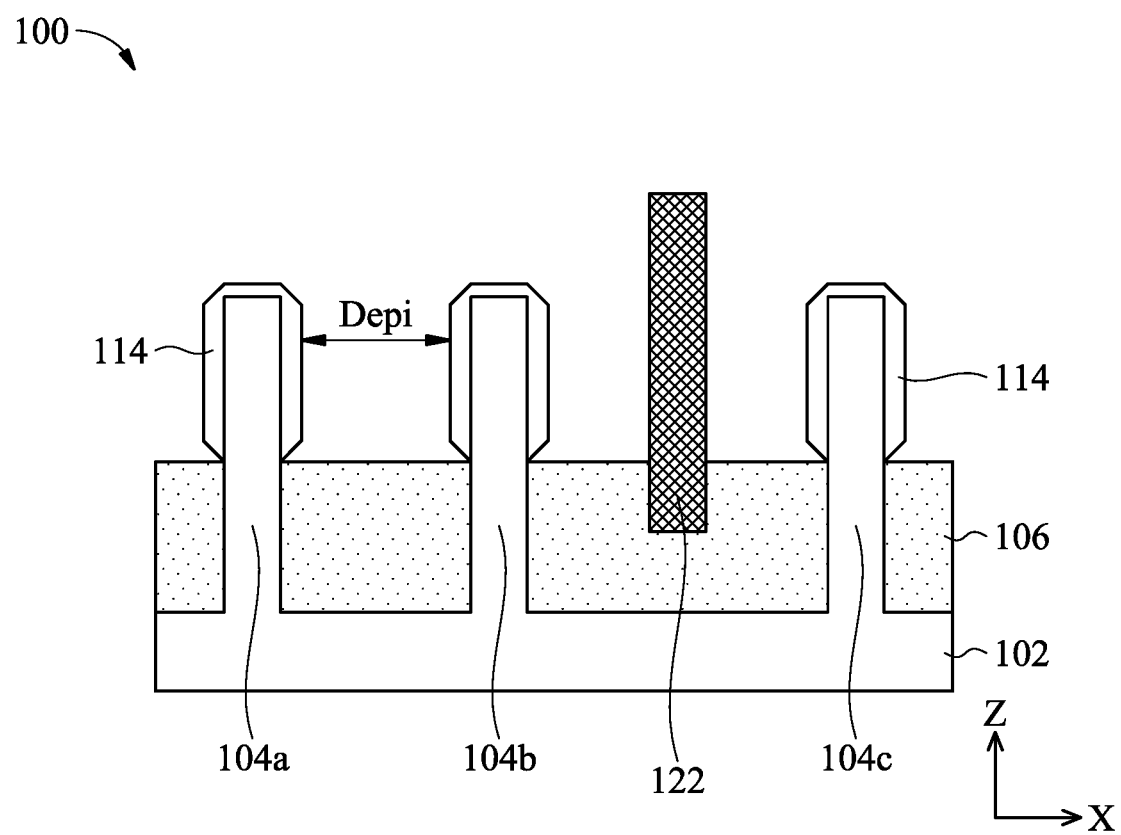

At operation 312, the method 300 (FIG. 2A) epitaxially grows one or more semiconductor materials 114 over the semiconductor fins 104, such as shown in FIGS. 9A and 9B. FIG. 9A is a perspective view of the device 100. FIG. 9B refers to a cross-sectional view taken through a source/drain region of the semiconductor fins 104 (e.g., along the B-B line) to better illustrate the underlying features. The one or more semiconductor materials 114 are also referred to as the epitaxial source/drain (S/D) features 114. During the epitaxial process, the dummy gates 128 and gate spacers 116 limit the epitaxial S/D features 114 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which interact with the composition of the substrate 102. In some embodiments, adjacent epitaxial S/D features 114, such as the epitaxial S/D features 114 grown on semiconductor fins 104a and 104b, are spaced from each other with a distance $D_{epi}$ (i.e., $D_{epi}>0$). In some embodiments, adjacent source/drain features 112 are epitaxially grown in a way that they are connected (i.e., $D_{epi}=0$). Furthermore, the height of the semiconductor fins 104 in the source/drain regions may also be recessed before epitaxially growing the epitaxial S/D features 114. As an example, the semiconductor fins 104 in the source/drain regions may become lower than the top surface of the isolation features 106, and epitaxial S/D features 114 extend upwardly from the top surfaces of the semiconductor fins 104 to a height above the isolation features 106.

The epitaxial S/D features 114 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial S/D features 114 are not in-situ doped, an implantation process (i.e., a junction implant process) is performed to dope the epitaxial S/D features 114. In an exemplary embodiment, the epitaxial S/D features 114 in an NMOS device include SiP, while those in a PMOS device include GeSnB and/or SiGeSnB. Furthermore, silicidation or germano-silicidation may be formed on the epitaxial S/D features 114. For example, silicidation, such as nickel silicide, may be formed by depositing a metal layer over the epitaxial S/D features 114, annealing the metal layer such that the metal layer reacts with silicon in the epitaxial S/D features 114 to form the metal silicidation, and thereafter removing the non-reacted metal layer.

Figure 10A:
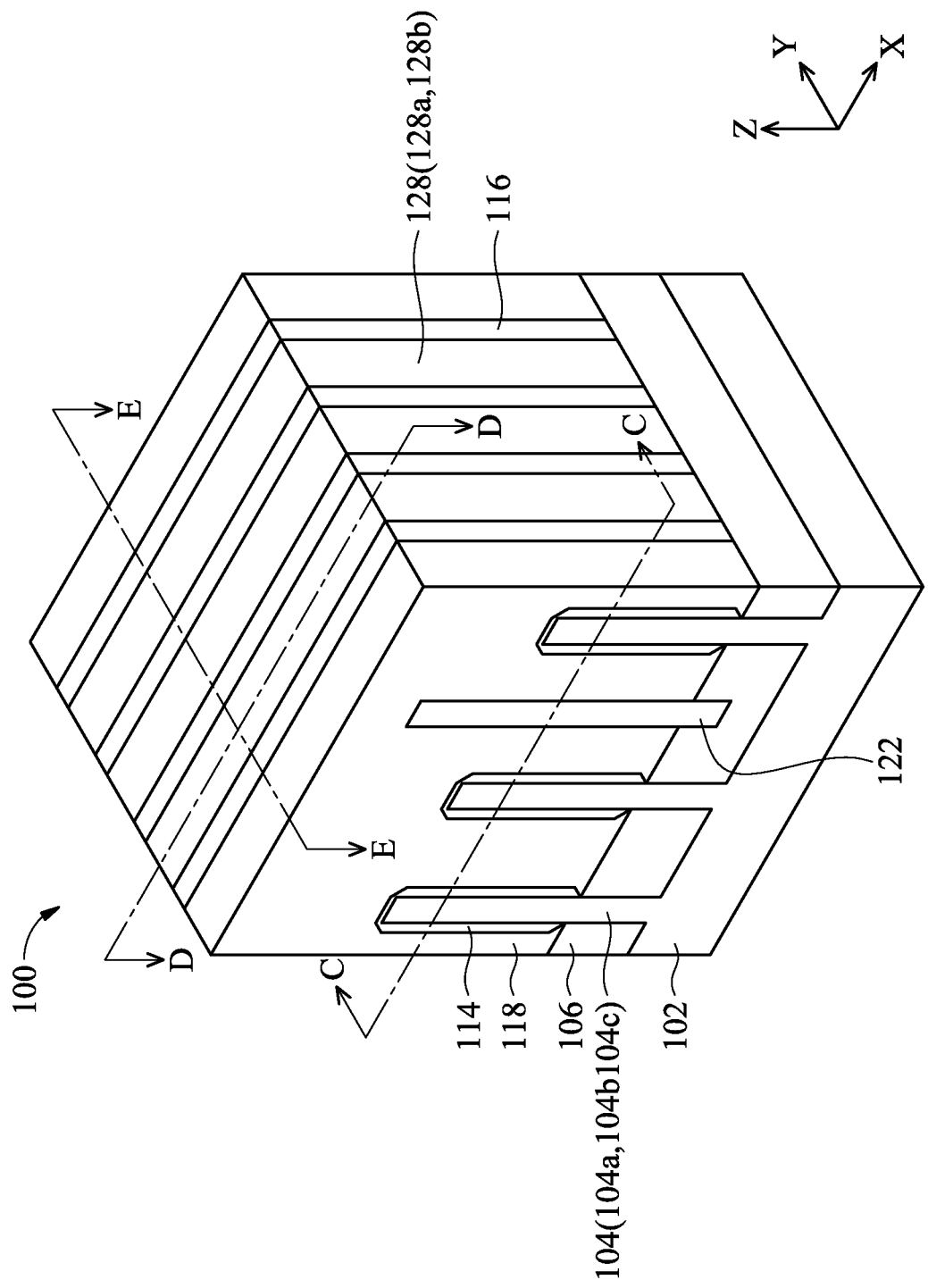
Figure 10B:
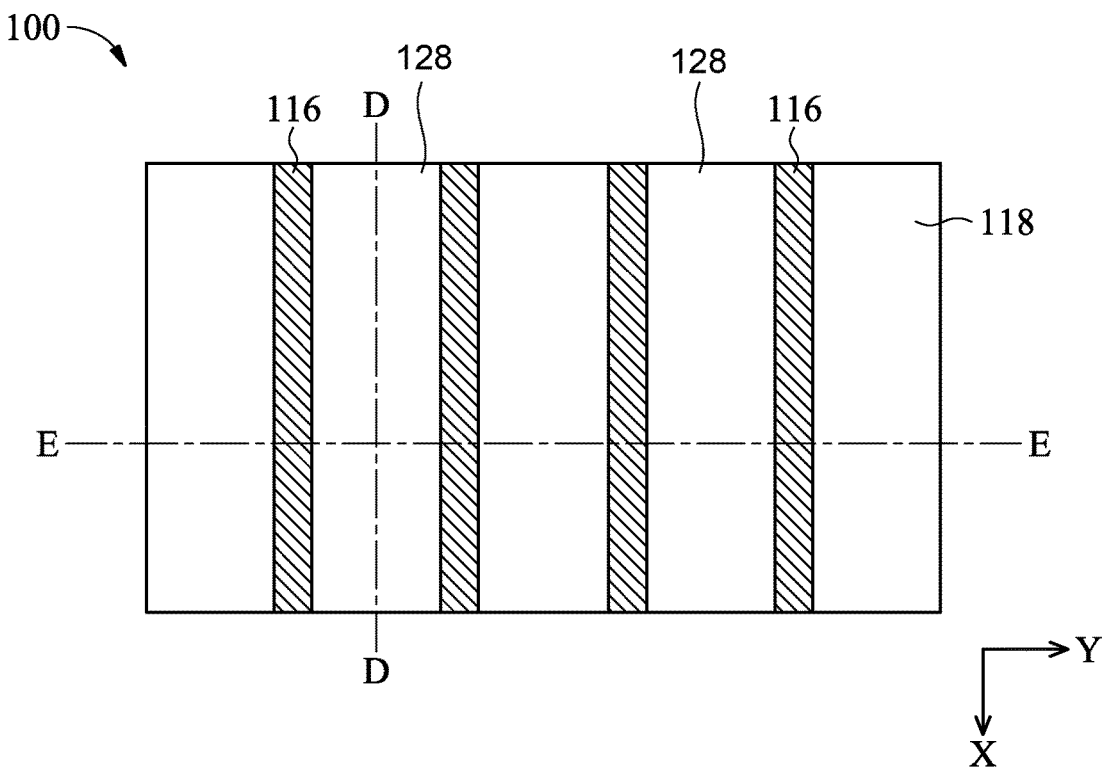
FIGS. 10B, 11B, 12B, 13B, 14B, 16B, 17B, and 18B illustrate top views of a semiconductor structure during a fabrication process according to the method of FIGS. 3A and 3B, in accordance with some embodiments.
Figure 10C:
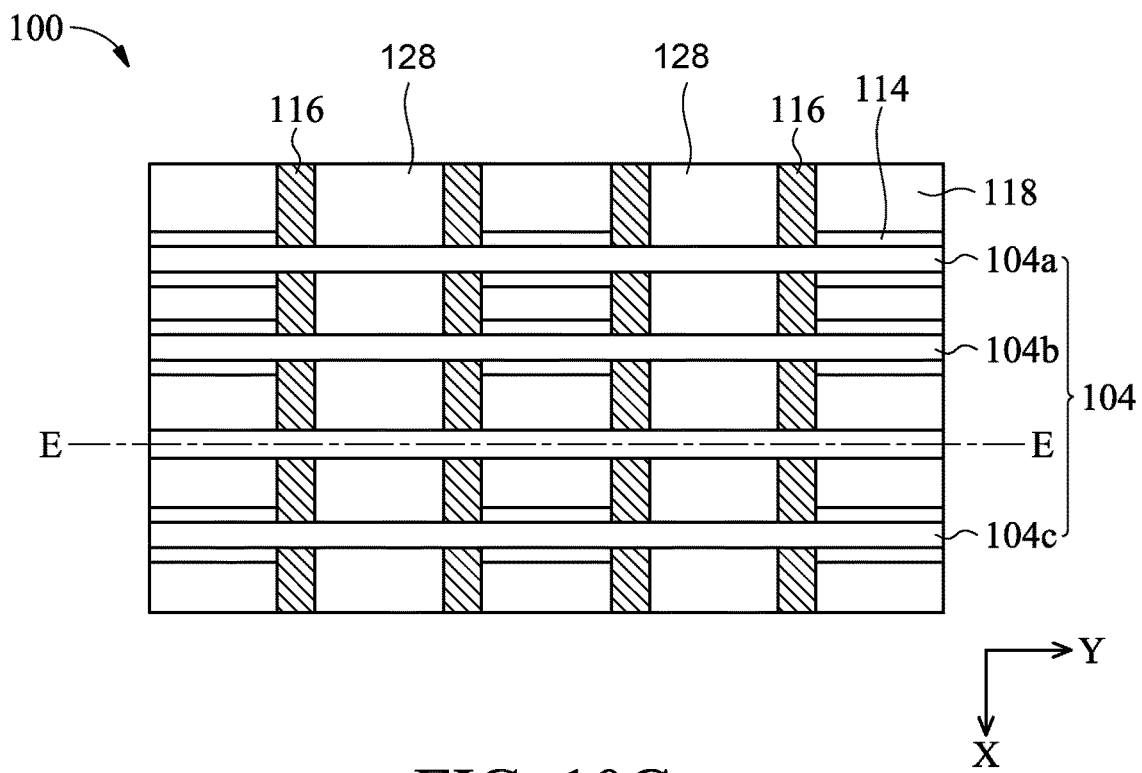
Figure 10D:
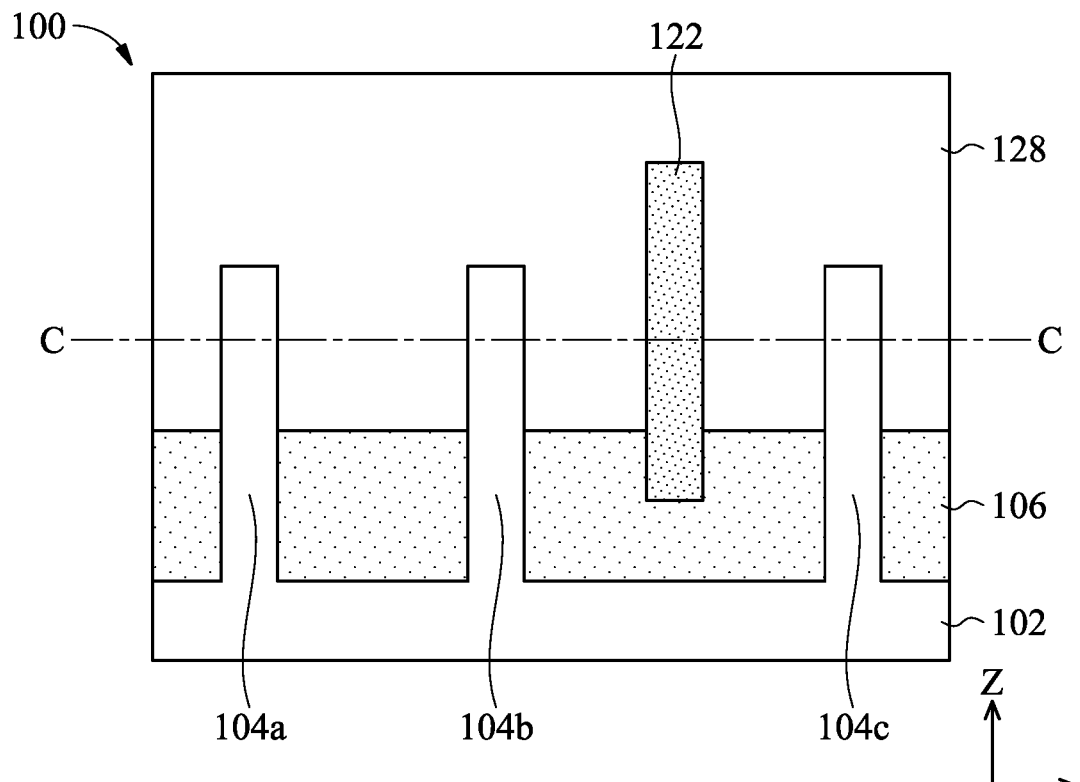
Figure 10E:
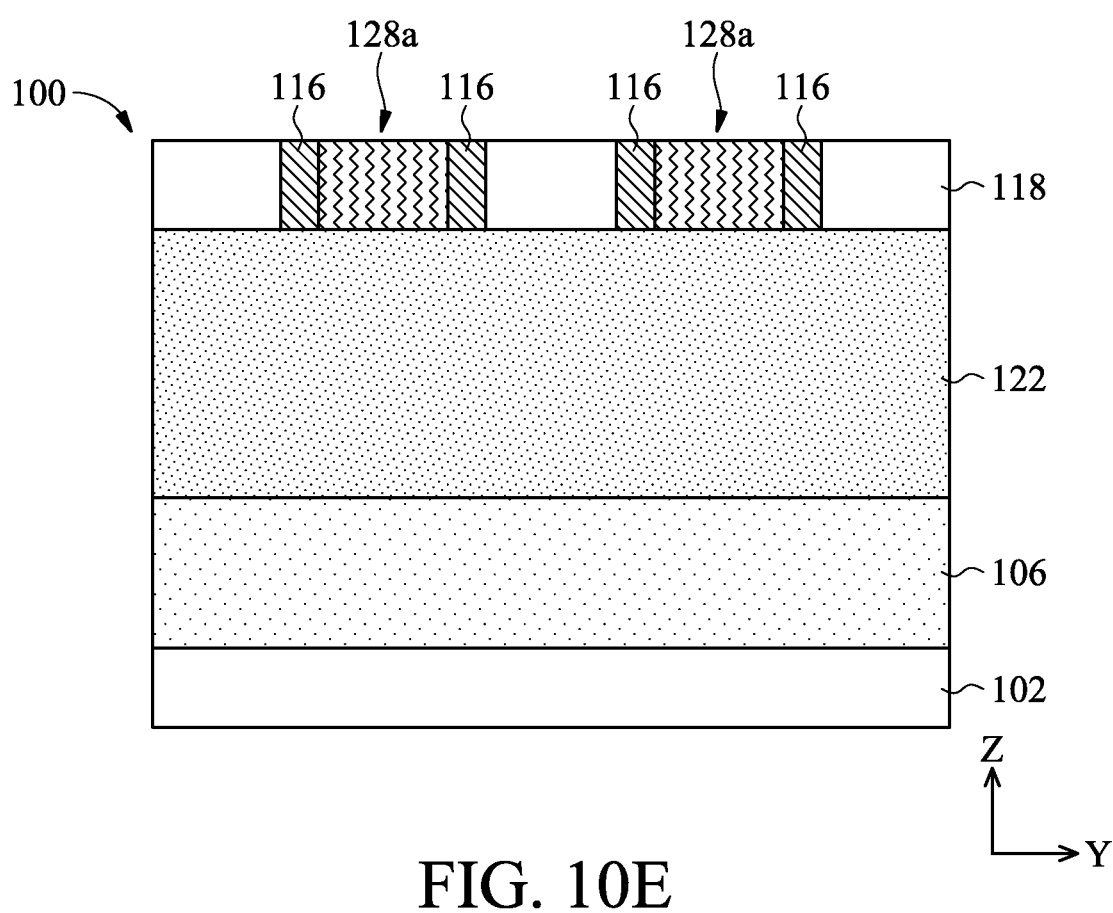

Subsequently, operation 312 also forms an inter-layer dielectric (ILD) layer 118 covering the device 100. The ILD layer 118 is deposited on top and sidewalls of the epitaxial S/D features 114 and the dielectric fin 122 in the source/drain regions. A CMP process may follow operation 312 to remove excessive dielectric materials. In some embodiments, the CMP process also removes hard mask layers 132 and 134 and exposes the gate electrode layer 130. The resulting structure is shown in FIGS. 10A-10E. FIG. 10A shows a perspective view of the device 100 after the CMP process. FIG. 10B shows a top view of the device 100. FIG. 10C illustrates a cross-sectional view of the device 100 along the C-C line of FIG. 10A. FIG. 10D illustrates a cross-sectional view of the device 100 along the D-D line of FIG. 10A. FIG. 10E illustrates a cross-sectional view of the device 100 along the E-E line of FIG. 10A. The ILD layer 118 may be part of an electrical multi-layer interconnect (MLI) structure that electrically interconnects the devices of the workpiece including the FinFET devices formed on the semiconductor fins 104. In such embodiments, the ILD layer 118 acts as an insulator that supports and isolates conductive traces of the MLI structure. The ILD layer 118 may include any suitable dielectric material, such as silicon oxide, doped silicon oxide such as borophosphosilicate glass (BPSG), tetraethylorthosilicate (TEOS) oxide, un-doped silicate glass, fused silica glass (FSG), phosphosilicate glass (PSG), boron doped silicon glass (BSG), silicon nitride, silicon oxynitride, silicon carbide, low-k dielectric material, other suitable materials, and/or combinations thereof. The ILD layer 118 may be deposited by a PECVD process, a flowable CVD (FCVD) process, or other suitable deposition technique.

Figure 11A:
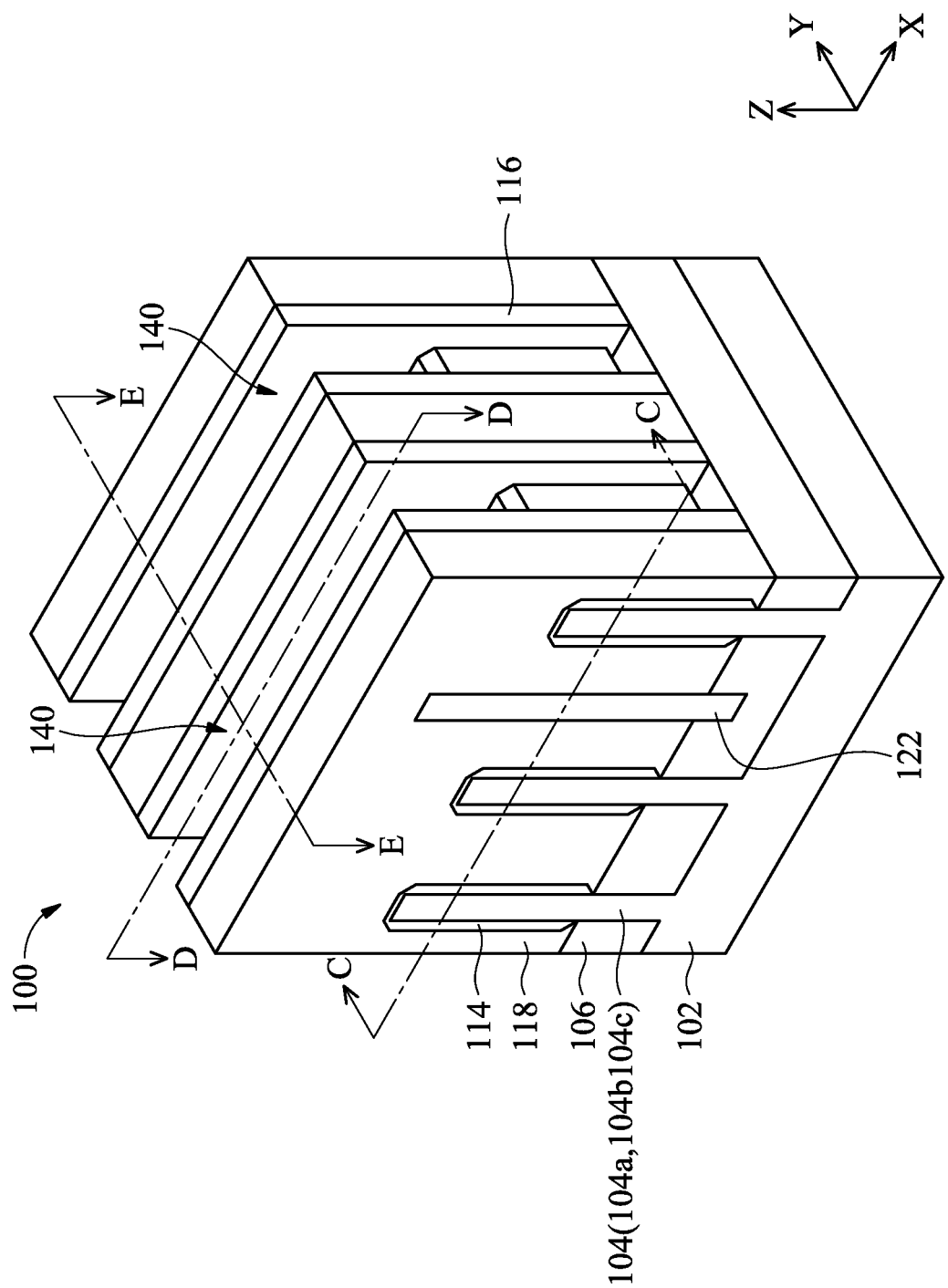
Figure 11B:
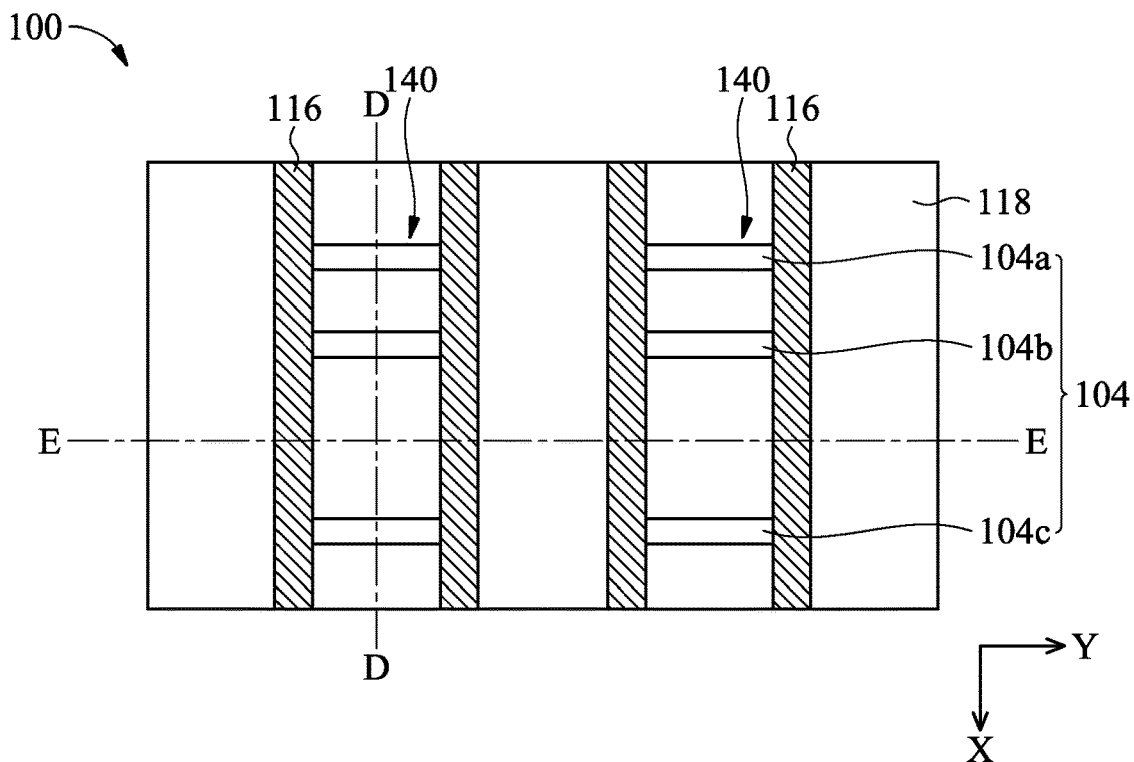
Figure 11C:
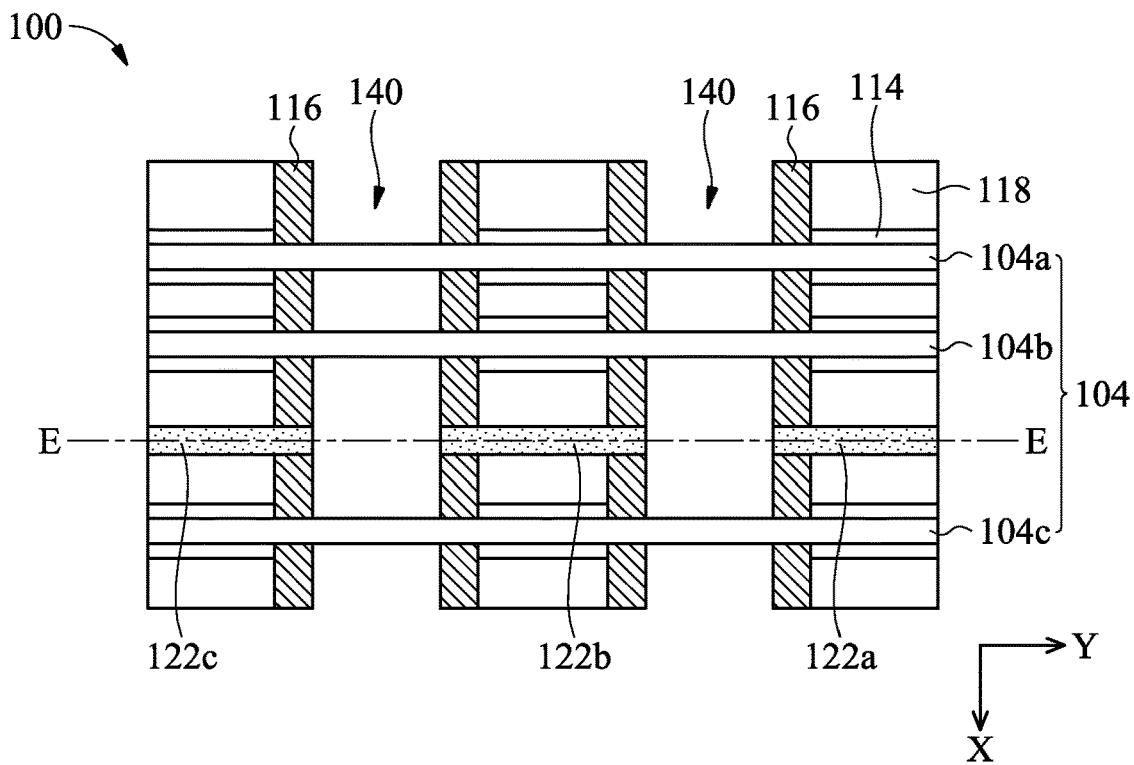
Figure 11D:
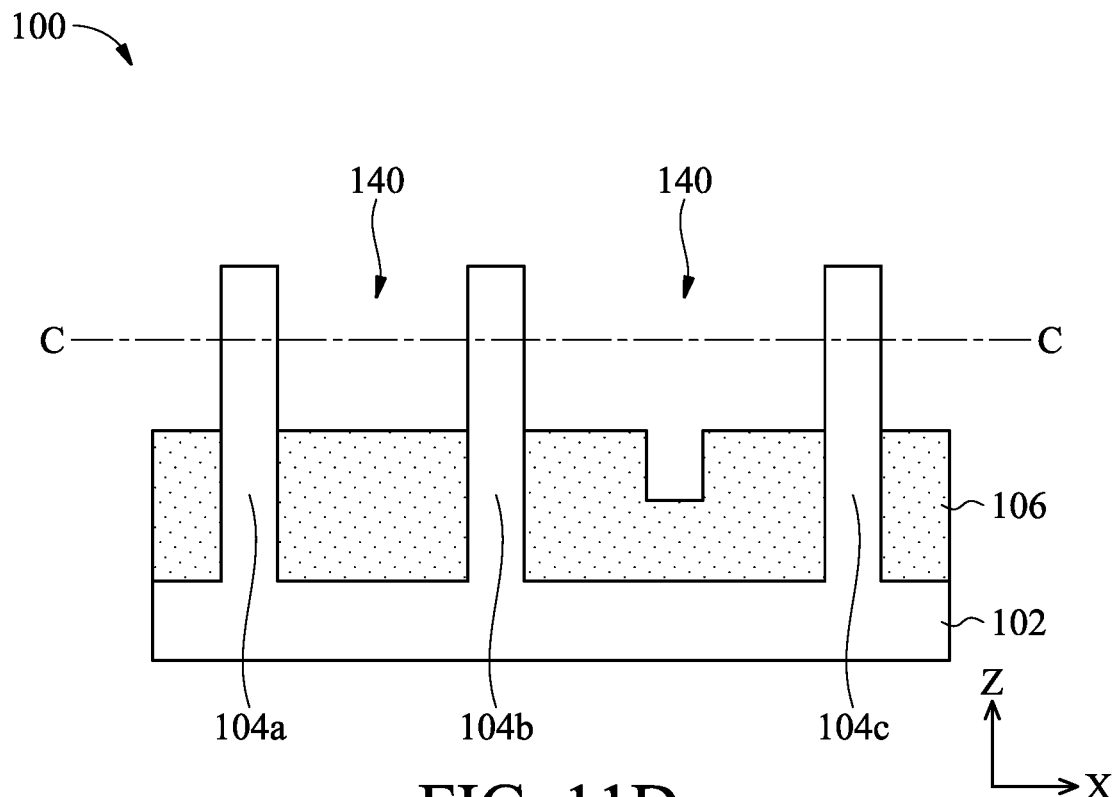
Figure 11E:
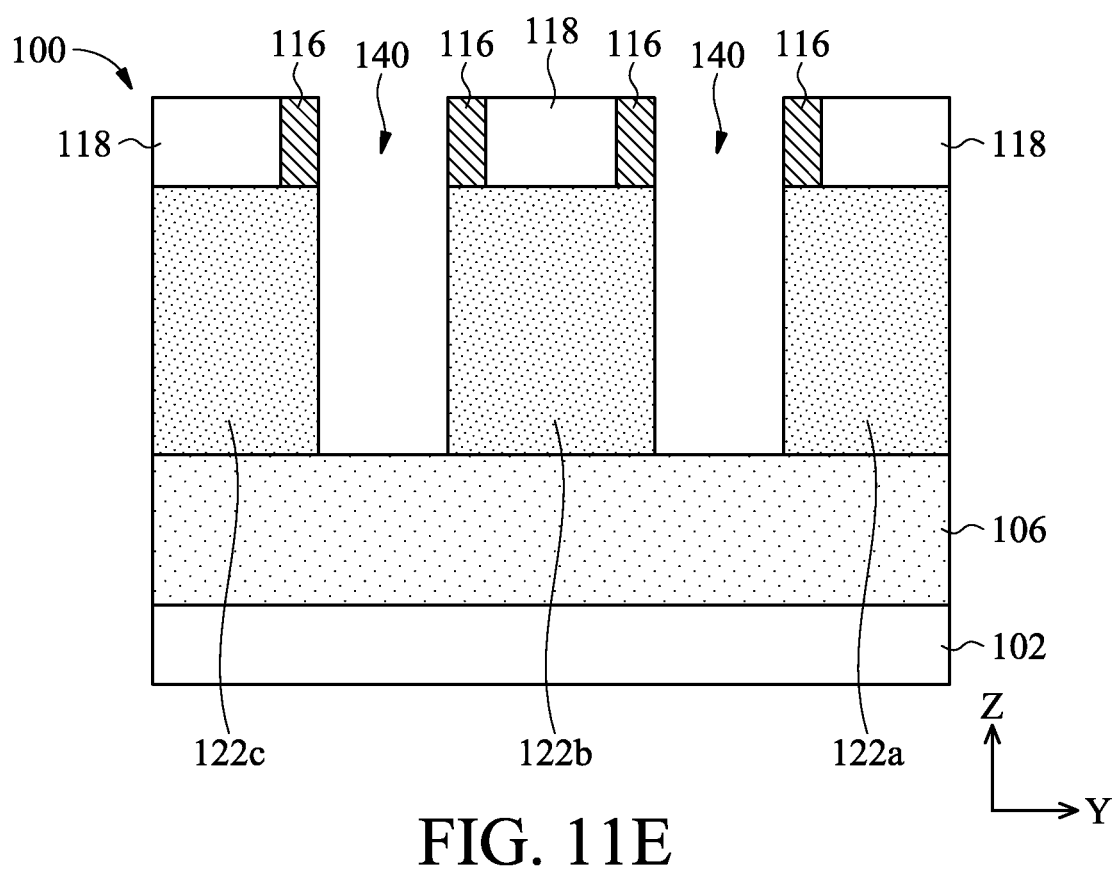
Figure 12A:
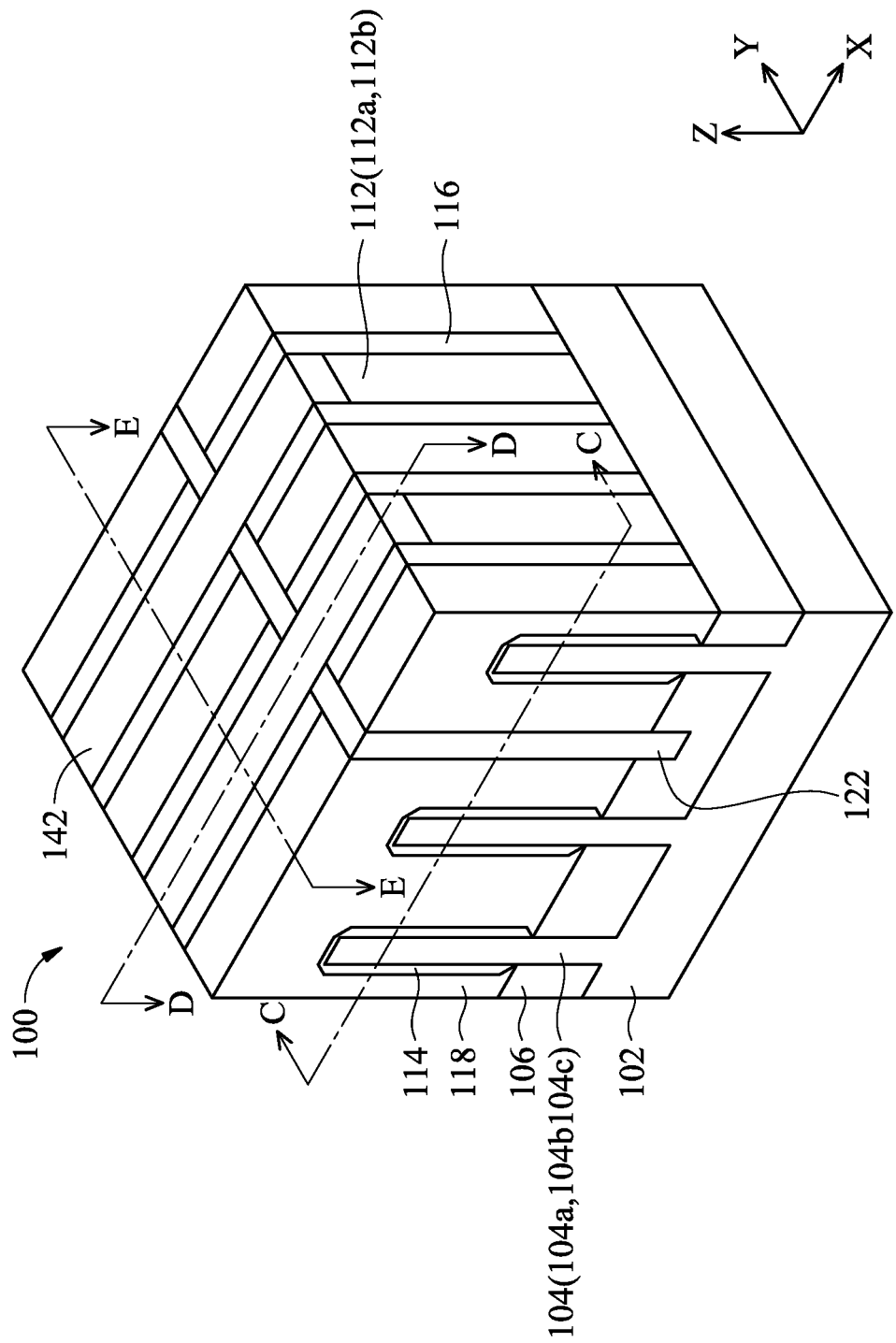
Figure 12B:
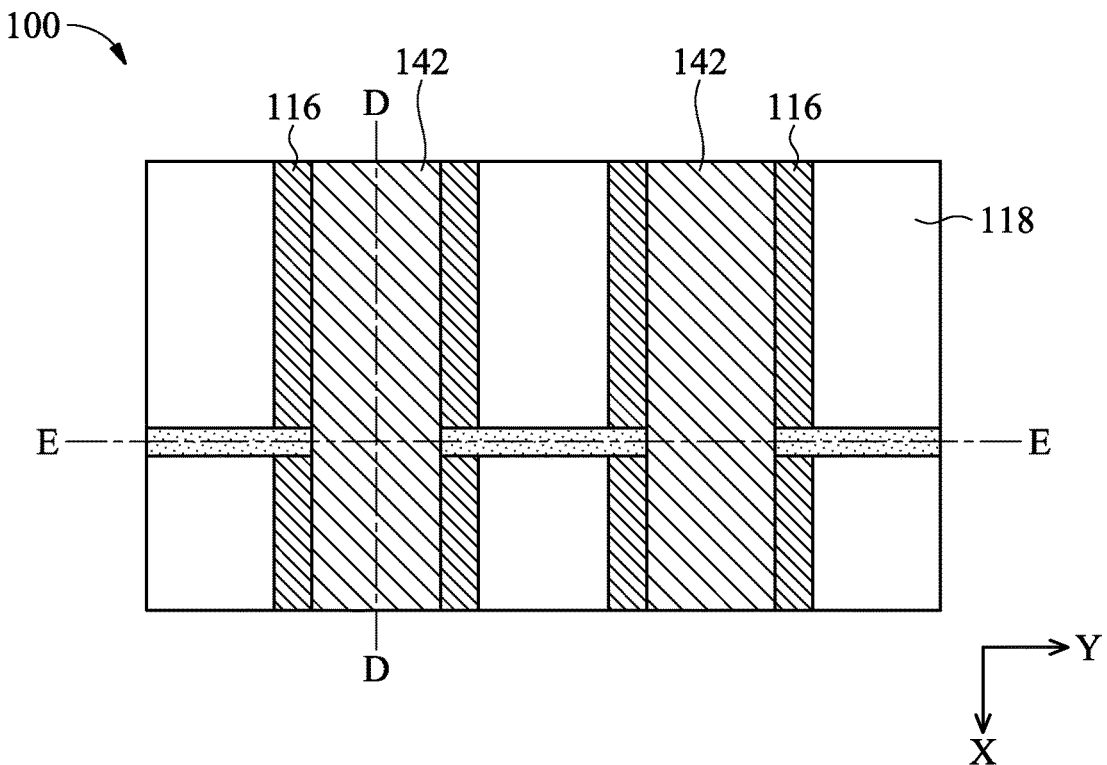
Figure 12C:
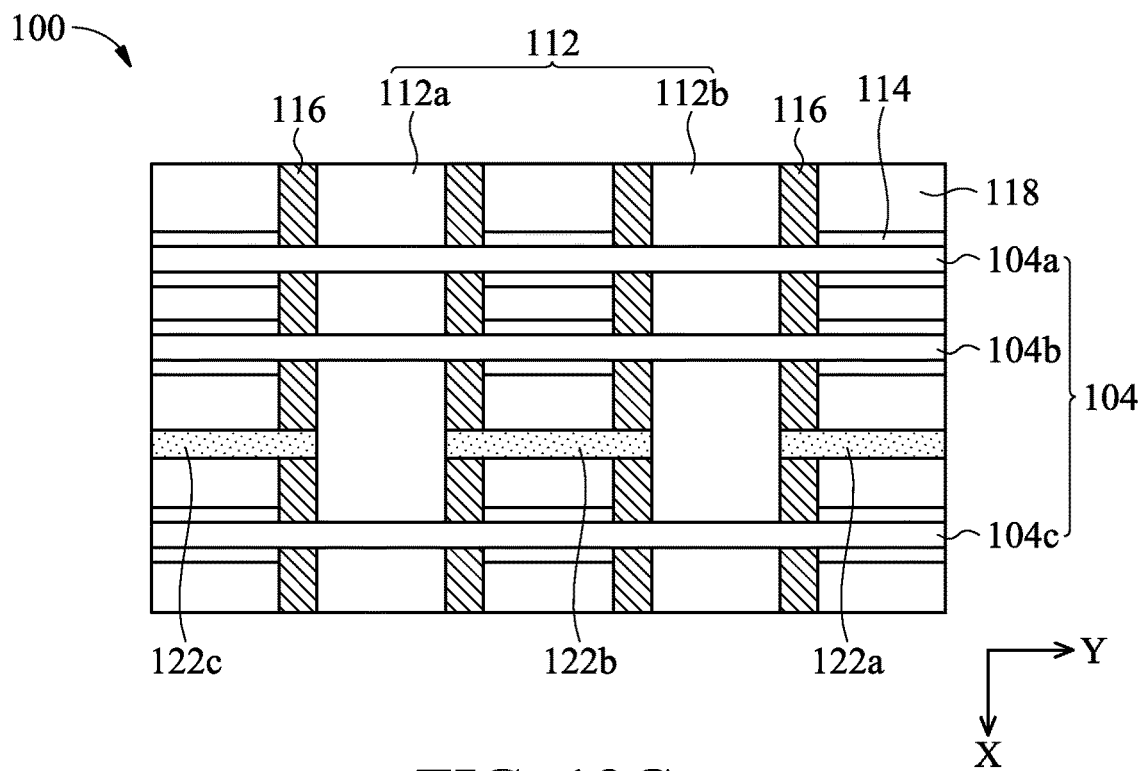
Figure 12D:
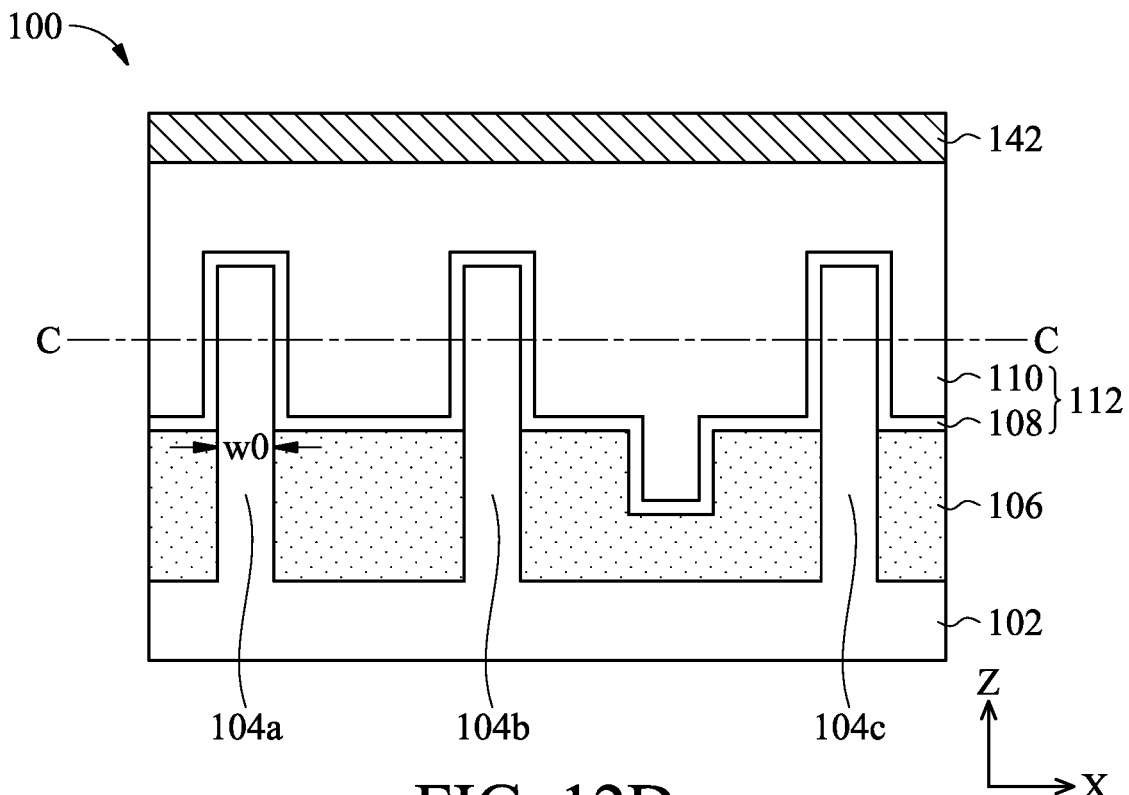
Figure 12E:
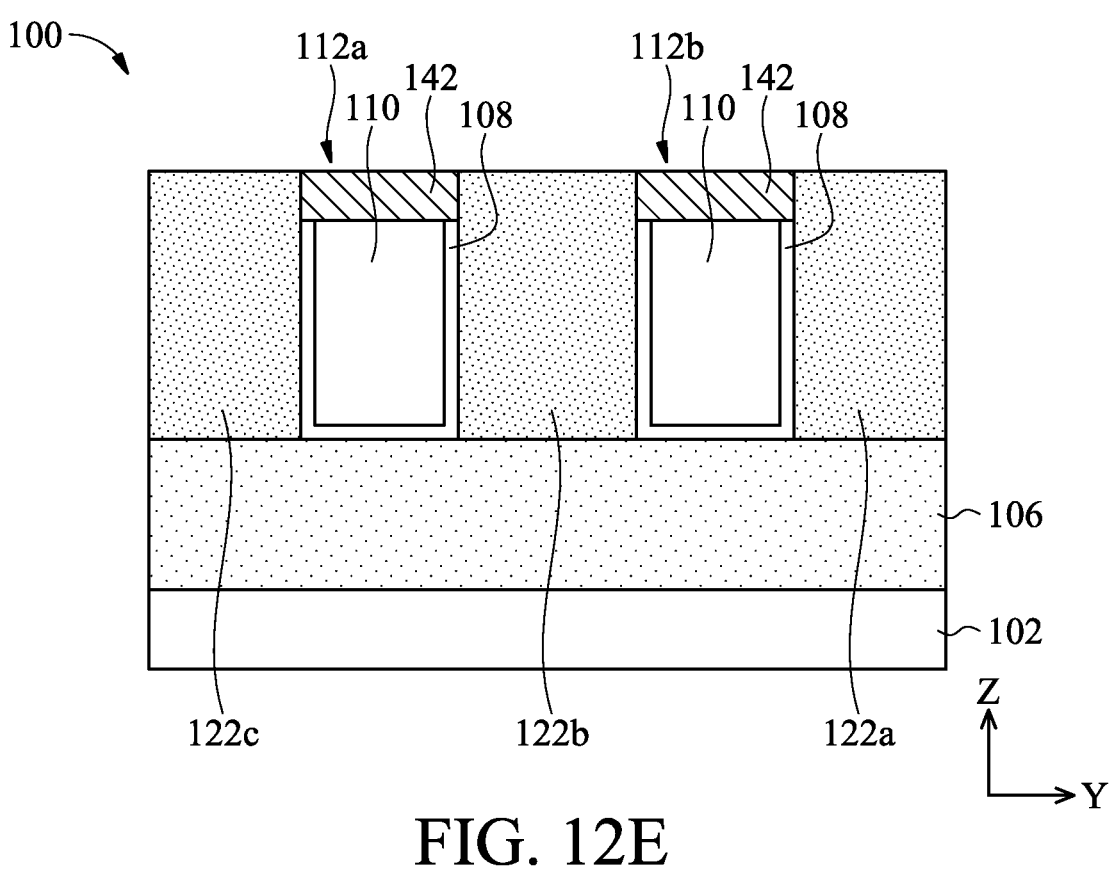
Figure 13A:
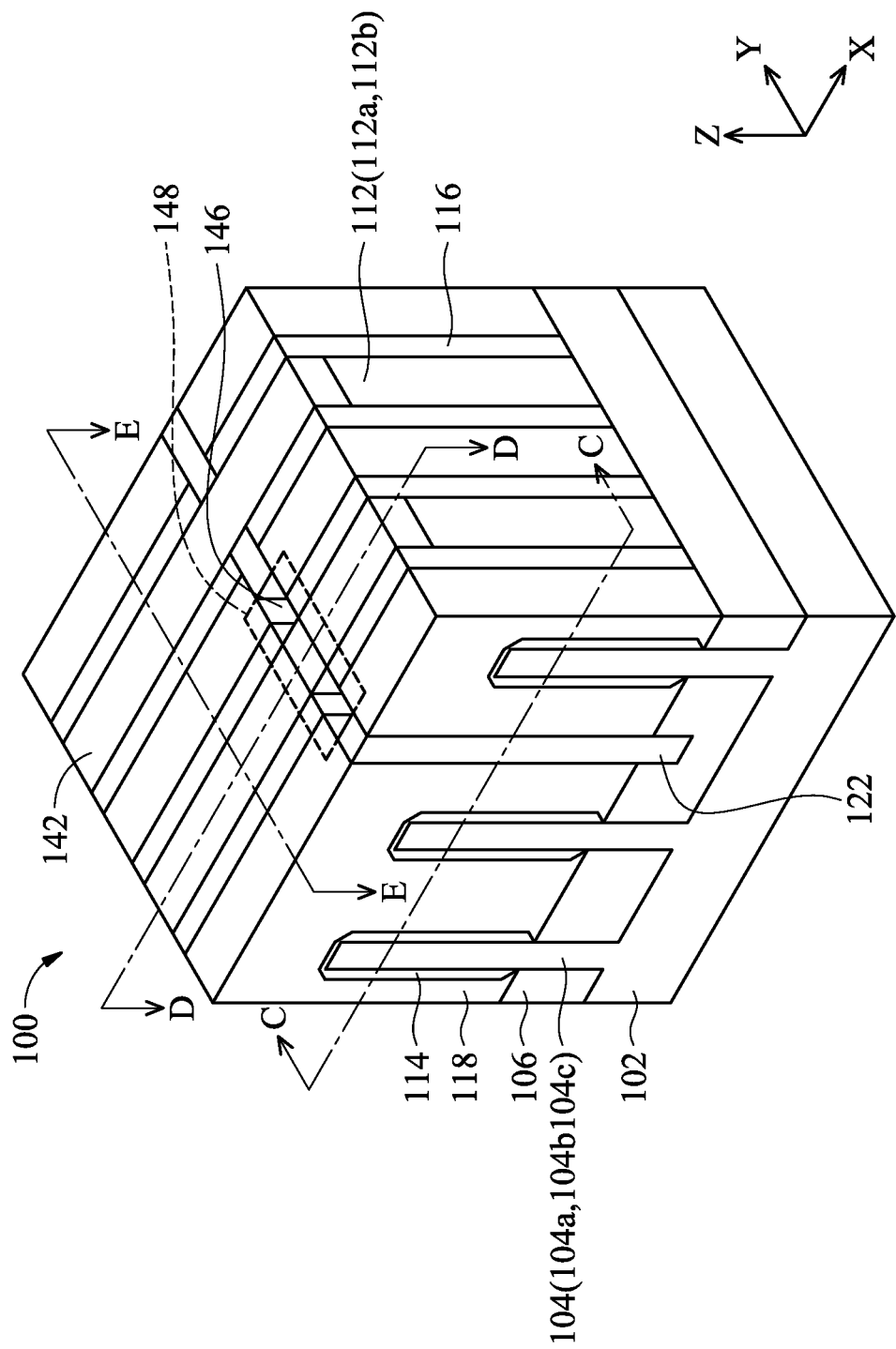
Figure 13B:
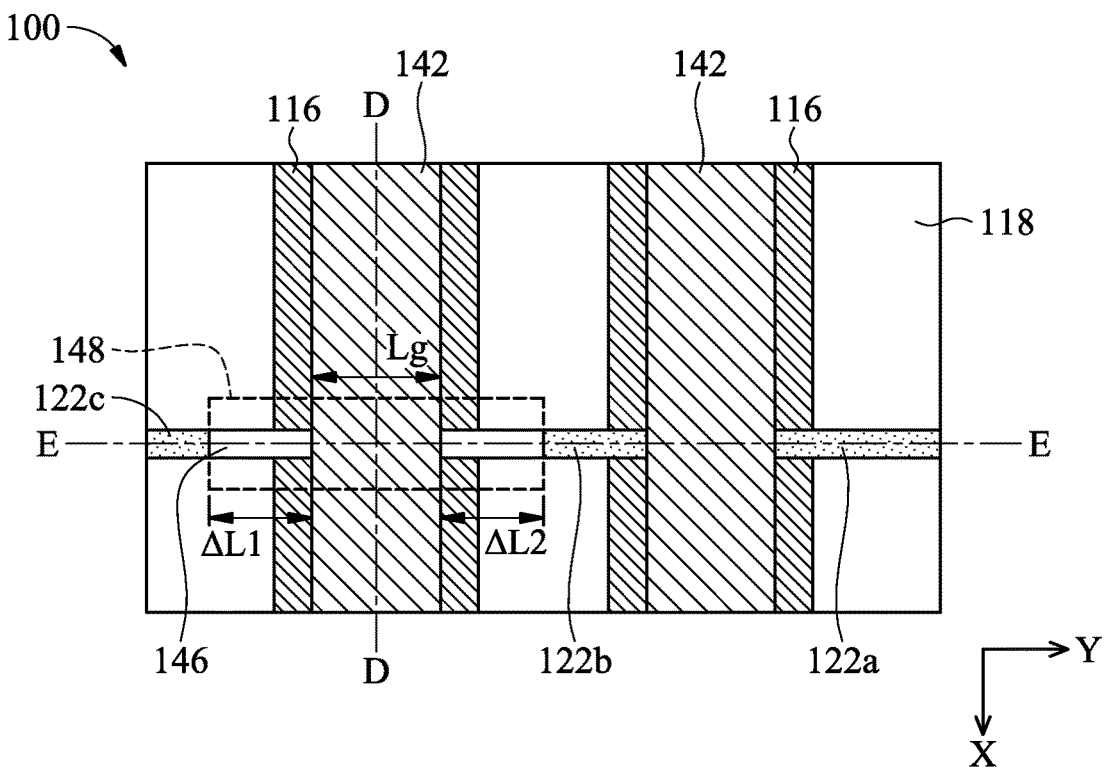
Figure 13C:
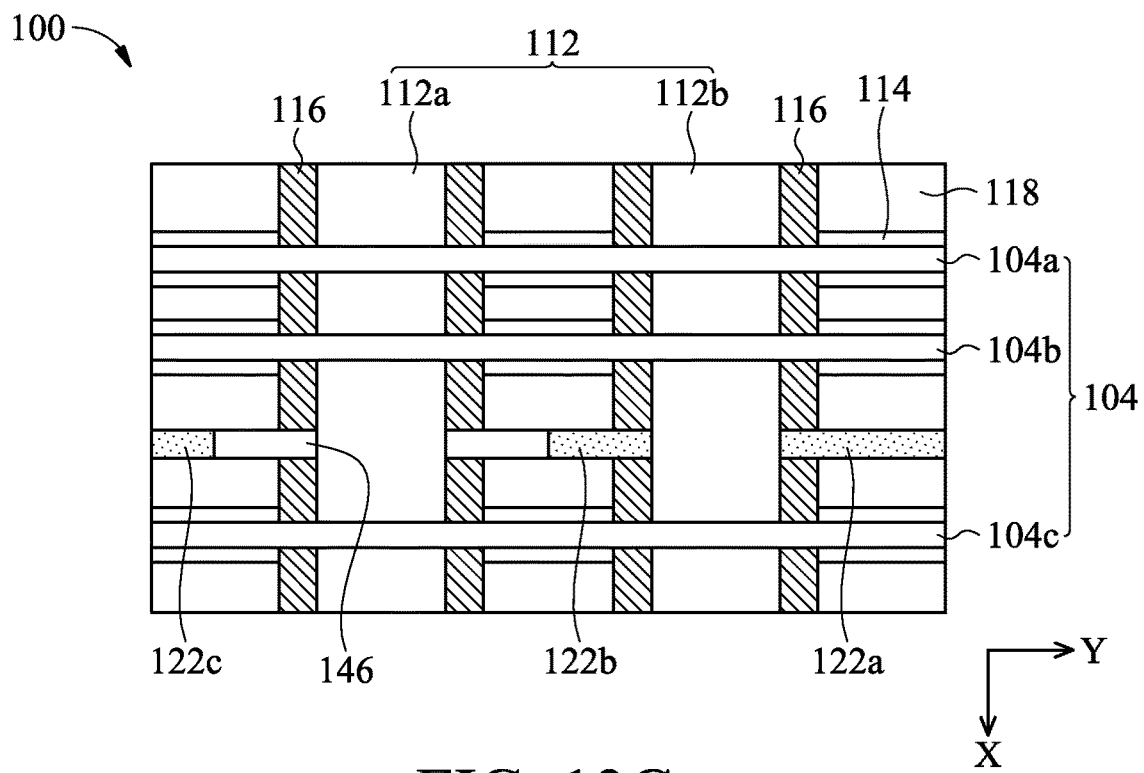
Figure 13D:
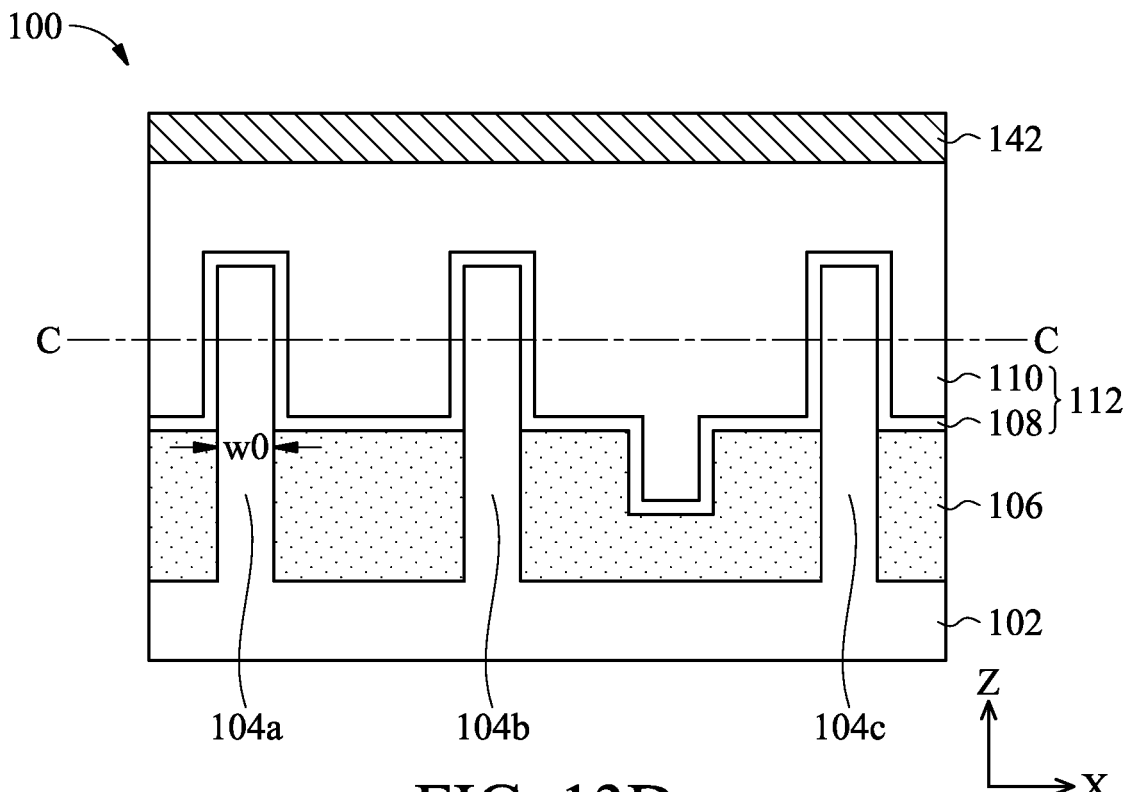
Figure 13E:
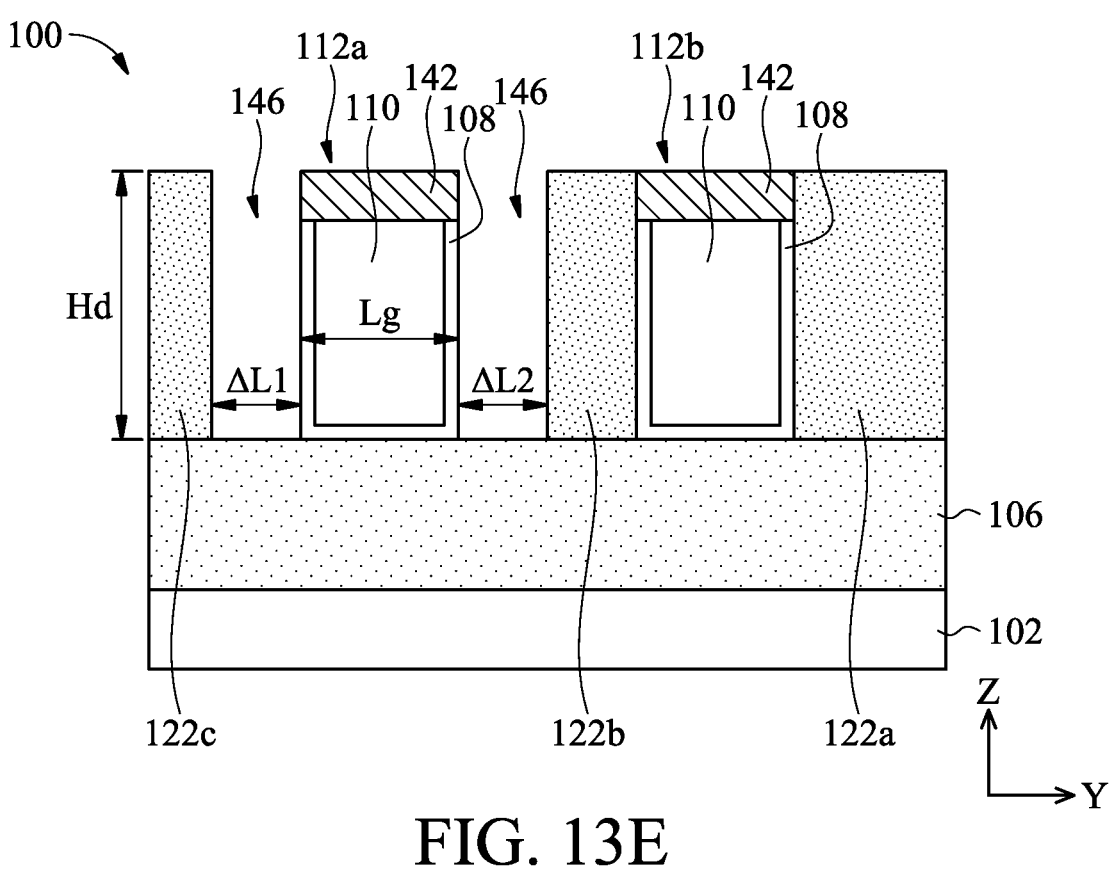
Figure 14A:
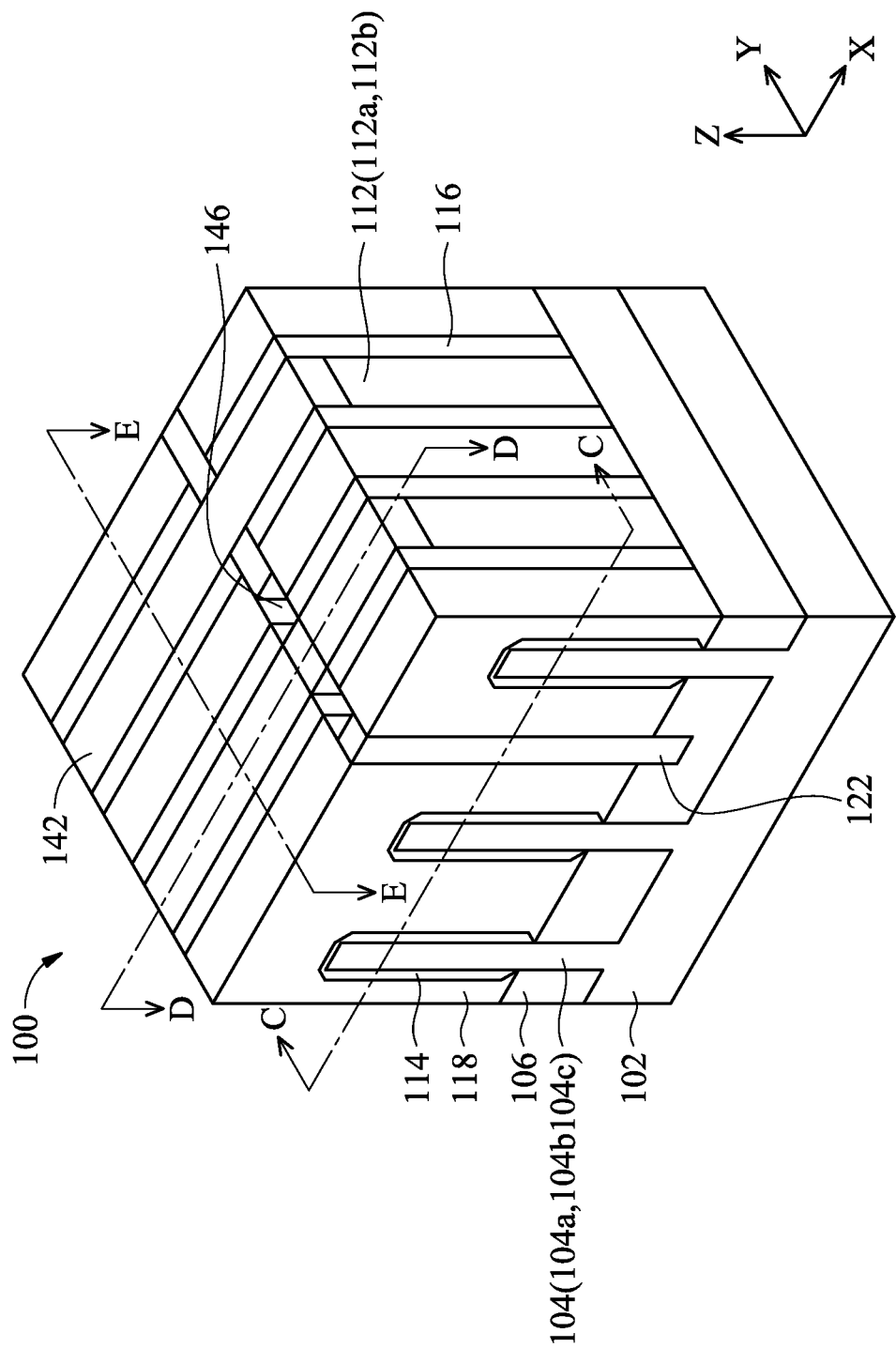
Figure 14B:
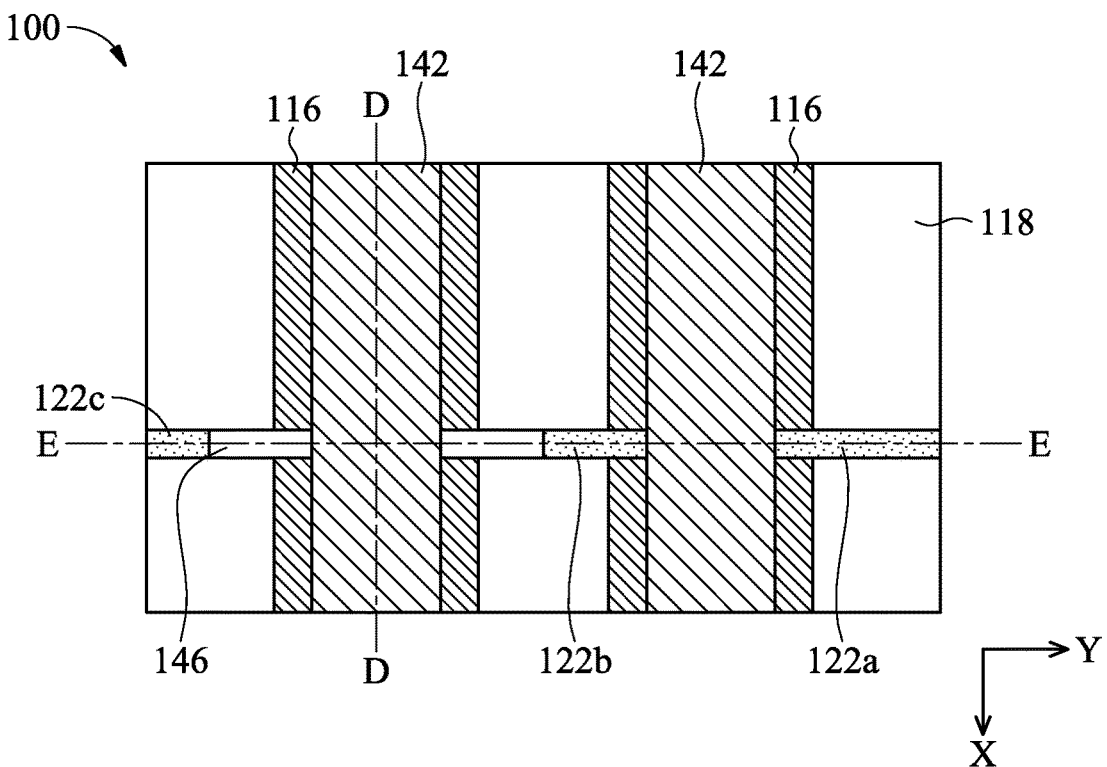
Figure 14C:
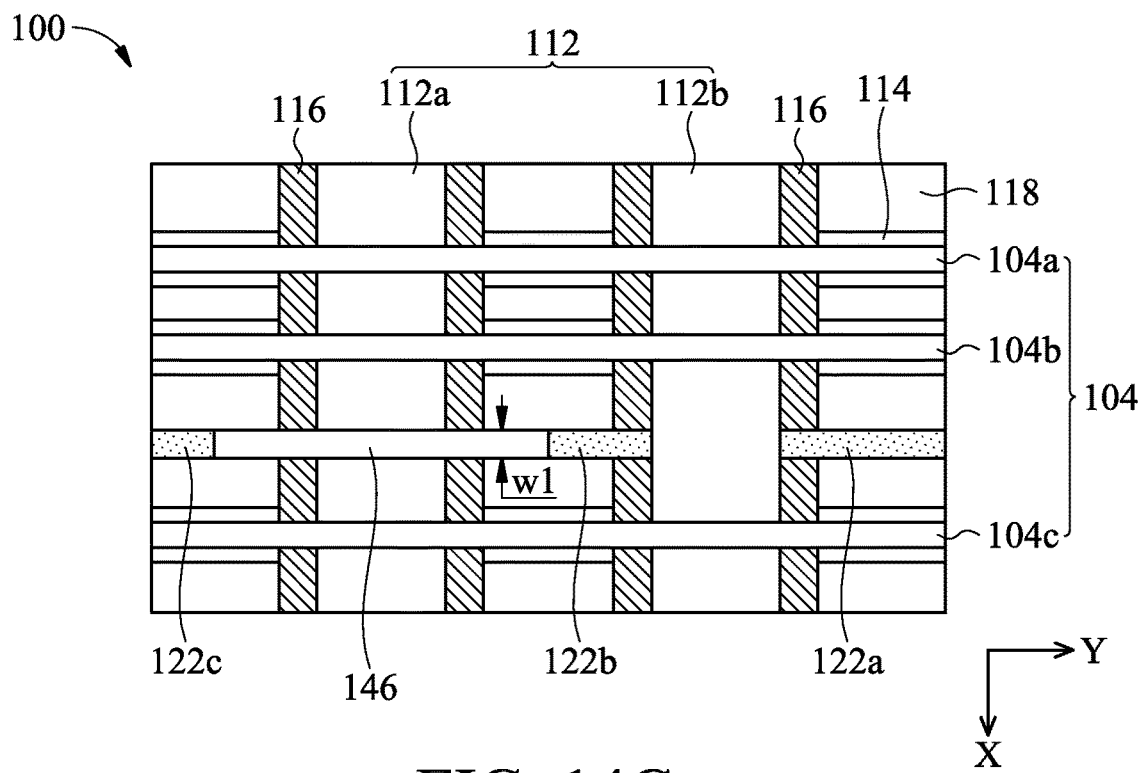
Figure 14D:
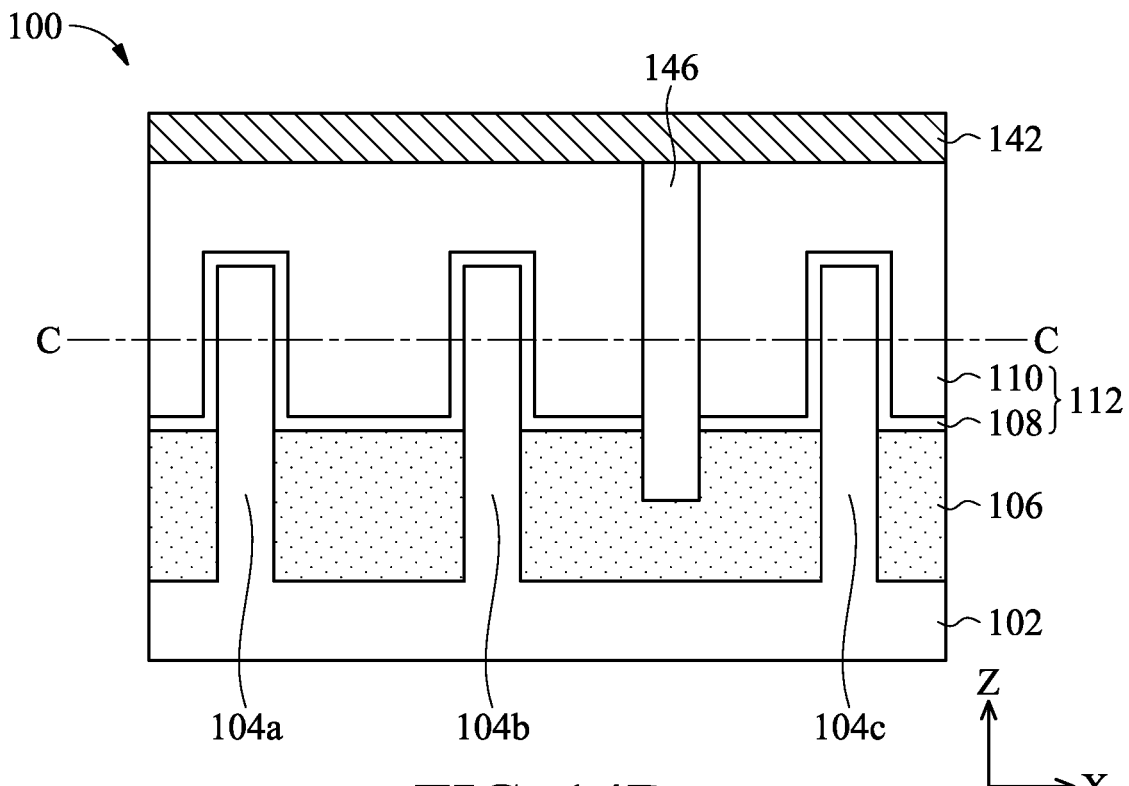
Figure 14E:
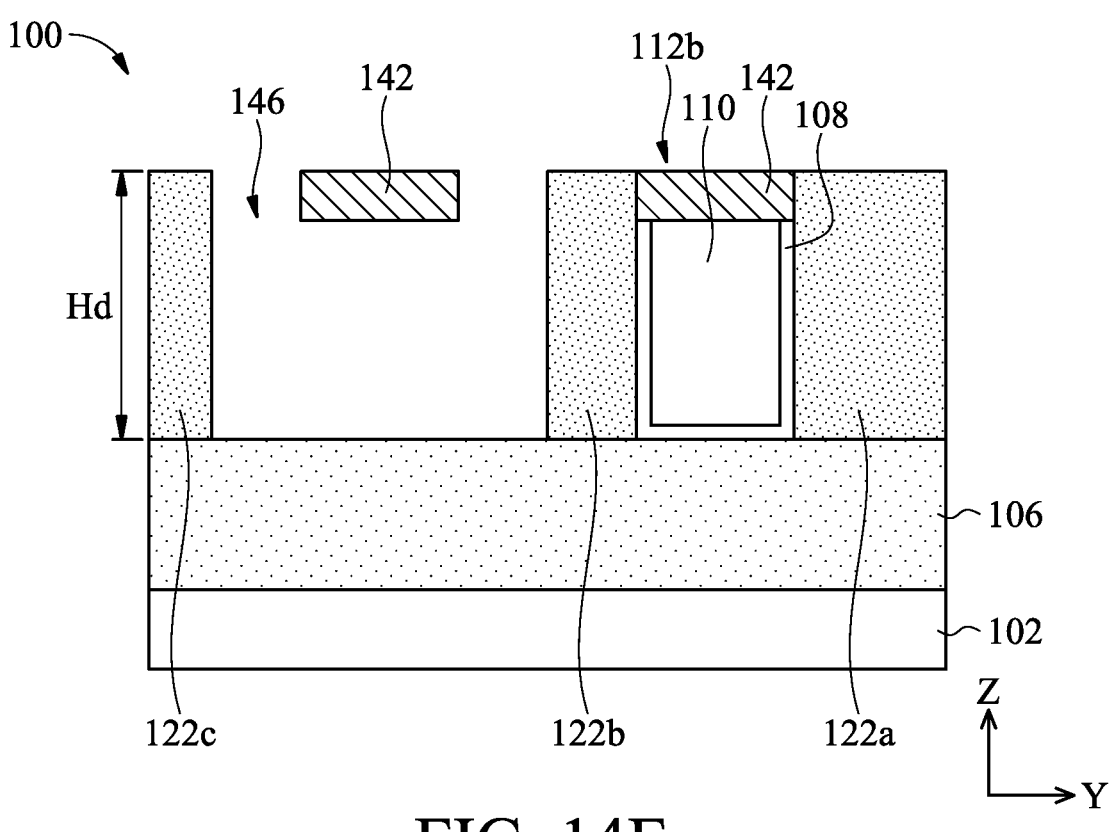

At operation 314, the method 300 (FIG. 3A) removes the dummy gates 128 to form gate trenches 140, such as shown in FIGS. 11A-11E, which are perspective view, top view, and cross-sectional views along the C-C, D-D, E-E lines of the device 100, respectively. The gate trenches 140 expose surfaces of the semiconductor fins 104 and sidewall surfaces of the gate spacers 116. The operation 314 also removes a portion of the dielectric fin 122 between the opposing sidewall surfaces of the gate spacers 116. In the illustrated embodiment, the dielectric fin 122 is divided by the gate trenches 140 into three segments, namely 122a, 122b, and 122c. The operation 314 may include one or more etching processes to form the gate trenches 140. The etching processes may include dry etching, wet etching, reactive ion etching, or other suitable etching methods. In one embodiment, operation 314 includes multiple etching steps with different etching chemistries, each targeting a particular material of the dummy gates 128 and the dielectric fin 122. In an example, the first etching step is a dry etching process or a wet etching process that is tuned to be selective to the electrode layer of the dummy gates 128 and does not substantially etch the semiconductor fins 104, the dielectric fin 122, the gate spacers 116, the isolation structure 106, and the ILD layer 118; the second etching step is an anisotropic etching, such as anisotropic dry etching, reactive ion etching, or plasma etching, that is tuned to be selective to the dielectric fin 122 and does not substantially etch the semiconductor fins 104, the gate spacers 116, and the ILD layer 118. The anisotropic etching has a downward etching directivity, which removes portions of the dielectric fin 122 between the opposing sidewall surfaces of the gate spacers 116 and does not substantially etch other portions of the dielectric fin 122 directly under the gate spacers 116 and the ILD layer 118. In an alternative embodiment, operation 314 uses an etching chemistry that is selective to both the material of the dummy gates 128 and the dielectric fin 122. In an example, the etching process is an anisotropic etching process using a fluorine-based etchant (e.g., $CF_4$, $CHF_3$, $CH_2F_2$, etc.). The anisotropic etching process selectively etches the dummy gates 128 and portions of the dielectric fin 122 between the sidewall surfaces of the gate spacers 116 together. Other portions of the dielectric fin 122 directly under the gate spacers 116 and the ILD layer 118 substantially remains. A bottom portion of the dielectric fin 122 surrounded by the isolation structure 106 which is under the trenches 140 is also removed at operation 314 (FIG. 11D).

At operation 316, the method 300 (FIG. 3B) deposits gate stacks 112 (e.g., 112a and 112b) in the gate trenches 140, such as shown in FIGS. 12A-12E, which are perspective view, top view, and cross-sectional views along the C-C, D-D, E-E lines of the device 100, respectively. In the illustrated embodiment, the gate stacks 112 are high-k metal gates. The gate stacks 112 include the high-k dielectric layer 108 and the conductive layer 110. The gate stacks 112 may further include an interfacial layer (e.g., $SiO_2$) (not shown) between the high-k dielectric layer 108 and the semiconductor fins 104. The interfacial layer may be formed using chemical oxidation, thermal oxidation, atomic layer deposition (ALD), chemical vapor deposition (CVD), and/or other suitable methods. The materials of the high-k dielectric layer 108 and the conductive layer 110 have been discussed above with reference to FIGS. 1A-1E. The high-k dielectric layer 108 may include one or more layers of high-k dielectric material, and may be deposited using CVD, ALD and/or other suitable methods. The conductive layer 110 may include one or more work function metal layers and a metal fill layer, and may be deposited using methods such as CVD, PVD, plating, and/or other suitable processes.

At operation 317, the method 300 (FIG. 3B) fills a top portion of the gate trenches 140 with a dielectric material 142, atop the gate stacks 112. The dielectric material 142 is selected such that the dielectric fin 122 and the dielectric material 142 have a high etch selectivity. In some embodiments, the etch selectivity between the dielectric fin 122 and the dielectric material 142 has a ratio larger than about 5:1, such as ranging from about 5:1 to about 20:1. The dielectric material 142 caps the high-k metal gates 112 between sidewall surfaces of the gate spacers 116. Therefore, the dielectric material 142 is also referred to as the capping layer 142. As will be explained in further details below, the capping layer 142 protects top surfaces of the gate stacks 112 from etch loss and limits metal gate etch to take place from sidewalls of the gate stacks 112 in subsequent cut metal gate steps. Suitable materials for the capping layer 142 include silicon nitrides, silicon carbides, silicon oxycarbide, high-k dielectric materials, polymer-like resin, and/or other suitable dielectric materials. In one embodiment, the capping layer 142 includes titanium nitride. In another embodiment, the capping layer 142 includes zirconium oxide. In yet another embodiment, the capping layer 142 includes hafnium oxide. To form the capping layer 142, top surfaces of the gate stacks 112 may first be recessed to a position below top surfaces of the gate spacers 116. The dielectric material of the capping layer 142 is subsequently deposited above the gate stacks 112 and fills spaces between sidewall surfaces of the gate spacers 116. The capping layer 142 may be deposited by any suitable technique including CVD, HDP-CVD, PVD, and/or spin-on techniques. Following the deposition, a CMP process may be performed to remove the excess dielectric material and expose a top surface of the dielectric fin 122.

At operation 318, the method 300 (FIG. 3B) etches portions of the dielectric fin 122 (particularly, segments 122b and 122c) in contact with both sidewalls of the gate stack 112a to form a cut metal gate (CMG) trench 146. The CMG trench 146 exposes portions of the sidewall surfaces on both sides of the gate stack 112a, such as shown in FIGS. 13A-13E, which are perspective view, top view, and cross-sectional views along the C-C, D-D, E-E lines of the device 100, respectively. Portions of the top surface of the isolation structure 106 are also exposed at the bottom of the CMG trench 146. In an example, operation 318 may form a patterned photoresist over the device 100 by photoresist coating, exposing, post-exposure baking, and developing. The patterned photoresist has an opening (denoted by dotted box 148) exposing portions of the dielectric fin segments 122b and 122c in contact with sidewalls of the gate stack 112a. In an example, the opening 148 exposes lengths of $\Delta L_1$ and $\Delta L_2$ of the dielectric fin segments 122a and 122b on each side of the gate stack 112a, respectively. Lengths $\Delta L_1$ and $\Delta L_2$ may be equal to or different from each other, such as each in a range from about 1 nm to about 10 nm. In some embodiments, the lengths $\Delta L_1$ and $\Delta L_2$ are selected such that an aspect ratio of the CMG trench 146 (defined as dielectric fin 122 height $H_d$ over $\Delta L_1$ or $\Delta L_2$) is less than about 25:1. As will be explained in further details below, an aspect ratio less than about 25:1 allows etchant used in subsequent cut metal gate steps to reach bottom of the CMG trench 146 more easily. In some embodiments, the aspect ratio ranges from about 15:1 to about 25:1. The total length of the opening 148 is calculated as $\Delta L_1+\Delta L_2+Lg$, where Lg is the metal gate length. In one example, the total length is about 10 nm to about 20 nm, such as 18 nm. Then, operation 318 etches the exposed portions of the dielectric fin segments 122a and 122b using the patterned photoresist as an etch mask to form the CMG trench 146. The etching process may include wet etching, dry etching, reactive ion etching, or other suitable etching methods. The etching process is tuned to be selective to the dielectric material of the dielectric fin 122 and does not substantially etch the capping layer 142, the gate stack 112a, the gate spacers 116, the isolation structure 106, and the ILD layer 118. Due to the etching selectivity, even if the opening 148 shifts several nanometers in the x or y directions and exposes extra top surfaces of the device 100, still only portions of the dielectric fin segments 122b and 122c would be etched. Thus, the positions of the CMG trench 146 is not sensitive to the positions of the opening 148. This self-alignment technique increases the tolerance of the photolithographic process and subsequent cut metal gate steps against misalignment and overlay problems. The patterned photoresist is removed thereafter, for example, by resist stripping.

At operation 320, the method 300 (FIG. 3B) etches the gate stack 112a through the CMG trench 146. The capping layer 142 limits the etching to take place only from sidewalls of the gate stack 112a exposed in the CMG trench 146. Referring to FIGS. 14A-14E, which are perspective view, top view, and cross-sectional views along the C-C, D-D, E-E lines of the device 100, respectively, operation 320 extends the CMG trench 146 laterally through the gate stack 112a and cut it into two parts. The CMG trench 146 may have an aspect ratio less than 25:1, such that etchant(s) may more easily reach bottom of the CMG trench 146. Thus, operation 320 also removes bottom portions of the gate stack 112a embedded in the isolation structure 106. The etching process may use one or more etchants or a mixture of etchants that etch the various layers in the gate stack 112a.

In an exemplary embodiment, the conductive layer 110 includes TiSiN, TaN, TiN, W, or a combination thereof. To etch such a conductive layer and the high-k dielectric layer 108, the operation 320 may apply a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$. In one example, the gate structure includes tungsten (W) and the etchant may have a gas mixture containing CxFy where x:y is greater than 1:4. In another example, the etchant is a plasma containing HBr. The above discussed etchant and the etching process may be applied to various materials suitable for the conductive layer 110 and the high-k dielectric 108, not limited to the exemplary materials TiSiN, TaN, TiN, and W discussed above. Still further, operation 320 may also control the etching bias voltage, RF power, and gas pressure of the etchant to tune the etching directivity. A higher etching bias voltage, higher RF power, and/or higher gas pressure tends to modulate the etchant to exhibit stronger lateral etching capability. In one embodiment, the etching process is an anisotropic etching with etching directivity along the y direction. the etchant may be a plasma containing HBr.

Operation 320 may be performed with parameters such as a HBr flow rate between about 500 and about 1000 sccm, a gas pressure between about 60 and about 90 mtorr, an RF power between about 1000 W and about 2000 W, and a bias voltage between about 200 V and about 500 V. Various other values of etching bias voltage, etching pressure, etching energy, and etching temperature are possible. The etchant therefore exhibits certain lateral etch rate toward the exposed sidewalls of the gate stack 112a and subsequently etches through the gate stack 112a in the y direction. This etching process is also referred to as an anisotropic lateral etching process. The CMG trench 146 extends through the gate stack 112a with substantially the same width $W_1$ along the y direction. The width $W_1$ is also approximately the same width of the dielectric fin 122, ranging from about 3 nm to about 5 nm, such as about 4 nm. The etching process is also a selective etching that does not substantially damage the dielectric fin 122, the isolations structure 106, the ILD layer 118, and the gate spacers 116. The capping layer 142 also remains and protects other portions of the gate stack 112a and also the gate stack 112b from etching.

Figure 15A:
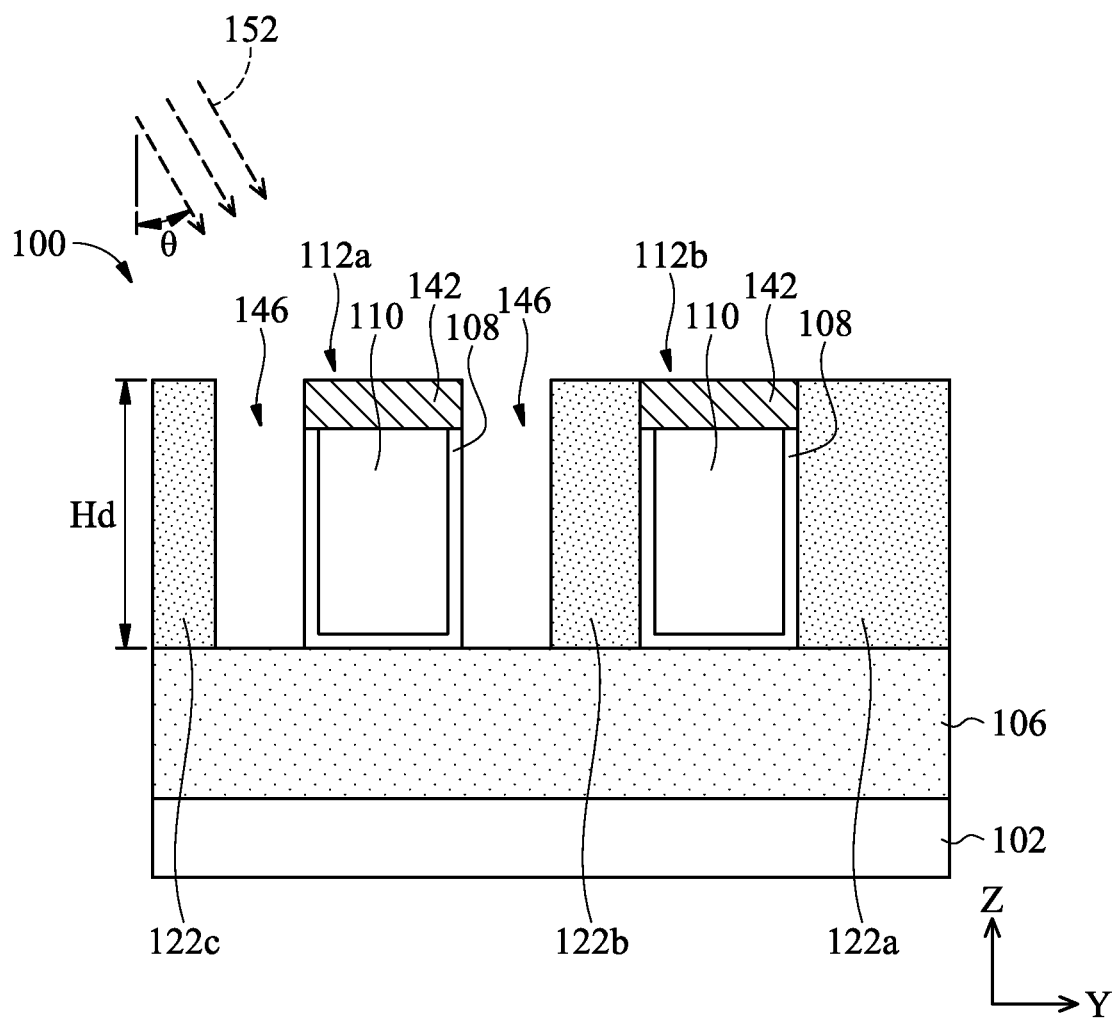
Figure 15B:
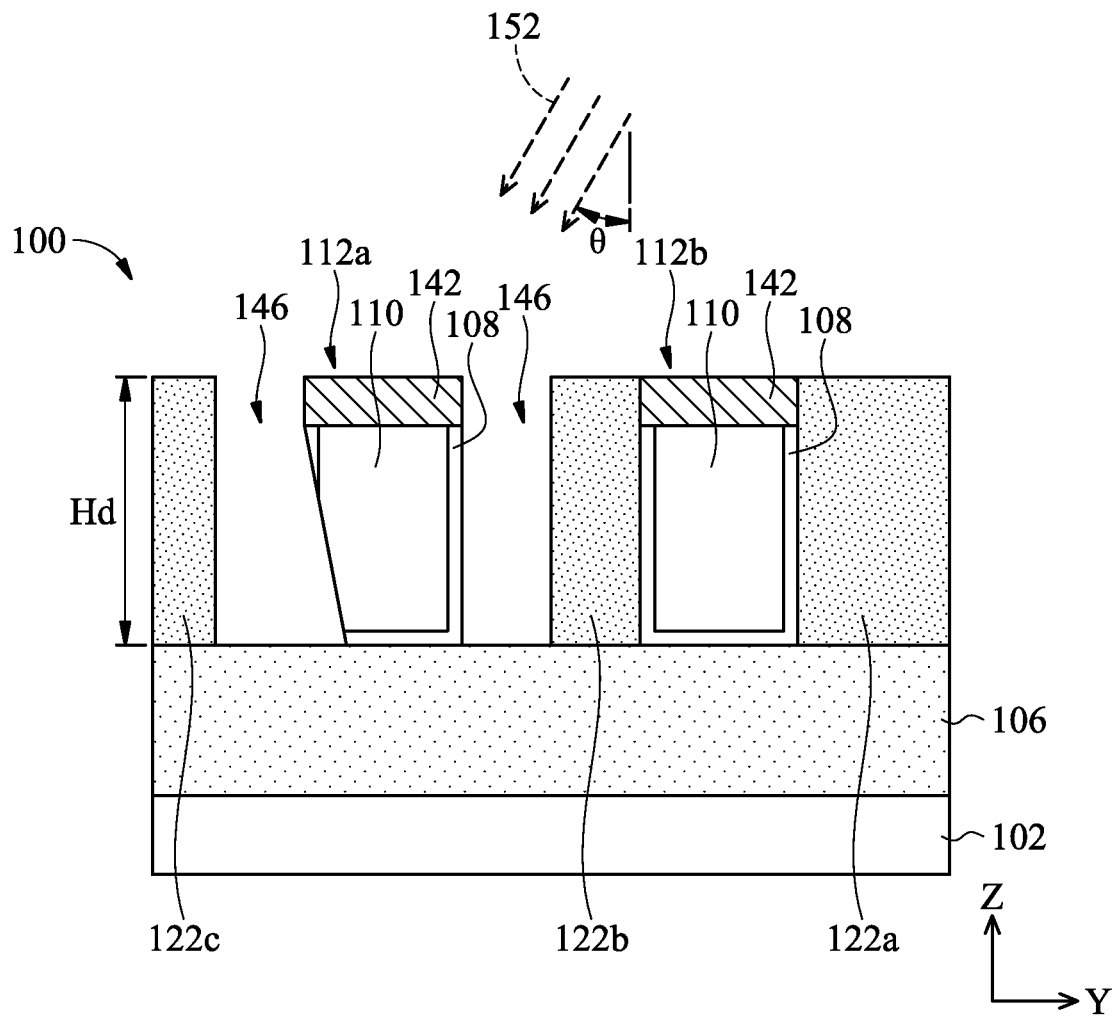

In another exemplary embodiment, operation 320 may include a slanted plasma etching process that is biased toward the y direction prior to applying the anisotropic lateral etching as described above. A slanted plasma etching is helpful to widen the bottom of the CMG trench 146 and effectively reduce the aspect ratio of the CMG trench 146. A lower aspect ratio facilitates the etchant used in the subsequent anisotropic lateral etching to reach the bottom of the CMG trench 146. Referring to FIGS. 15A and 15B collectively, which are cross-sectional views of the device 100 along the E-E line of FIG. 13A, the slanted plasma etching 152 may include a first slanted etching towards a first sidewall of the gate stack 112 (FIG. 15A) and a second slanted etching towards a second sidewall of the gate stack 112 (FIG. 15B). In one embodiment, the slanted plasma etching 152 may apply the first slanted etching (FIG. 15A) and the second slanted etching (FIG. 15B) at the same time. Each slanted etching is titled away by an angle θ from the normal to the top surface of the substrate 102. A specific angle θ may be chosen based on an actual aspect ratio of CMG trench 146. In many embodiments, the angle θ may range from about 5 degrees to about 15 degrees with respect to the Z direction, such as about 10 degrees. In some examples, if the angle θ is larger than about 15 degrees, the bottom of the gate stack 112a would not be etched due to shadow effect. In some examples, if the angle θ is smaller than about 5 degrees, the bottom of the gate stack 112a would not be widen enough to effectively lower the aspect ratio of the CMG trench 146. The slanted plasma etching 152 may use argon ions in an embodiment. Alternatively, the slanted plasma etching 152 may use helium, silane, methane, oxygen, nitrogen, carbon dioxide, or combinations thereof.

Figure 16A:
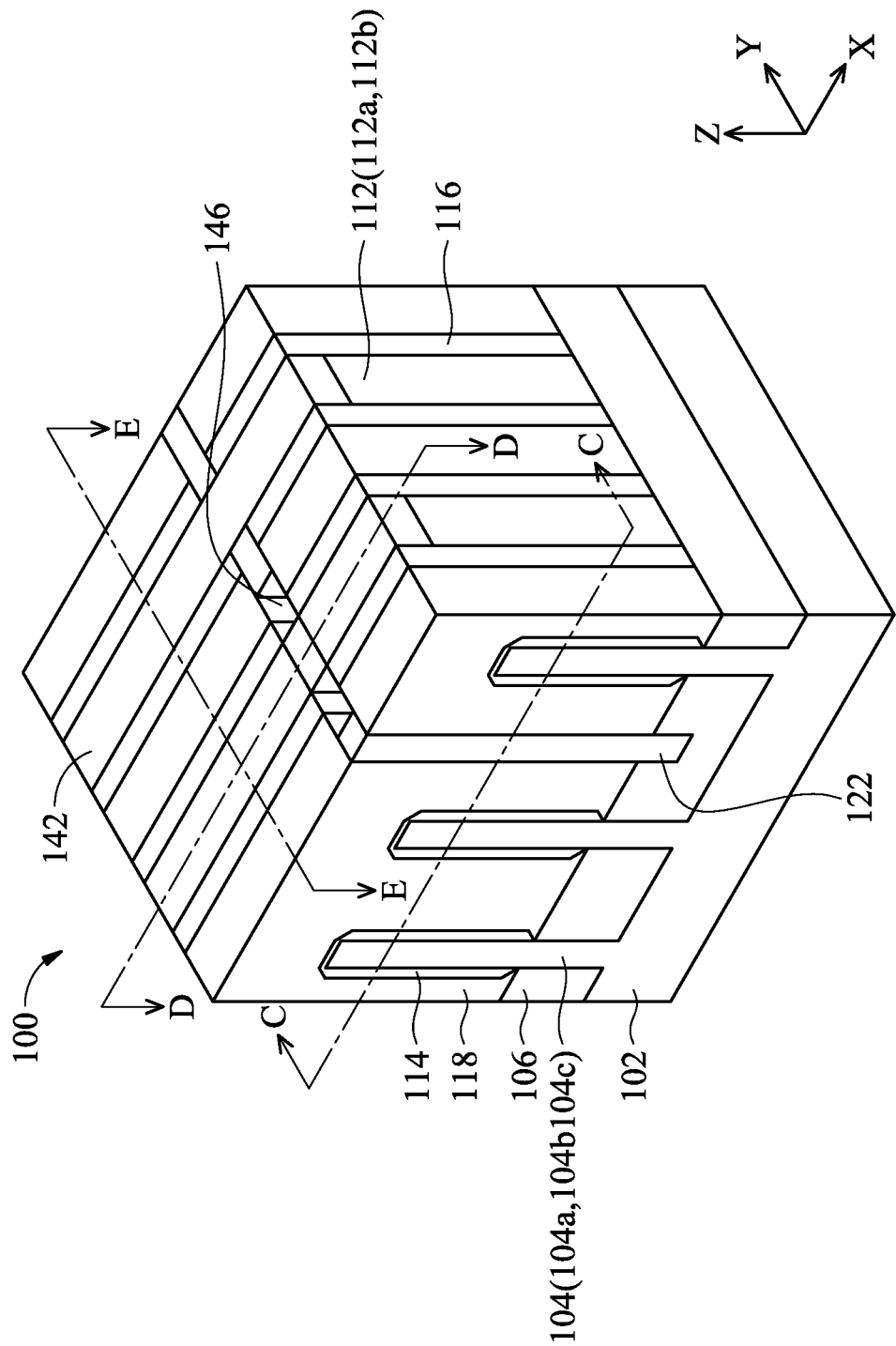
Figure 16B:
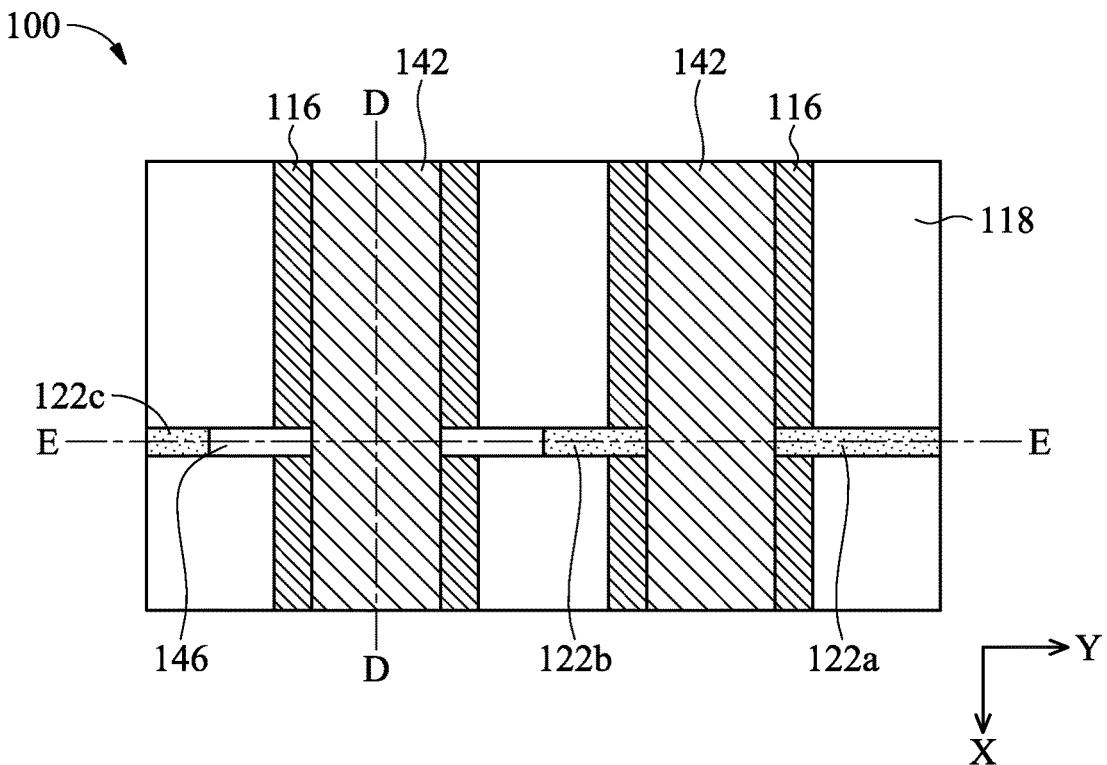
Figure 16C:
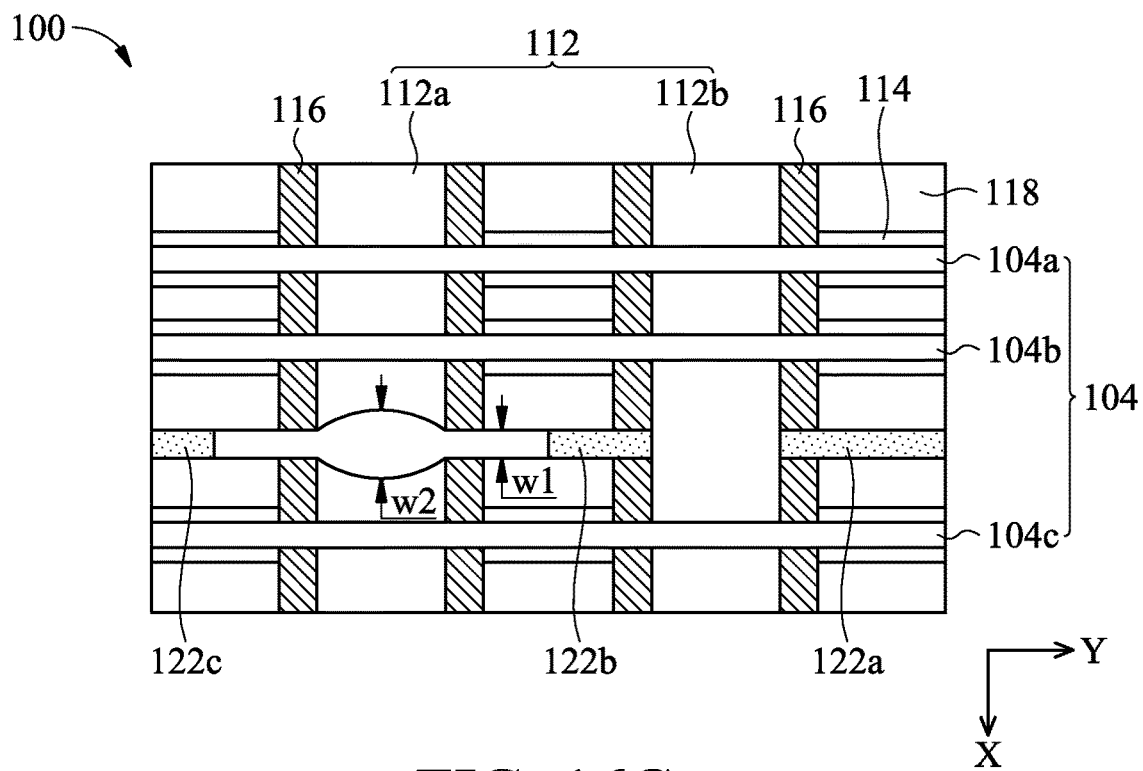
Figure 16D:
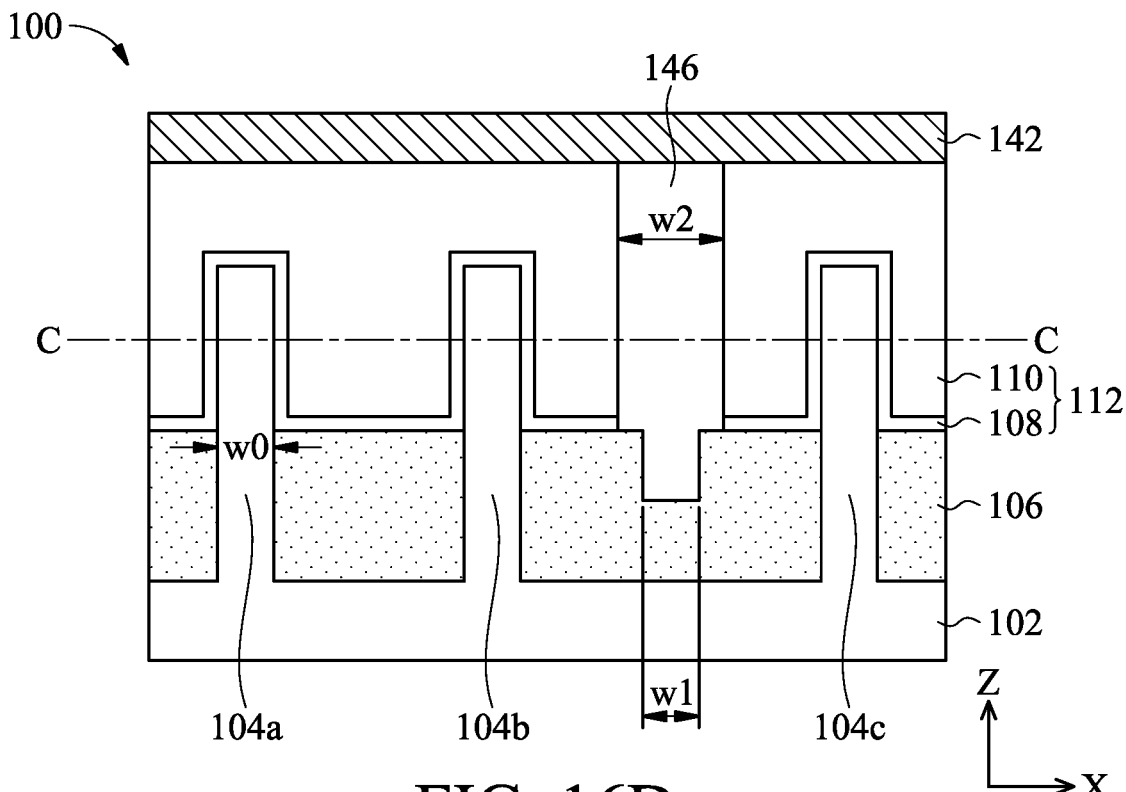
Figure 16E:
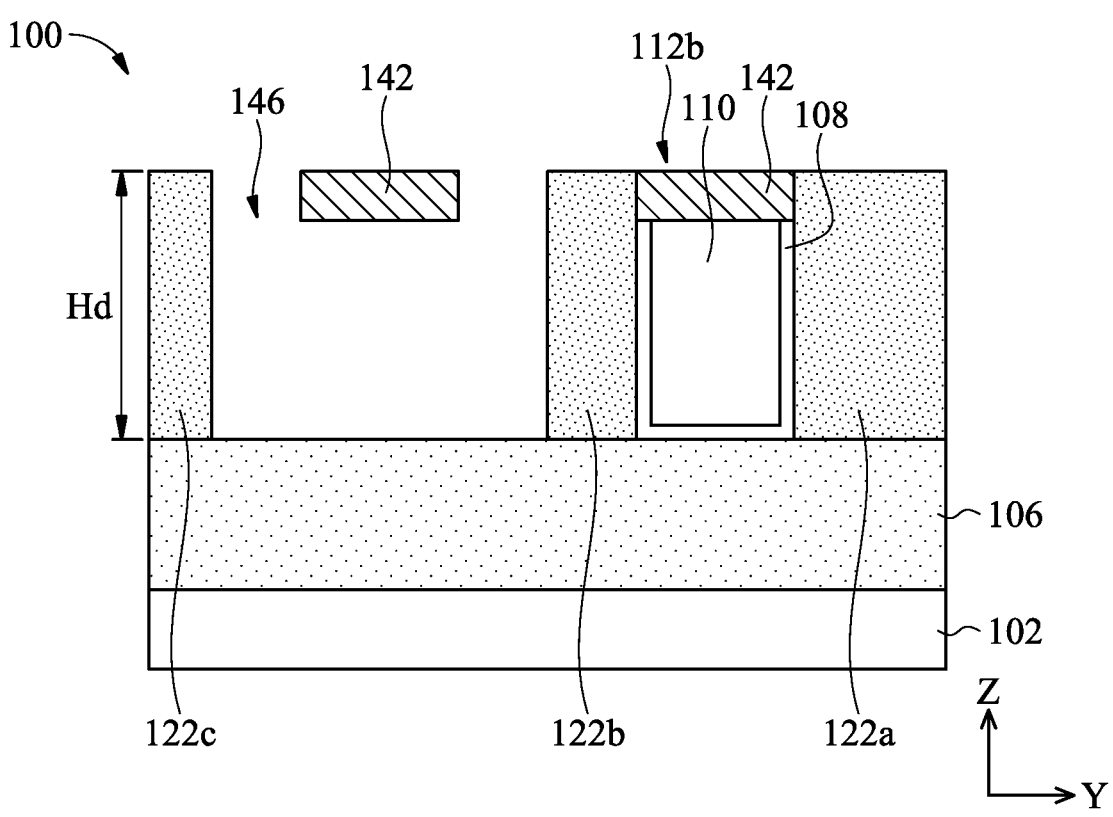
Figure 17A:
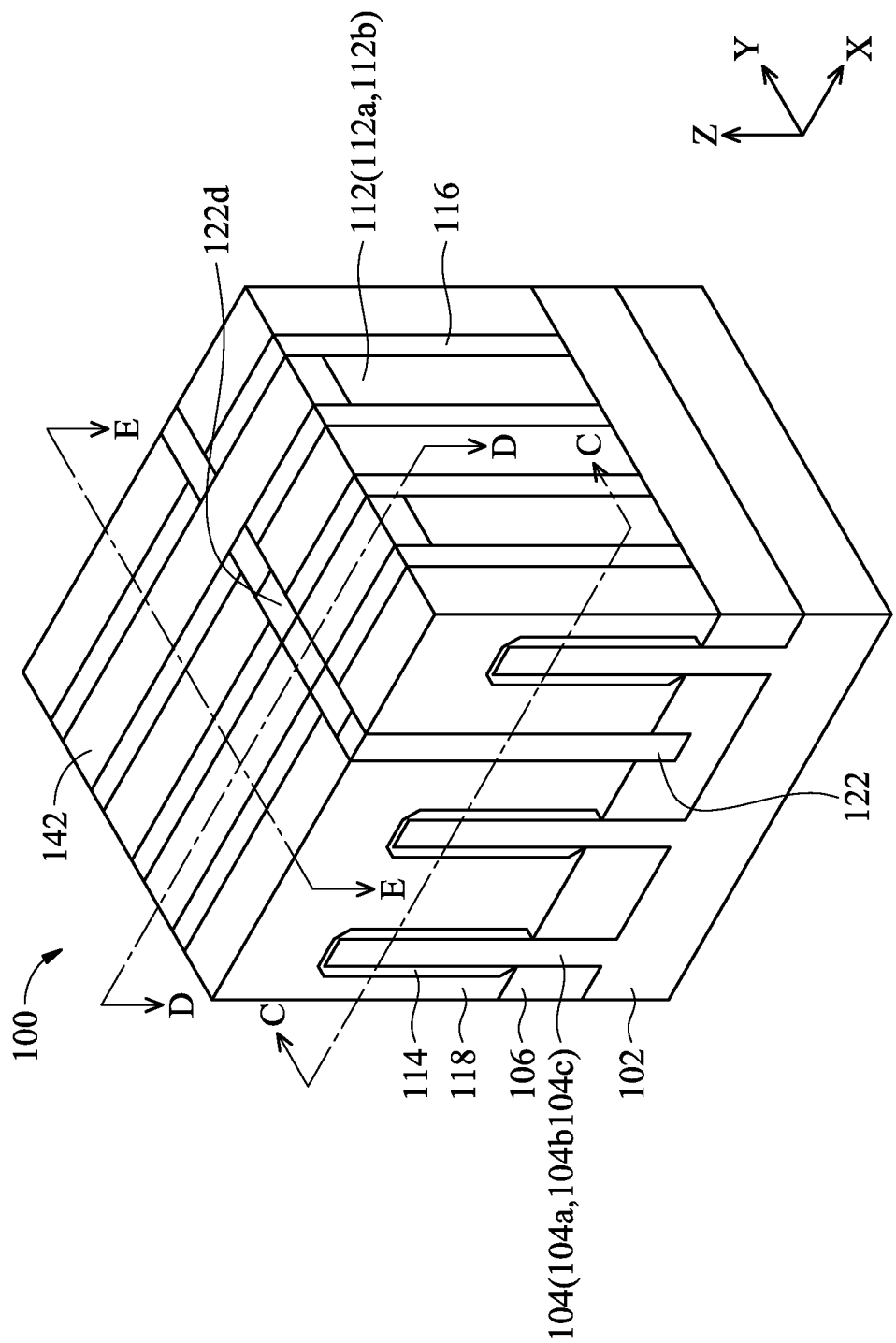
Figure 17B:
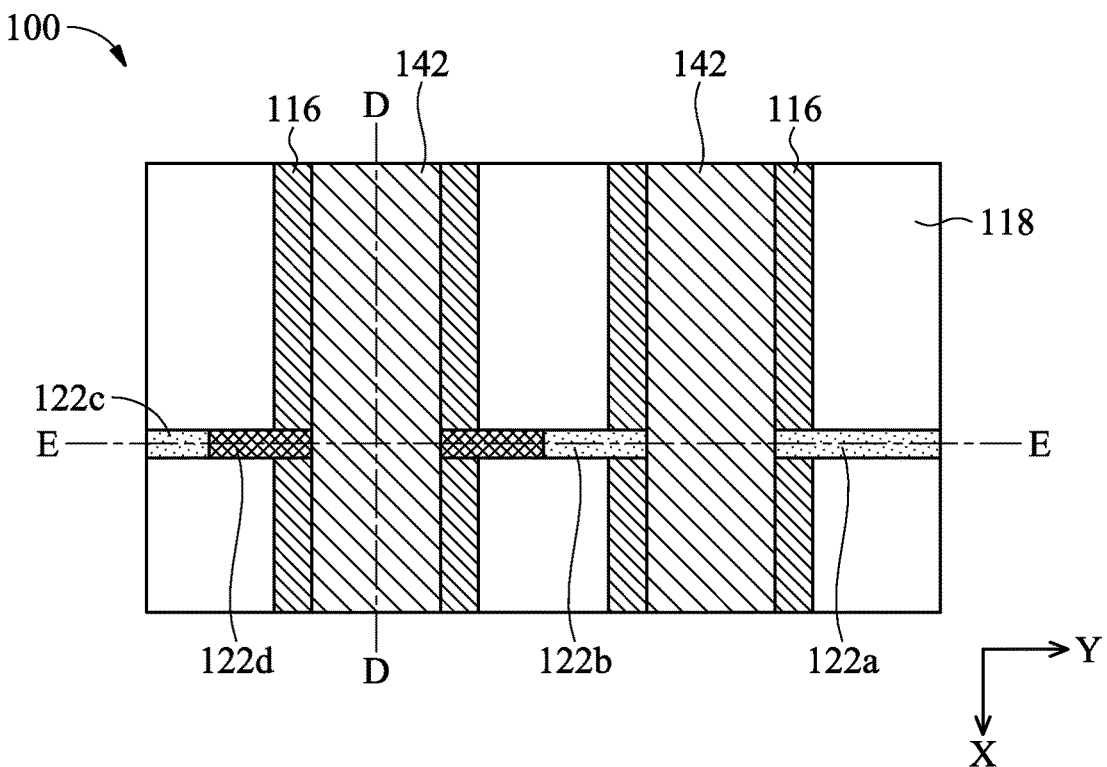
Figure 17C:
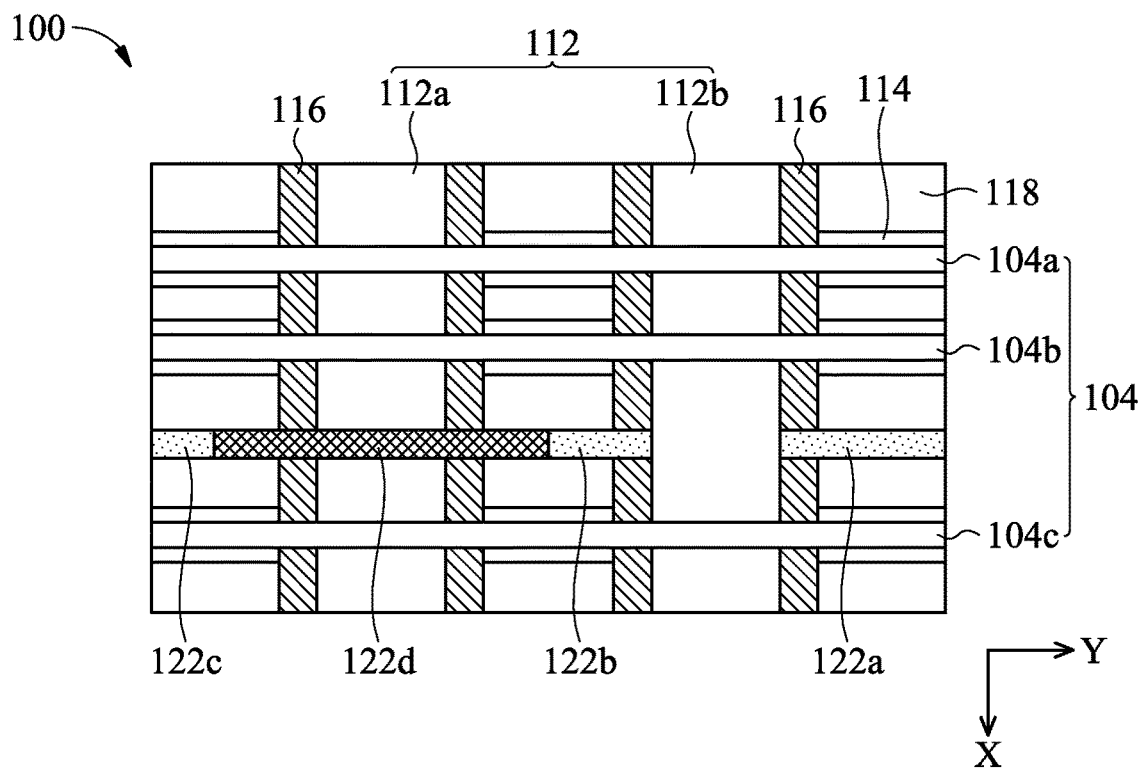
Figure 17D:
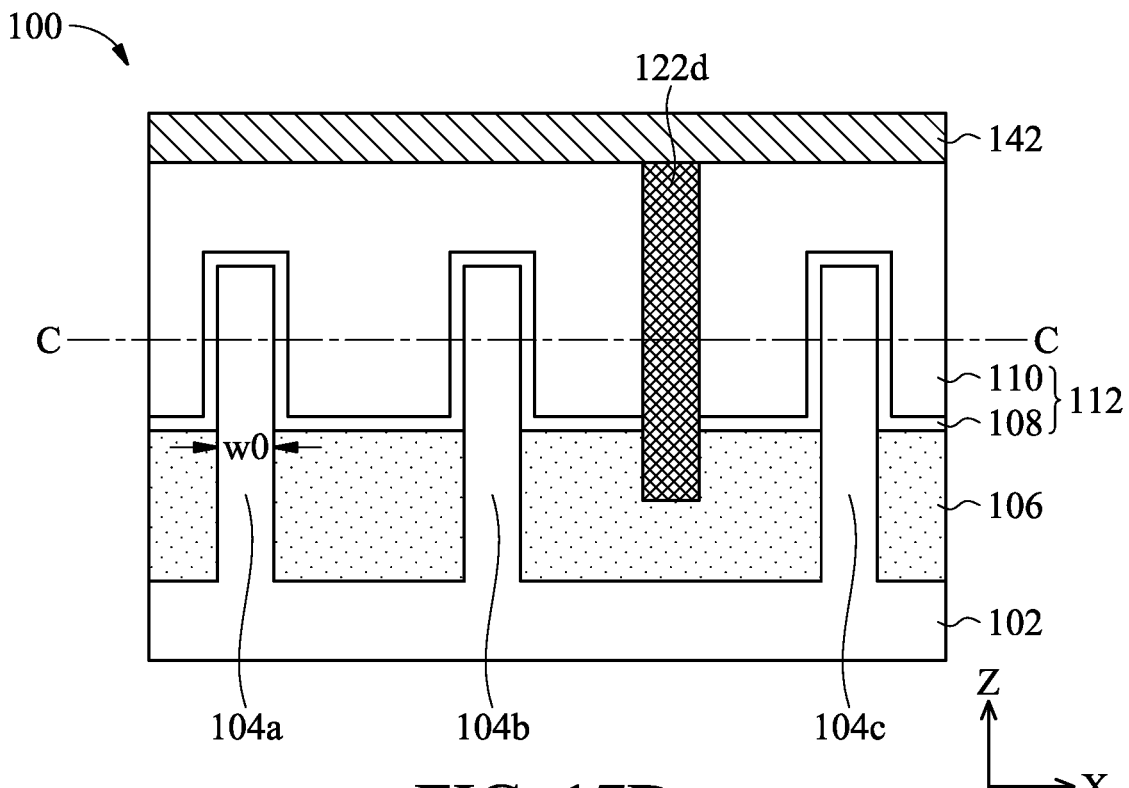
Figure 17E:
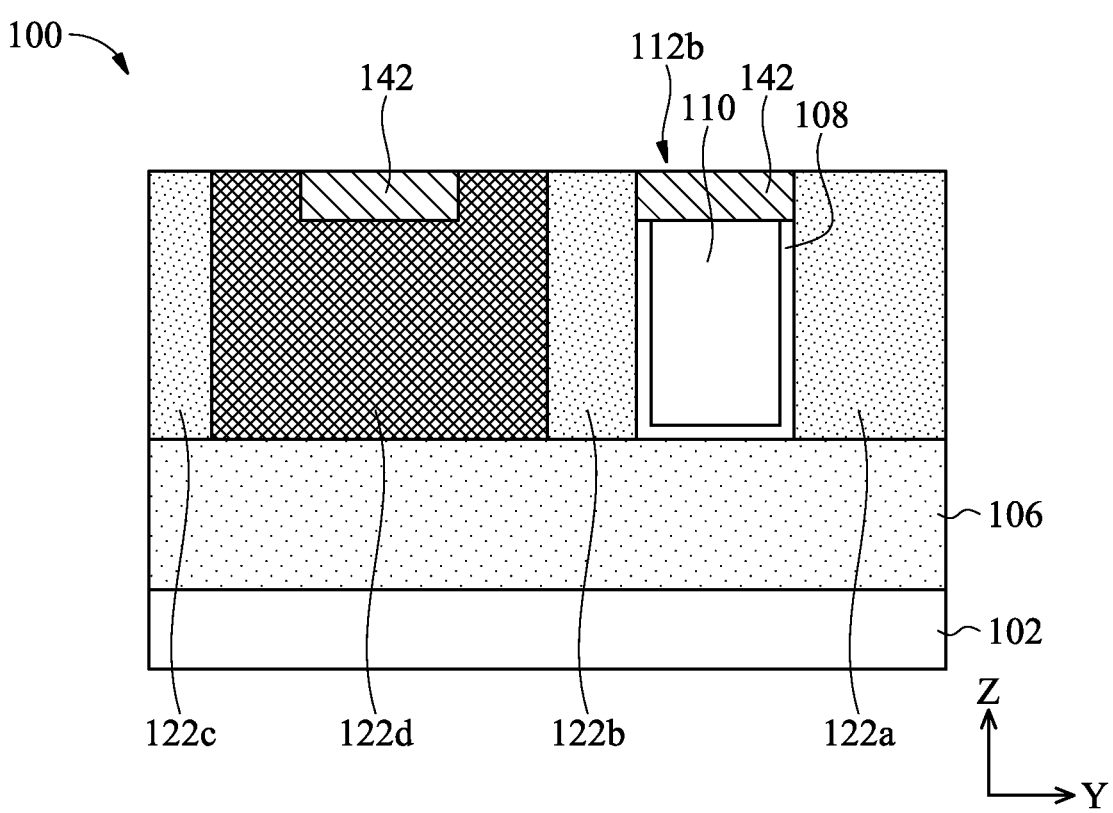
Figure 18A:
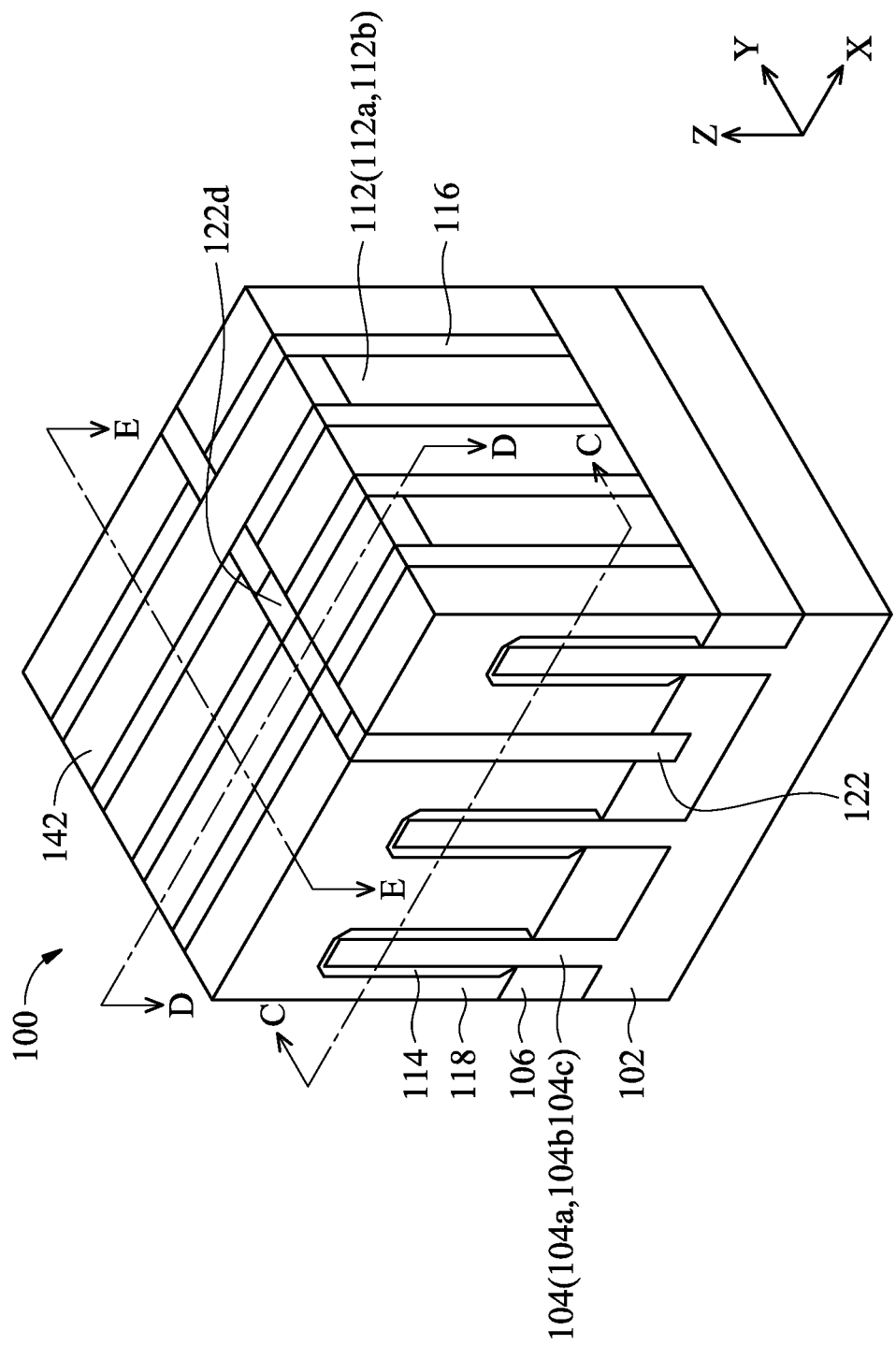
Figure 18B:
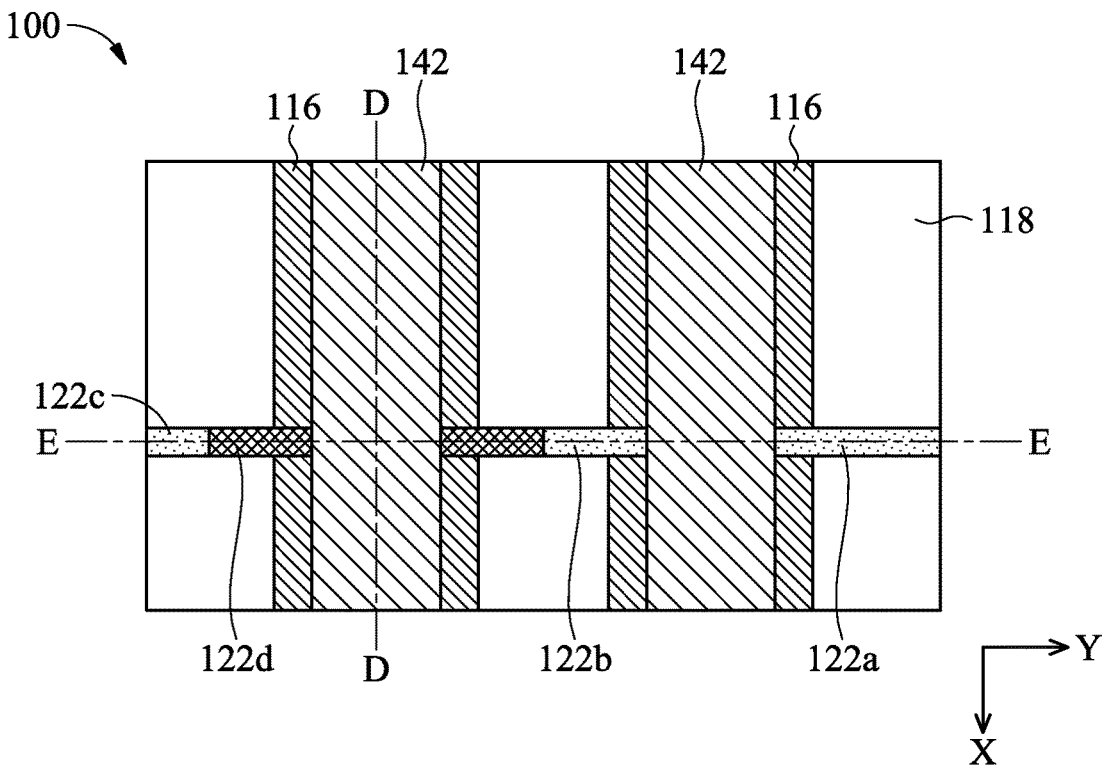
Figure 18C:
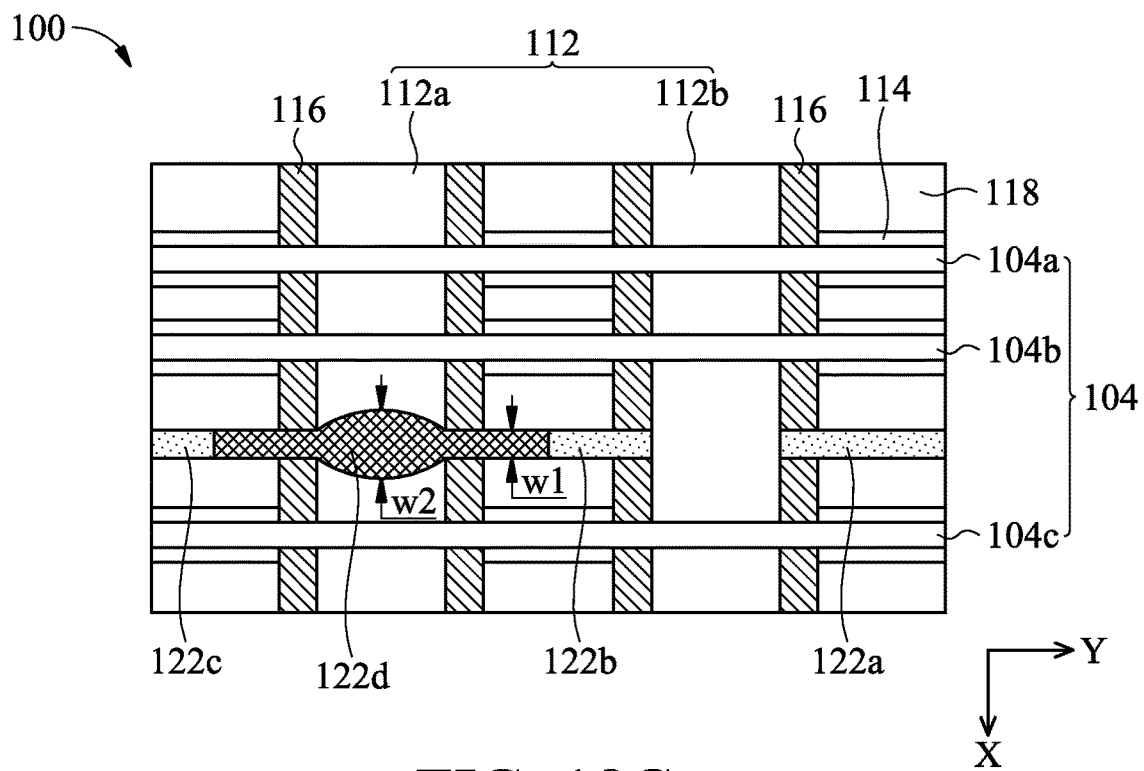
Figure 18D:
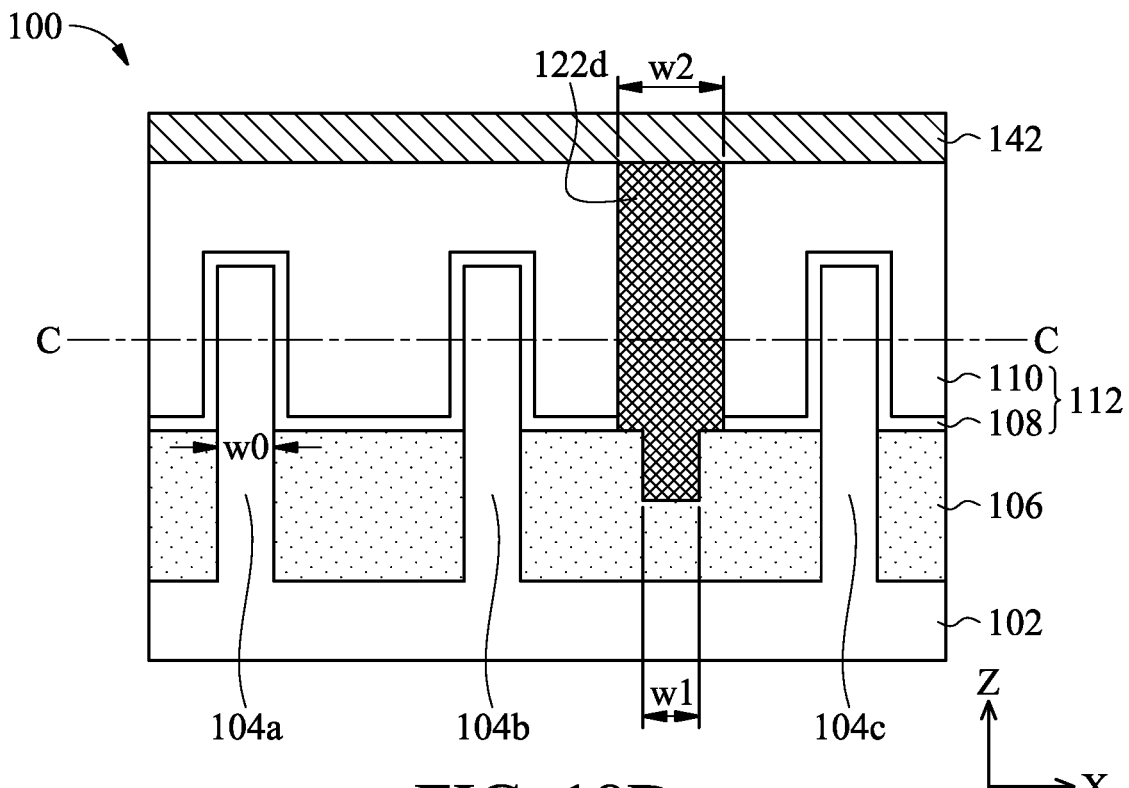
Figure 18E:
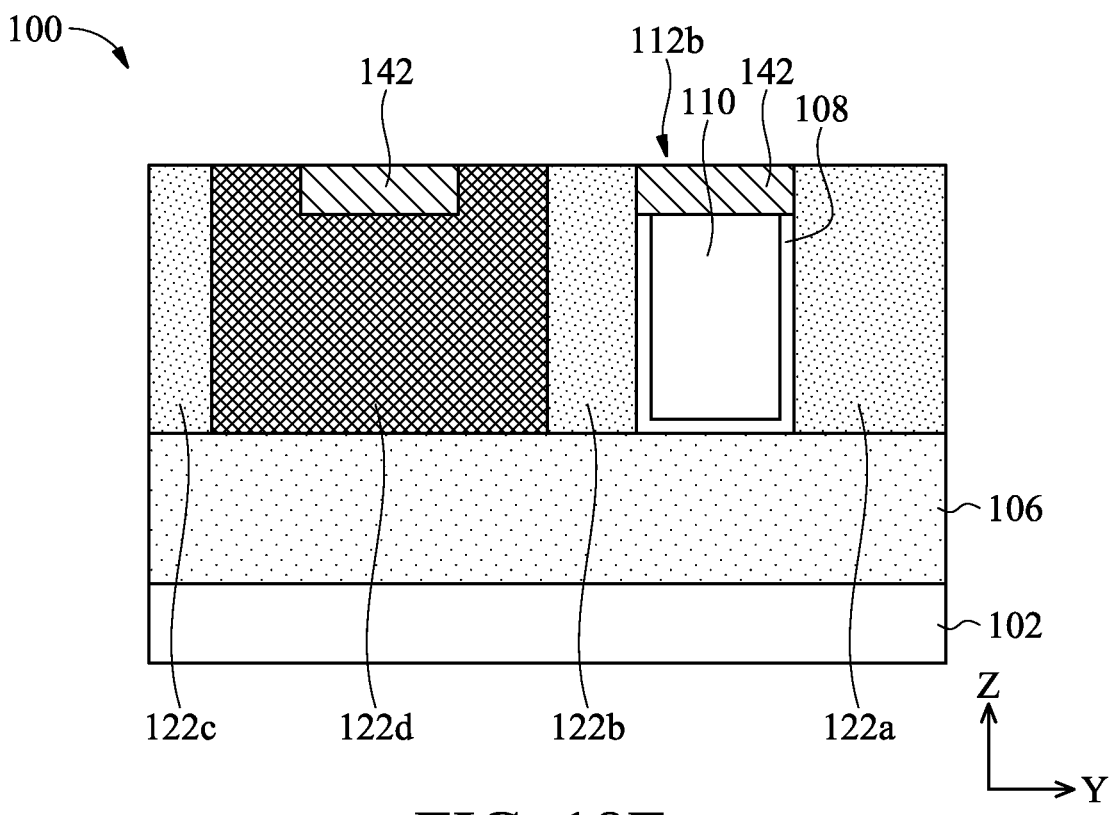

In yet another exemplary embodiment, operation 320 may apply an isotropic etching process to etch through the gate stack 112a. Similar to the anisotropic etching process discussed above, the isotropic etching process may follow a prior slanted plasma etching process which widens the bottom of the CMG trench 146 first. Referring to FIGS. 16A-16E, which are perspective view, top view, and cross-sectional views along the C-C, D-D, E-E lines of the device 100, respectively, operation 320 extends the CMG trench 146 laterally through the gate stack 112a and cut it into two parts in the isotropic etching process. In some embodiments, the isotropic etching process is a wet etching process that may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchant. Besides etching through the gate stack 112a along the y direction, the isotropic etching also etches into the gate stack 112a along the x direction. Therefore, after operation 320, the CMG trench 146 has a curvature portion in the middle which expands into the gate stack 112a (FIG. 16C). The curvature portion has a width $W_2$, which is about 2 nm to about 6 nm larger than the width $W_1$ of other portions of the CMG trench 146 in some embodiments. Directly under the curvature portion, the bottom portion of the CMG trench 146 still has the width $W_1$ (FIG. 16D) due to the etch resistance of the isolation structure 106 in the isotropic etching process.

At operation 322, the method 300 (FIG. 3B) fills the CMG trench 146 with one or more dielectric materials to form a middle segment (denoted as 122d) of the dielectric fin 122 that connects the segments 122b and 122c of the dielectric fin 122. Referring to FIGS. 17A-17E, the dielectric fin 122 can be regarded as divided by the gate stack 112b into two parts, where segment 122a lays on one side of the gate stack 112b and segments 122b, 122c, 122d extends continuously on the other side of the gate stack 112b. Furthermore, the dielectric fin 122 separates the gate stacks 1222a into two portions; and the segment 122d is sandwiched by the separated portions of the metal gate. Since the gate stack 112a contains metallic materials, the segment 122d is free of active chemical components, such as oxygen. In the illustrated embodiment, the segment 122d includes silicon nitride and is free of oxygen or oxide. It is noted that, since the high-k dielectric layer 108 includes oxygen, some oxygen content may eventually diffuse into some portions of the segment 122d. However, such diffused oxygen is generally limited to the lower portions of the segment 122d. The segment 122d may include some oxide in the inner portion thereof in some embodiments. In some embodiments, the segment 122d includes different dielectric material with that of the segments 122b and 122c. Alternatively, the segment 122d may include the same dielectric material with the segments 122b and 122c, forming one uniform dielectric material fin on the other side of the gate stack 112b. The dielectric layer 114 may be deposited using CVD, PVD, ALD, or other suitable methods. In the present embodiment, the segment 122d is deposited using ALD to ensure that it completely fills the CMG trench 146. During operation 322, the capping layer 142 remains covering top surfaces of the gate stacks 112a and 112b, protecting the gate stacks from contamination or oxidation while filling in the segment 122d. FIGS. 18A-18D illustrate the device 100 in an alternative embodiment, where the CMG trench 146 has a curvature middle portion (FIG. 16C) and the resulting segment 122d of the dielectric fin 122 also inherits a curvature middle portion.

At operation 324, the method 300 (FIG. 3B) performs one or more CMP processes to remove excessive dielectric material (the portion outside the CMG trench 146) and the capping layer 142. In an embodiment, the operation 324 may recess the conductive layer 110 (as well as the dielectric fin 122) to a desired HK MG height. The top surface of the segment 122d of the dielectric fin 122 is exposed after the one or more CMP processes. The resulting structure is similar to what has been shown in FIGS. 1A-2E.

At operation 326, the method 300 (FIG. 3B) performs further steps to complete the fabrication of the device 100. For example, the method 300 may form contacts and vias electrically connecting the S/D features 114 (FIG. 1A) and the gate stacks 112 and form metal interconnects connecting various transistors to form a complete IC.

Although not intended to be limiting, one or more embodiments of the present disclosure provide many benefits to a semiconductor device and the formation thereof. For example, embodiments of the present disclosure provide a self-aligned cut metal gate method. Positions of cut metal gate trenches are defined by dielectric fins during fin formation procedures and therefore become insensitive to misalignment and overlay problems introduced by lithography and etching steps in a cut metal gate process. This is particularly useful for small scaled devices. Further, embodiments of the present disclosure can be readily integrated into existing semiconductor manufacturing processes.

In one exemplary aspect, the present disclosure is directed to a method. The method includes providing a structure having a substrate, first and second semiconductor fins extending from the substrate, and a dielectric fin between the first and second semiconductor fins; forming a temporary gate on top and sidewalls of the first and second semiconductor fins and the dielectric fin; forming gate spacers on sidewalls of the temporary gate; removing the temporary gate and a first portion of the dielectric fin between the gate spacers; forming a gate between the gate spacers and on top and sidewalls of the first and second semiconductor fins, wherein the dielectric fin is in physical contact with sidewalls of the gate; removing a second portion of the dielectric fin, thereby exposing the sidewalls of the gate; and performing an etching process to the gate through the exposed sidewalls of the gate, thereby separating the gate into a first gate segment engaging the first semiconductor fin and a second gate segment engaging the second semiconductor fin. In some embodiments, the method further includes forming a dielectric layer on the gate prior to the removing of the second portion of the dielectric fin. In some embodiments, the forming of the dielectric layer includes recessing a top portion of the gate between the gate spacers; depositing the dielectric layer on top of the gate; and performing a chemical mechanical planarization process to recess the dielectric layer and expose a top surface of the dielectric fin. In some embodiments, the dielectric layer and the gate spacers remain after the removing of the second portion of the dielectric fin. In some embodiments, the etching process includes an anisotropic etching process. In some embodiments, the etching process includes an isotropic etching process. In some embodiments, the etching process includes a slanted plasma etching process. In some embodiments, the etching process further includes a dry etching process following the slanted plasma etching process. In some embodiments, the removing of the temporary gate and the first portion of the dielectric fin includes an anisotropic etching process such that other portions of the dielectric fin directly under the gate spacers remain. In some embodiments, the dielectric fin has a smaller width than either of the first and second semiconductor fins. In some embodiments, a topmost portion of the dielectric fin is higher than a topmost portion of the first and second semiconductor fins. In some embodiments, the forming of the dielectric fin includes depositing an isolation structure over the substrate and on sidewalls of the first and second semiconductor fins, resulting in a trench between two portions of the isolation structure that are on two opposing sidewalls of the first and second semiconductor fins; and depositing the dielectric fin in the trench.

In another exemplary aspect, the present disclosure is directed to a method. The method includes providing a structure having a substrate and a dielectric fin projecting upwardly above the substrate; forming first and second spacer layers on the dielectric fin, wherein the first and second spacer layers have two opposing sidewalls; removing a portion of the dielectric fin between the two opposing sidewalls; forming a gate structure between the two opposing sidewalls; depositing a capping layer on the gate structure; removing another portion of the dielectric fin, thereby exposing sidewalls of the gate structure; and performing a lateral etching process on the sidewalls of the gate structure, thereby dividing the gate structure into two parts. In some embodiments, the dielectric fin and the capping layer have different material compositions. In some embodiments, the dielectric fin includes a nitride and the capping layer includes zirconium oxide. In some embodiments, the lateral etching process includes a plasma etching utilizing HBr. In some embodiments, the method further includes filling a dielectric material between the two parts of the gate structure while the capping layer remains above the gate structure.

In yet another exemplary aspect, the present disclosure is directed to a semiconductor structure. The semiconductor structure includes a substrate; a first semiconductor fin and a second semiconductor fin extending from the substrate; an isolation feature on the substrate and on sidewalls of the first and second semiconductor fins; a first high-k metal gate (HK MG) and a second HK MG, wherein the first HK MG is disposed over the first semiconductor fin, and the second HK MG is disposed over the second semiconductor fin; and a dielectric fin disposed between the first and second semiconductor fins, a middle portion of the dielectric fin being in physical contact with both the first HK MG and the second HK MG, a bottom portion of the dielectric fin being embedded in the isolation feature. In some embodiments, the middle portion of the dielectric fin has a different material composition than other portions of the dielectric fin. In some embodiments, the middle portion of the dielectric fin has a larger width than other portions of the dielectric fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a first semiconductor fin and a second semiconductor fin protruding from the substrate and extending lengthwise in a first direction;
an isolation feature disposed on and in physical contact with the substrate and on sidewalls of the first and second semiconductor fins;
a gate structure disposed on the isolation feature; and
a dielectric fin disposed on the isolation feature and sandwiched between the first and second semiconductor fins, the dielectric fin extending lengthwise in the first direction, a middle portion of the dielectric fin separating the gate structure into a first gate structure segment engaging the first semiconductor fin and a second gate structure segment engaging the second semiconductor fin.

2. The semiconductor device of claim 1, wherein a top surface of the dielectric fin and a top surface of the gate structure are level.

3. The semiconductor device of claim 1, wherein a top surface of the dielectric fin is above top surfaces of the first and second semiconductor fins.

4. The semiconductor device of claim 1, wherein the dielectric fin has a first side portion and a second side portion sandwiching the middle portion, and wherein the first and second side portions include a same material composition that is different from the middle portion.

5. The semiconductor device of claim 4, wherein the first and second side portions include aluminum oxide and the middle portion includes silicon nitride.

6. The semiconductor device of claim 1, wherein the middle portion of the dielectric fin has a larger width than other portions of the dielectric fin.

7. The semiconductor device of claim 1, wherein the middle portion of the dielectric fin has a top part above the isolation feature and a bottom part embedded in the isolation feature, and wherein the top part has a larger width than the bottom part.

8. The semiconductor device of claim 1, further comprising:
a gate spacer layer disposed on sidewalls of the gate structure,
wherein the gate spacer layer is in physical contact with the middle portion of the dielectric fin.

9. The semiconductor device of claim 8, wherein the gate spacer layer and the middle portion of the dielectric fin have a same material composition.

10. The semiconductor device of claim 1, wherein the gate structure includes a gate dielectric layer and a gate conductive layer, and wherein the middle portion of the dielectric fin is in physical contact with the gate conductive layer.

11. A semiconductor device, comprising:
a substrate;
a semiconductor fin protruding from the substrate;
a dielectric fin disposed above the substrate and extending parallel to the semiconductor fin, wherein the dielectric fin is spaced apart from the semiconductor fin;
a first gate structure engaging the semiconductor fin, wherein the first gate structure is divided by the dielectric fin into a first gate structure segment and a second gate structure segment; and
a second gate structure engaging the semiconductor fin, wherein the dielectric fin is divided by the second gate structure into a first dielectric fin segment and a second dielectric fin segment.

12. The semiconductor device of claim 11, further comprising:
an isolation feature on the substrate and on sidewalls of the semiconductor fin and the dielectric fin, wherein a bottom portion of the dielectric fin is embedded in the isolation feature.

13. The semiconductor device of claim 11, wherein the first dielectric fin segment includes a different material composition than the second dielectric fin segment.

14. The semiconductor device of claim 11, wherein the first dielectric fin segment has a first portion in physical contact with the first gate structure and a second portion in physical contact with the second gate structure.

15. The semiconductor device of claim 14, wherein the first and second portions of the first dielectric fin segment include different material compositions.

16. The semiconductor device of claim 11, wherein the dielectric fin has a smaller width than the semiconductor fin.

17. A semiconductor device, comprising:
a substrate;
an isolation feature disposed on and in physical contact with the substrate, wherein a top surface of the isolation feature has a trench;
a dielectric fin extending upwardly from the trench; and
a gate structure interfacing a first portion of the dielectric fin, wherein the dielectric fin has a second portion offset from the gate structure, and wherein the first portion has a larger width than the second portion.

18. The semiconductor device of claim 17, wherein a width of the trench is smaller than the first portion of the dielectric fin.

19. The semiconductor device of claim 17, wherein the gate structure includes a gate dielectric layer and a gate conductive layer, and wherein the gate conductive layer interfaces the first portion of the dielectric fin.

20. The semiconductor device of claim 17, wherein a top surface of the gate structure and a top surface of the first portion of the dielectric fin are substantially coplanar.

* * * * *